(12) United States Patent
Min et al.

(10) Patent No.: US 12,170,281 B2
(45) Date of Patent: Dec. 17, 2024

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Sun Ki Min, Seoul (KR); Na Rae Oh, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 17/706,815

(22) Filed: Mar. 29, 2022

(65) Prior Publication Data

US 2023/0070925 A1 Mar. 9, 2023

(30) Foreign Application Priority Data

Sep. 7, 2021 (KR) .................. 10-2021-0118783

(51) Int. Cl.
| | |
|---|---|
| *H01L 27/092* | (2006.01) |
| *H01L 21/02* | (2006.01) |
| *H01L 21/8238* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC ........ *H01L 27/092* (2013.01); *H01L 21/0259* (2013.01); *H01L 21/823807* (2013.01); *H01L 21/823878* (2013.01); *H01L 29/0665* (2013.01); *H01L 29/42392* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| | | |
|---|---|---|
| 10,504,798 B2 | 12/2019 | Xie et al. |
| 10,672,910 B2 | 6/2020 | Zhou et al. |
| 10,916,477 B2 | 2/2021 | Hung et al. |
| 11,011,626 B2 | 5/2021 | Cheng et al. |

(Continued)

FOREIGN PATENT DOCUMENTS

| | | |
|---|---|---|
| DE | 102020109494 B3 | 7/2021 |
| KR | 1020160038673 A | 4/2016 |

OTHER PUBLICATIONS

Communication dated Jan. 23, 2023 issued by the European Patent Office in counterpart European Patent Application No. 22190028.5.

(Continued)

*Primary Examiner* — Anthony Ho
(74) *Attorney, Agent, or Firm* — Sughrue Mion, PLLC

(57) ABSTRACT

A semiconductor device includes: a first active pattern extended in a first direction on a substrate; a second active pattern extended in the first direction and spaced apart from the first active pattern in a second direction on the substrate; a field insulating layer between the first active pattern and the second active pattern on the substrate; a first gate electrode on the first active pattern; a second gate electrode on the second active pattern; and a gate isolation structure separating the first gate electrode and the second gate electrode from each other on the field insulating layer, wherein a width of the gate isolation structure in the second direction varies in a downward direction from the upper isolation pattern.

20 Claims, 50 Drawing Sheets

(56) References Cited

U.S. PATENT DOCUMENTS

| | | |
|---|---|---|
| 2019/0378903 A1 | 12/2019 | Jeon et al. |
| 2020/0066900 A1 | 2/2020 | Yang et al. |
| 2020/0091145 A1 | 3/2020 | Guha et al. |
| 2021/0098466 A1 | 4/2021 | Liaw |
| 2021/0125875 A1 | 4/2021 | Tsai et al. |
| 2021/0126109 A1 | 4/2021 | Lin et al. |
| 2021/0272957 A1 | 9/2021 | Lee et al. |

OTHER PUBLICATIONS

EP Communication issued May 30, 2023 from the European Patent Office in EP Application No. 22190028.5.
EP Communication issued May 17, 2023 from the European Patent Office in EP Application No. 22190028.5.

SEMICONDUCTOR DEVICE AND METHOD OF FABRICATING THE SAME

CROSS-REFERENCE TO RELATED APPLICATION

This application claims priority from Korean Patent Application No. 10-2021-0118783 filed on Sep. 7, 2021 in the Korean Intellectual Property Office, the disclosure of which is incorporated herein in its entirety by reference.

BACKGROUND

1. Field

The present disclosure relates to a semiconductor device and a method of manufacturing the same.

2. Description of Related Art

As one of the scaling techniques for increasing a density of a semiconductor device, a multi-gate transistor for forming a multi-channel active pattern (or silicon body) of a fin or nanowire shape on a substrate and forming a gate on a surface of the multi-channel active pattern has been suggested.

Since this multi-gate transistor uses a three-dimensional channel, it is easy to scale the multi-gate transistor. Also, even though a gate length of the multi-gate transistor is not increased, a current control capability may be improved. In addition, a short channel effect (SCE) in which a potential of a channel region is affected by a drain voltage may be suppressed effectively.

SUMMARY

An object of the present disclosure is to provide a semiconductor device that may improve performance and reliability.

Another object of the present disclosure is to provide a method of manufacturing a semiconductor device, which may improve performance and reliability.

The objects of the present disclosure are not limited to those mentioned above and additional objects of the present disclosure, which are not mentioned herein, will be clearly understood by those skilled in the art from the following description of the present disclosure.

According to an aspect of the present disclosure, there is provided a semiconductor device including: a first active pattern extended in a first direction on a substrate; a second active pattern extended in the first direction and spaced apart from the first active pattern in a second direction on the substrate; a field insulating layer between the first active pattern and the second active pattern on the substrate; a first gate electrode on the first active pattern; a second gate electrode on the second active pattern; and a gate isolation structure separating the first gate electrode and the second gate electrode from each other on the field insulating layer, wherein the gate isolation structure includes a lower isolation pattern which is in contact with the field insulating layer, and an upper isolation pattern on the lower isolation pattern, the lower isolation pattern includes a first portion, and a second portion disposed below the first portion, in the first portion of the lower isolation pattern, a width of the lower isolation pattern in the second direction increases in a downward direction from the upper isolation pattern, and in the second portion of the lower isolation pattern, a width of the lower isolation pattern in the second direction decreases in the downward direction from the upper isolation pattern.

According to another aspect of the present disclosure, there is provided a semiconductor device including: a first active pattern and a second active pattern, which are in a first region of a substrate and spaced apart from each other in a first direction by a first interval; a third active pattern and a fourth active pattern, which are in a second region of the substrate and spaced apart from each other in a second direction by a second interval different from the first interval; a first field insulating layer between the first active pattern and the second active pattern on the substrate; a second field insulating layer between the third active pattern and the fourth active pattern on the substrate; a first gate electrode on the first active pattern; a second gate electrode on the second active pattern; a third gate electrode on the third active pattern; a fourth gate electrode on the fourth active pattern; a first gate isolation structure separating the first gate electrode and the second gate electrode from each other on the first field insulating layer; and a second gate isolation structure separating the third gate electrode and the fourth gate electrode on the second field insulating layer, wherein the first gate isolation structure includes a lower isolation pattern, which is in contact with the first field insulating layer, and an upper isolation pattern on the lower isolation pattern, and the second gate isolation structure is formed of a single structure extended from above an upper surface of the third gate electrode to below an upper surface of the second field insulating layer.

According to still another aspect of the present disclosure, there is provided a semiconductor device including: a first active pattern, which comprises a first lower pattern extended in a first direction and a plurality of first sheet patterns spaced apart from the first lower pattern, on a substrate; a second active pattern, which comprises a second lower pattern extended in the first direction and a plurality of second sheet patterns spaced apart from the second lower pattern, on the substrate, the second lower pattern being spaced apart from the first lower pattern in a second direction different from the first direction; a field insulating layer between the first lower pattern and the second lower pattern on the substrate; a first gate electrode on the first active pattern; a second gate electrode on the second active pattern; and a gate isolation structure separating the first gate electrode and the second gate electrode from each other on the field insulating layer, wherein the gate isolation structure comprises a lower isolation pattern that is in contact with the field insulating layer, and an upper isolation pattern on the lower isolation pattern, the lower isolation pattern comprises a material different from that of the upper isolation pattern, wherein the lower isolation pattern comprises a first portion above a level of an upper surface of the field insulating layer, in the first portion of the lower isolation pattern, a width of the lower isolation pattern in the second direction increases in a downward direction from the upper isolation pattern, the upper isolation pattern includes a first portion protruded above a level of an upper surface of the first gate electrode and a level of an upper surface of the second gate electrode, and in the first portion of the upper isolation pattern, a width of the upper isolation pattern in the second direction increases in an upward direction from the lower isolation pattern.

According to an aspect of the present disclosure, there is provided a method of manufacturing a semiconductor device including: forming a field insulating layer on a substrate between a first pre-active pattern and a second pre-active pattern, which are spaced apart from each other in a first direction, a portion of the first pre-active pattern and a portion of the second pre-active pattern being protruded above a level of an upper surface of the field insulating layer, forming a semiconductor liner along a profile of the portion of the first pre-active pattern, a profile of the portion of the second pre-active pattern and a profile of the upper surface of the field insulating layer, forming a mask pattern having an overhang structure on the semiconductor liner, removing the semiconductor liner on the upper surface of the field insulating layer using the mask pattern to form a lower isolation space between the first pre-active pattern and the second pre-active pattern, forming a lower isolation pattern filling the lower isolation space after removing the mask pattern, and forming a mold gate electrode, which crosses the first pre-active pattern and the second pre-active pattern, on the lower isolation pattern.

BRIEF DESCRIPTION OF DRAWINGS

The above and other aspects and features of the present disclosure will become more apparent by describing exemplary embodiments thereof in detail with reference to the attached drawings, in which.

DETAILED DESCRIPTION

All of the embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

As shown, a semiconductor device according to embodiments of the present disclosure includes, but is not limited to, a fin-type transistor (FinFET) including a channel region of a fin-type pattern shape, and a transistor including a nanowire or a nanosheet. In addition, the technical spirits of the present disclosure may be applied to two-dimensional (2D) material based transistors (FETs) and a heterogeneous or hybrid structure thereof.

In addition, the semiconductor device according to embodiments may include a tunneling transistor (tunneling FET) or a three-dimensional (3D) transistor. The semiconductor device according to embodiments may include a bipolar junction transistor, a lateral double diffusion transistor (LDMOS), and the like.

Figure 1:
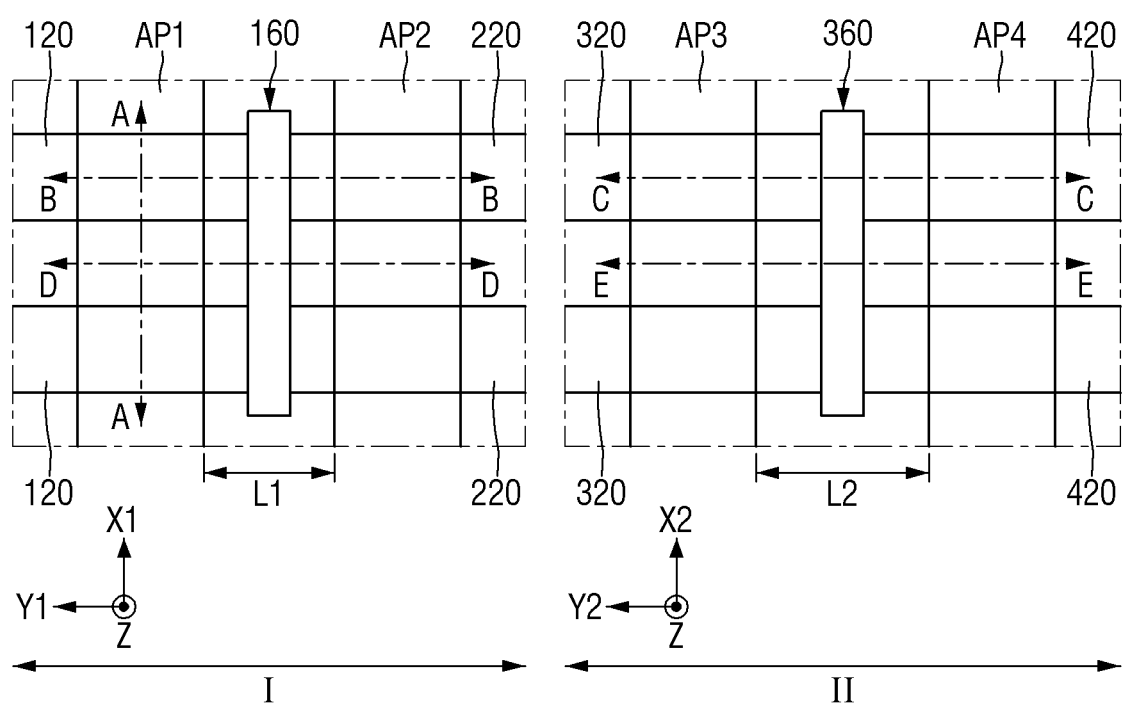
FIG. 1 is a layout view illustrating a semiconductor device according to embodiments.
Figure 2A:
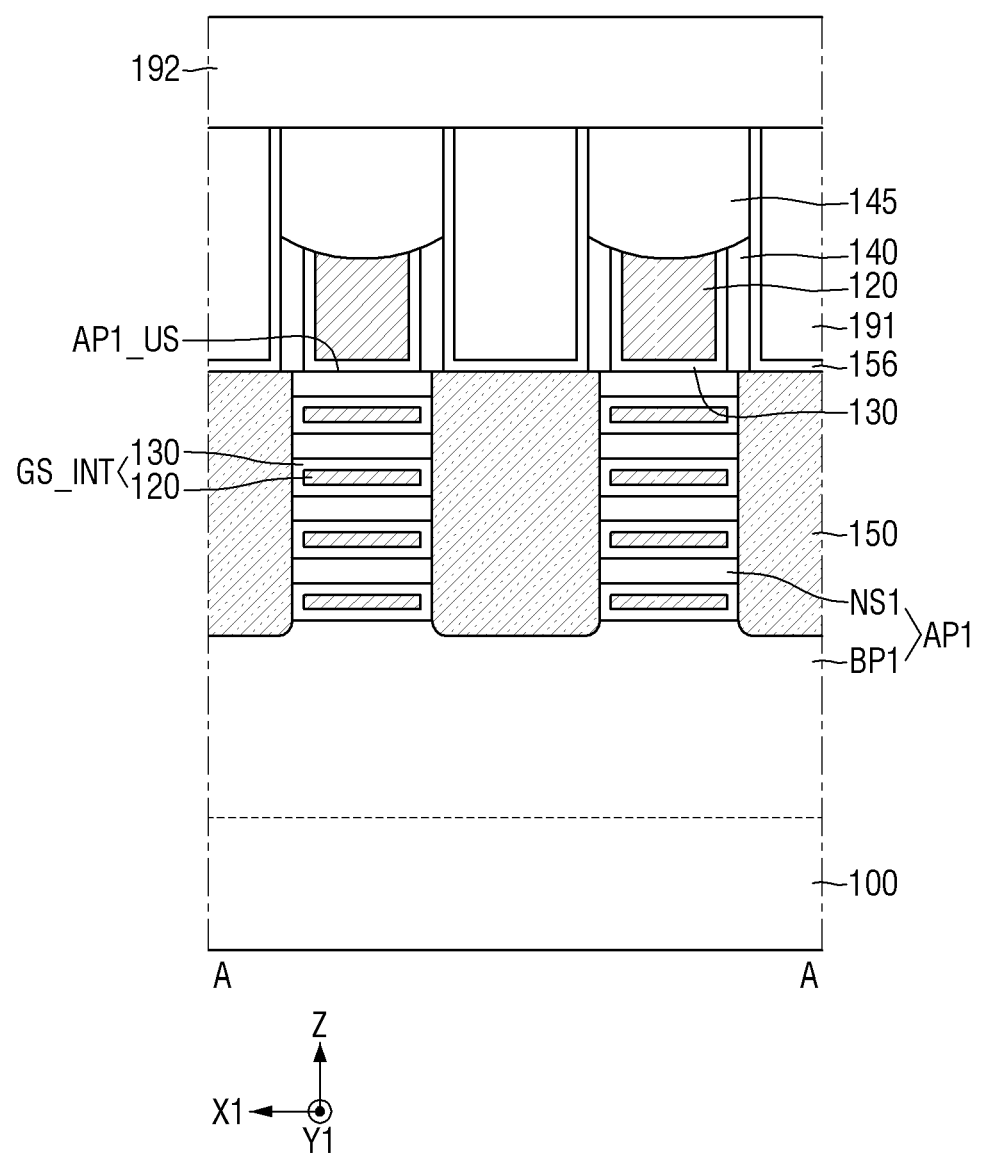
FIGS. 2A and 2B are cross-sectional views taken along line A-A of FIG. 1.
Figure 2B:
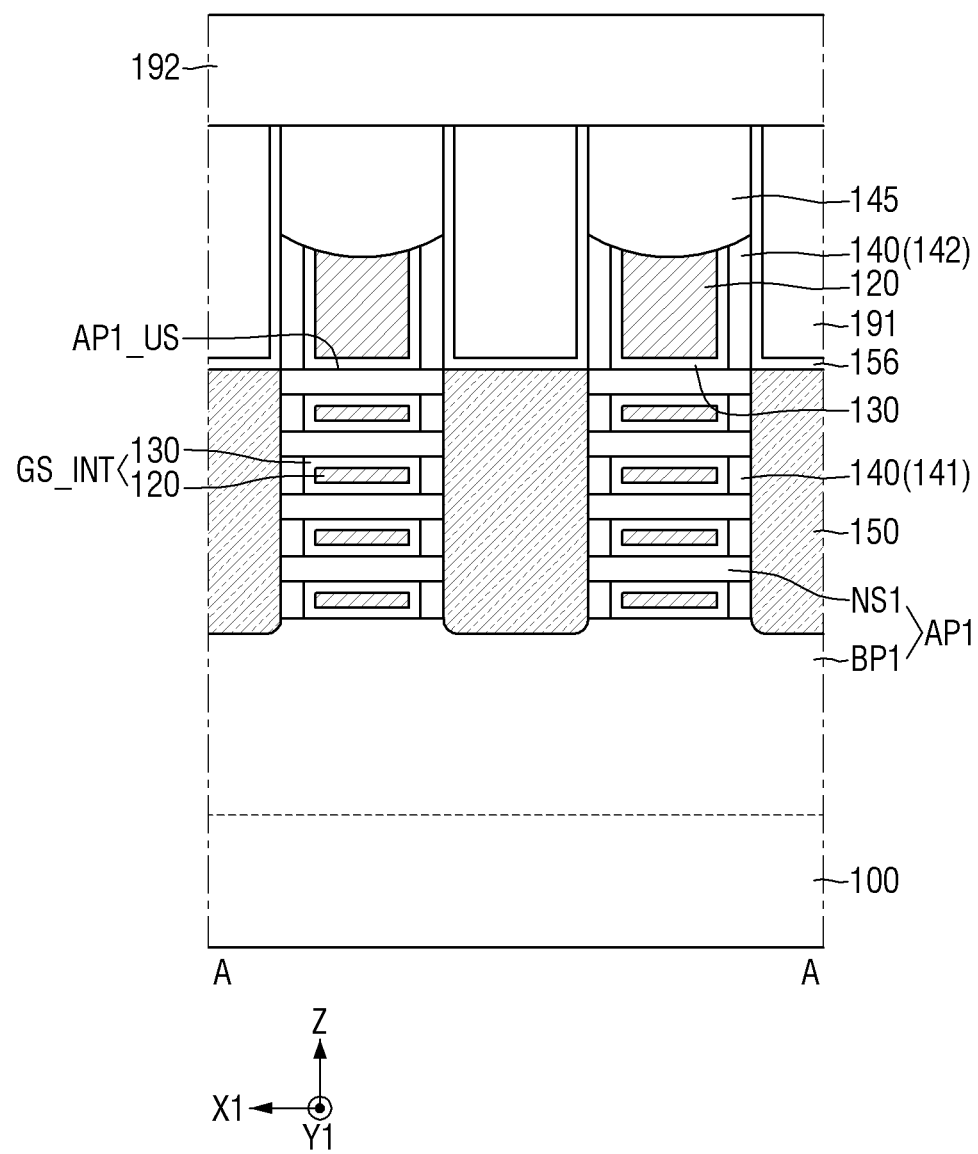
Figure 6:
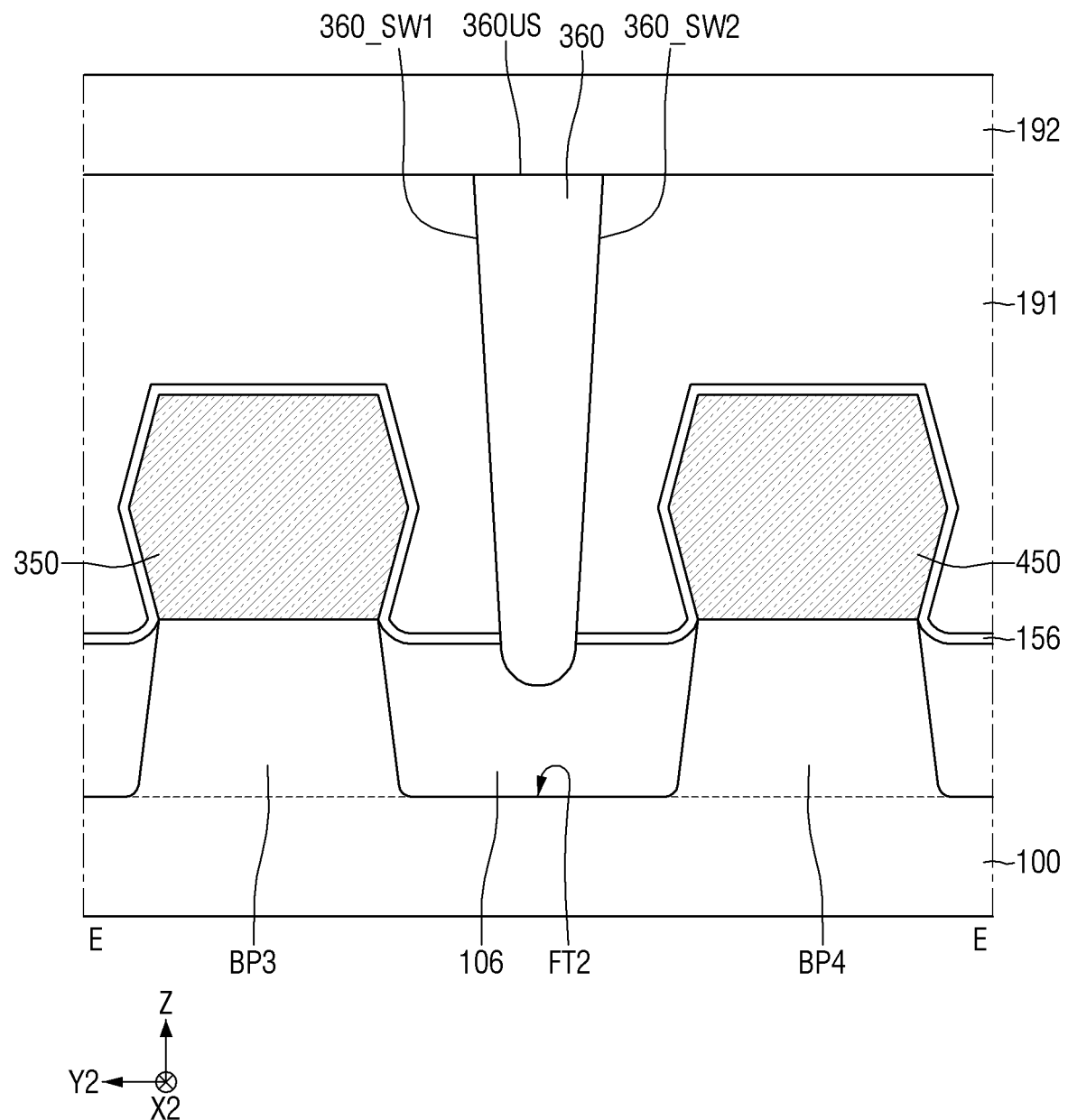
Figure 7:
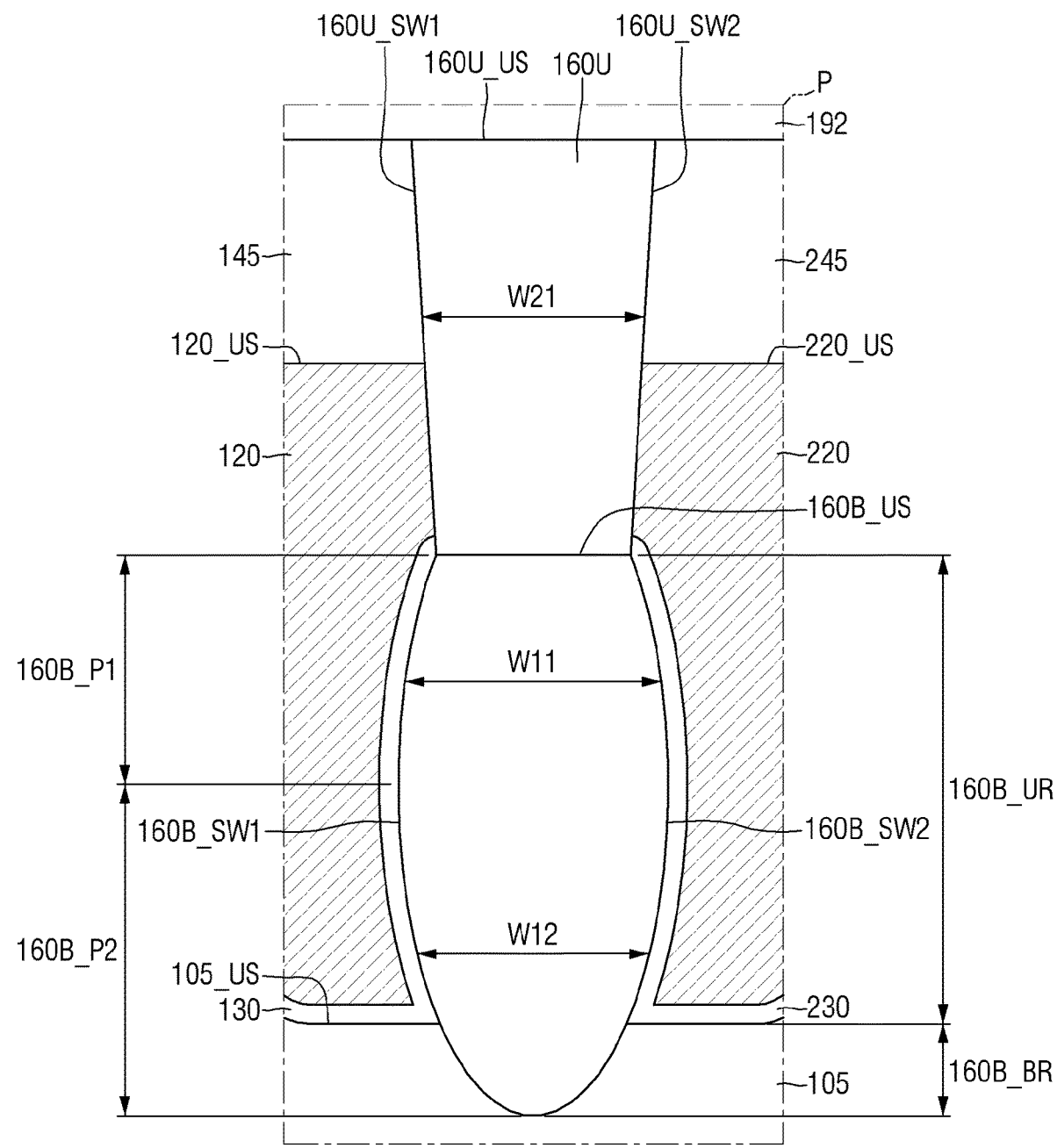
FIG. 7 is an enlarged view illustrating a portion P of FIG. 3.

FIG. 1 is a layout view illustrating a semiconductor device according to embodiments. FIGS. 2A and 2B are cross-sectional views taken along line A-A of FIG. 1. FIGS. 3 to 6 are cross-sectional views taken along line B-B, C-C, D-D and E-E of FIG. 1. FIG. 7 is an enlarged view illustrating a portion P of FIG. 3.

Referring to FIGS. 1 to 7, the semiconductor device according to embodiments may include a first active pattern AP1, a second active pattern AP2, a third active pattern AP3, a fourth active pattern AP4, a first gate electrode 120, a second gate electrode 220, a third gate electrode 320, a fourth gate electrode 420, a first gate isolation structure 160, and a second gate isolation structure 360.

The substrate 100 may include a first region I and a second region II. According to an embodiment, the first region I and the second region II may be regions adjacent to each other. According to an embodiment, one of the third active pattern AP3 and the fourth active pattern AP4 of the second region II may be the first active pattern AP1 of the first region I when the two adjacent regions I and II are divided differently. According to an embodiment, the first region I and the second region II may be regions spaced apart from each other with another region or structure interposed therebetween.

Each of the first region I and the second region II may be one of a logic region, an SRAM region and an I/O region. According to an embodiment, the first region I and the second region II may be the same region. According to an embodiment, the first region I and the second region II may be regions different from each other.

The first active pattern AP1 and the second active pattern AP2 may be disposed in the first region I of the substrate 100. The third active pattern AP3 and the fourth active pattern AP4 may be disposed in the second region II of the substrate 100.

Each of the first active pattern AP1 and the second active pattern AP2 may be extended long in a first direction X1. The first active pattern AP1 and the second active pattern AP2 may be adjacent to each other in a second direction Y1. The first active pattern AP1 and the second active pattern AP2 may be spaced apart from each other in the second direction Y1 with another active pattern interposed therebetween. In the present embodiment, the first active pattern AP1 and the second active pattern AP2 are adjacent to each other in the second direction Y1 with the first gate isolation structure 160 disposed therebetween. Here, the first direction X1 is a direction crossing the second direction Y1.

According to an embodiment, the first active pattern AP1 may be a region in which a p-type metal-oxide semiconductor or a p-type field-effect transistor (PMOS) is formed, and the second active pattern AP2 may be a region in which an n-type metal-oxide semiconductor or an n-type field-effect transistor (NMOS) is formed. In another example, a PMOS or an NMOS may be formed in each of the first active pattern AP1 and the second active pattern AP2.

The third active pattern AP3 and the fourth active pattern AP4 may be extended long in a third direction X2. The third active pattern AP3 and the fourth active pattern AP4 may be adjacent to each other in a fourth direction Y2. The third active pattern AP3 and the fourth active pattern AP4 may be spaced apart from each other in the fourth direction Y2 with another active pattern interposed therebetween. In the present embodiment, the third active pattern AP3 and the fourth active pattern AP4 are adjacent to each other in the second direction Y1 with the second gate isolation structure 360 disposed therebetween. Here, the third direction X2 is a direction crossing the fourth direction Y2.

According to an embodiment, the third active pattern AP3 may be a region in which a PMOS is formed, and the fourth active pattern AP4 may be a region in which an NMOS is formed. In another example, a PMOS or an NMOS may be formed in each of the third active pattern AP3 and the fourth active pattern AP4.

The first active pattern AP1 may include a first lower pattern BP1 and a plurality of first sheet patterns NS1. The second active pattern AP2 may include a second lower pattern BP2 and a plurality of second sheet patterns NS2. The third active pattern AP3 may include a third lower pattern BP3 and a plurality of third sheet patterns NS3. The fourth active pattern AP4 may include a fourth lower pattern BP4 and a plurality of fourth sheet patterns NS4. In the semiconductor device according to embodiments, the first to fourth active patterns AP1, AP2, AP3 and AP4 may be active patterns, each of which includes a nanosheet or a nanowire.

The first lower pattern BP1, the second lower pattern BP2, the third lower pattern BP3 and the fourth lower pattern BP4 may be protruded from the substrate 100, respectively. The first and second lower patterns BP1 and BP2 may be extended long in the first direction X1, respectively. The third lower pattern BP3 and the fourth lower pattern BP4 may be extended long in the third direction X2, respectively. Each of the first to fourth lower patterns BP1, BP2, BP3 and BP4 may have a fin-type pattern shape.

The first lower pattern BP1 may be spaced apart from the second lower pattern BP2 in the second direction Y1. The first lower pattern BP1 and the second lower pattern BP2 may be separated from each other by a first fin trench FT1 extended in the first direction X1. The third lower pattern BP3 may be spaced apart from the fourth lower pattern BP4 in the fourth direction Y2. The third lower pattern BP3 and the fourth lower pattern BP4 may be separated from each other by a second fin trench FT2 extended in the third direction X2.

The plurality of first sheet patterns NS1 may be disposed on the first lower pattern BP1. The plurality of first sheet patterns NS1 may be spaced apart from the first lower pattern BP1 in a fifth direction Z. The plurality of second sheet patterns NS2 may be disposed on the second lower pattern BP2. The plurality of second sheet patterns NS2 may be spaced apart from the second lower pattern BP2 in the fifth direction Z. The plurality of third sheet patterns NS3 may be disposed on the third lower pattern BP3. The plurality of third sheet patterns NS1 may be spaced apart from the third lower pattern BP3 in the fifth direction Z. The plurality of fourth sheet patterns NS4 may be disposed on the fourth lower pattern BP4. The plurality of fourth sheet patterns NS4 may be spaced apart from the fourth lower pattern BP4 in the fifth direction Z.

The first sheet patterns NS1 may be sequentially disposed and spaced apart from each other in the fifth direction Z. The second sheet patterns NS2 may be sequentially disposed and spaced apart from each other in the fifth direction Z. The third sheet patterns NS3 may be sequentially disposed and spaced apart from each other in the fifth direction Z. The fourth sheet patterns NS4 may be sequentially disposed and spaced apart from each other in the fifth direction Z. In this case, the fifth direction Z may be a direction orthogonal to the first direction X1 and the second direction Y1. The fifth direction Z may be a direction orthogonal to the third direction X2 and the fourth direction Y2. Here, the fifth direction Z may be a thickness direction of the substrate 100.

The number of each of the first sheet patterns NS1, the second sheet patterns NS2, the third sheet patterns NS3 and the fourth sheet patterns NS4 is four, but is not limited thereto.

An upper surface AP1_US of the first active pattern AP1 may be an upper surface of the uppermost sheet pattern among the first sheet patterns NS1. An upper surface AP2_US of the second active pattern AP2 may be an upper surface of the uppermost sheet pattern among the second sheet patterns NS2. An upper surface AP3_US of the third active pattern may be an upper surface of the uppermost sheet pattern among the third sheet patterns NS3. An upper surface AP4_US of the fourth active pattern may be an upper surface of the uppermost sheet pattern among the fourth sheet patterns NS4.

Each of the first to fourth lower patterns BP1, BP2, BP3 and BP4 may be formed by etching a portion of the substrate 100, and may include an epitaxial layer grown from the substrate 100. Each of the first to fourth lower patterns BP1, BP2, BP3 and BP4 may include silicon or germanium, which is an elemental semiconductor material. Each of the first to fourth lower patterns BP1, BP2, BP3 and BP4 may include a compound semiconductor, and may include, for example, a group IV-IV compound semiconductor or a group III-V compound semiconductor.

The group IV-IV compound semiconductor may be a binary compound or ternary compound, which includes at least two of carbon (C), silicon (Si), germanium (Ge) or tin (Sn), or a compound including at least two of carbon (C), silicon (Si), germanium (Ge) or tin (Sn), which are doped with a group IV element.

The group III-V compound semiconductor may be, for example, one of a binary compound, a ternary compound and a quaternary compound, which is formed by combination of at least one of aluminum (Al), gallium (Ga) and indium (In), which is a group III element, and one of phosphorus (P), arsenic (As) and antimony (Sb), which are group V elements.

Each of the first to fourth sheet patterns NS1, NS2, NS3 and NS4 may include one of silicon and germanium, which is an elemental semiconductor material, a group IV-IV compound semiconductor or a group III-V compound semiconductor. A width of the first sheet pattern NS1 in the second direction Y1 may increase or decrease in proportion to a width of the first lower pattern BP1 in the second direction Y1. The description of the first sheet pattern NS1 may be equally applied to the second to fourth sheet patterns NS2, NS3 and NS4.

According to an embodiment, the first active pattern AP1 and the second active pattern AP2 may be spaced apart from each other in the second direction Y1 by a first interval L1. The third active pattern AP3 and the fourth active pattern AP4 may be spaced apart from each other in the fourth direction Y2 by a second interval L2. In the semiconductor device according to embodiments, the first interval L1 is different from the second interval L2. According to an embodiment, the second interval L2 is greater than the first interval L1. The first interval L1 may be a distance in which the first active pattern AP1 and the second active pattern AP2 are spaced apart from each other based on an upper surface BP1_US of the first lower pattern BP1 and an upper surface BP2_US of the second lower pattern BP2. The second interval L2 may be a distance in which the third active pattern AP3 and the fourth active pattern AP4 are spaced apart from each other based on an upper surface BP3_US of the third lower pattern BP3 and an upper surface BP4_US of the fourth lower pattern BP4.

A first field insulating layer 105 may be formed on the substrate 100. The first field insulating layer 105 may fill at least a portion of the first fin trench FT1.

The first field insulating layer 105 may be disposed on the substrate 100 between the first active pattern AP1 and the second active pattern AP2. An additional active pattern used as a channel region of a transistor may not be interposed between the first active pattern AP1 and the second active pattern AP2. The first field insulating layer 105 may be disposed between the first lower pattern BP1 and the second lower pattern BP2. The first field insulating layer 105 may be in contact with the first lower pattern BP1 and the second lower pattern BP2.

Figure 3:
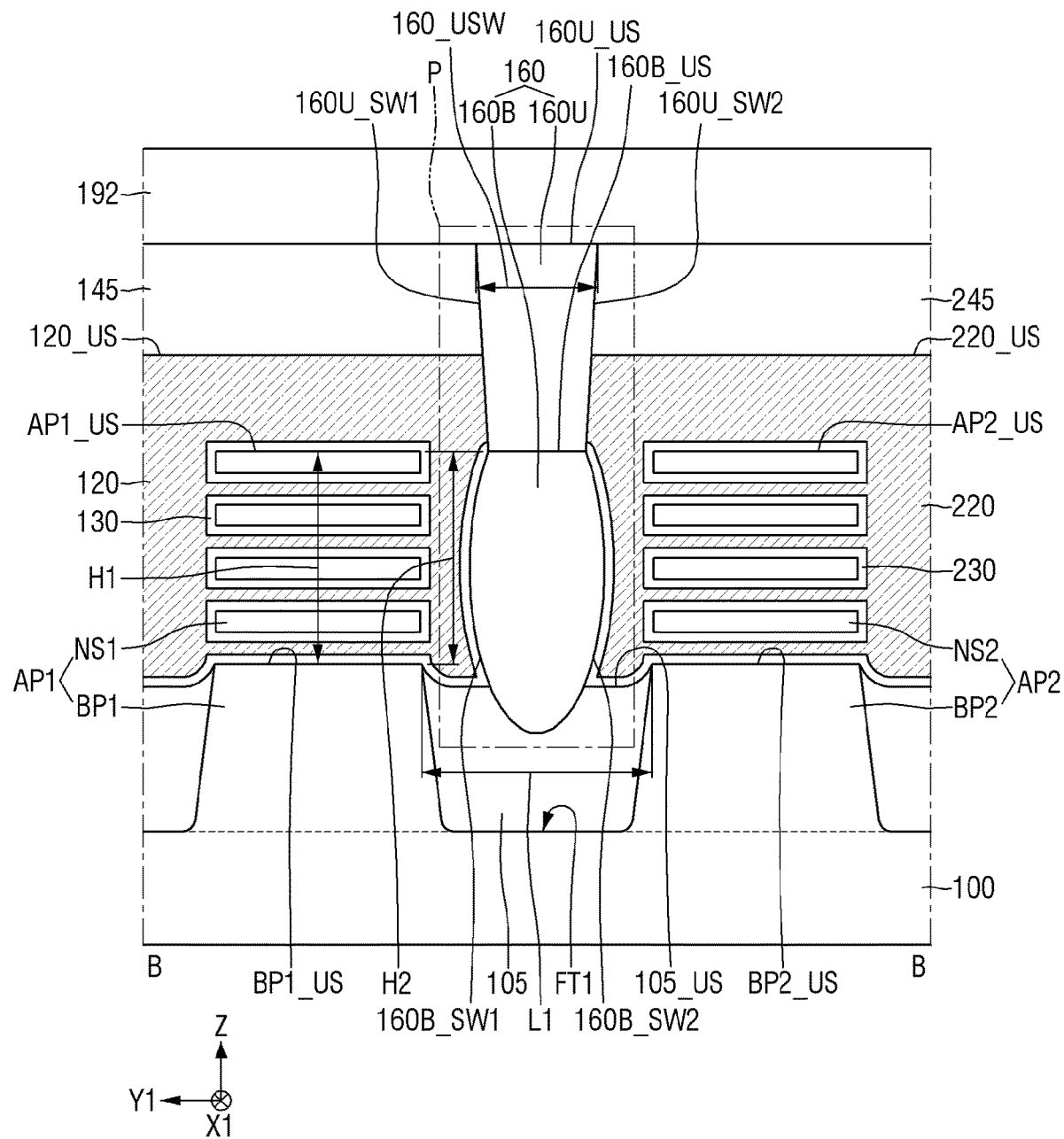
FIGS. 3 to 6 are cross-sectional views taken along line B-B, C-C, D-D and E-E of FIG. 1.
Figure 5:
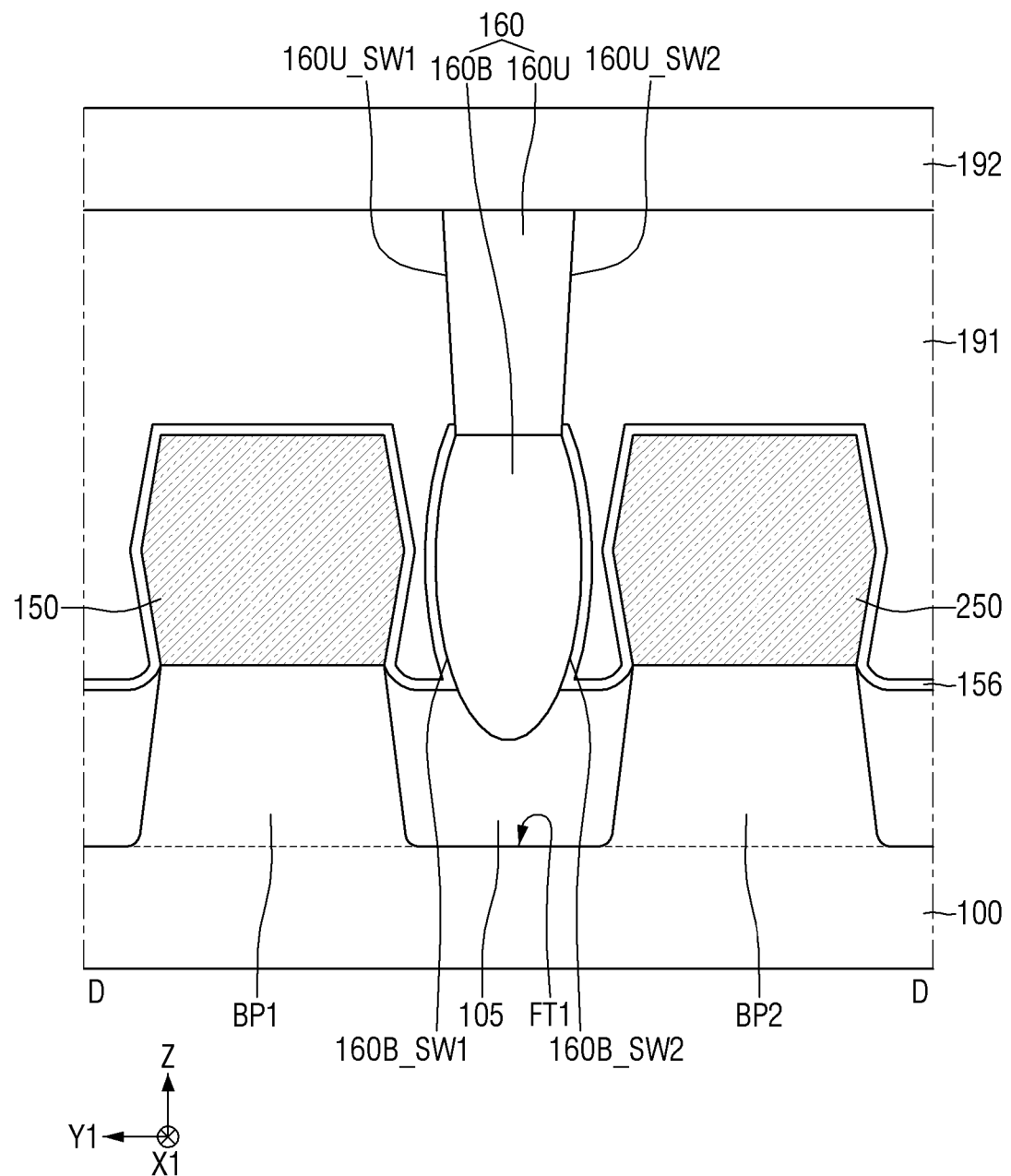

According to an embodiment, the first field insulating layer 105 may be disposed on an entire sidewall of the first lower pattern BP1 and an entire sidewall of the second lower pattern BP2, which define the first fin trench FT1, as shown in FIGS. 3 and 5. However, according to an embodiment, the first field insulating layer 105 may be disposed on a portion of the sidewall of the first lower pattern BP1 and/or a portion of the sidewall of the second lower pattern BP2, which define the first fin trench FT1. According to an embodiment, a portion of the first lower pattern BP1 and/or a portion of the second lower pattern BP2 may be protruded further in the fifth direction Z than an upper surface 105_US of the first field insulating layer 105. The first field insulating layer 105 is not disposed on the upper surface BP1_US of the first lower pattern BP1 and the upper surface BP2_US of the second lower pattern BP2. Each of the first sheet patterns NS1 and each of the second sheet patterns NS2 are disposed to be higher than the upper surface 105_US of the first field insulating layer 105.

A second field insulating layer 106 may be formed on the substrate 100. The second field insulating layer 106 may fill at least a portion of the second fin trench FT2. The second field insulating layer 106 may be disposed on the substrate 100 between the third active pattern AP3 and the fourth active pattern AP4. Each of the third sheet patterns NS3 and each of the fourth sheet patterns NS4 are disposed to be higher than an upper surface 106_US of the second field insulating layer. The description of the second field insulating layer 106 may be substantially the same as that of the first field insulating layer 105.

The first field insulating layer 105 and the second field insulating layer 106 may include, for example, an oxide layer, a nitride layer, an oxynitride layer or their combination layer. Each of the first field insulating layer 105 and the second field insulating layer 106 is shown as a single layer, but is not limited thereto. Unlike the shown example, each of the first field insulating layer 105 and the second field insulating layer 106 may include a field liner extended along a sidewall and a bottom surface of each of the fin trenches FT1 and FT2, and a field filling layer on the field liner.

The first to fourth gate electrodes 120, 220, 320 and 420 may be disposed on the substrate 100, respectively. The first gate electrode 120 and the second gate electrode 220 may be disposed in the first region I of the substrate 100. The third gate electrode 320 and the fourth gate electrode 420 may be disposed in the second region II of the substrate 100.

The first gate electrode 120 may be disposed on the first active pattern AP1. The first gate electrode 120 may extend in the second direction Y1 to cross the first active pattern AP1. The first gate electrode 120 may cross the first lower pattern BP1. The first gate electrode 120 may surround each first sheet pattern NS1.

The second gate electrode 220 may be disposed on the second active pattern AP2. The second gate electrode 220 may extend in the second direction Y1 to cross the second active pattern AP2. The second gate electrode 220 may cross the second lower pattern BP2. The second gate electrode 220 may surround each second sheet pattern NS2. The second gate electrode 220 may be spaced apart from the first gate electrode 120 in the second direction Y1. The second gate electrode 220 may be separated from the first gate electrode 120.

The third gate electrode 320 may be disposed on the third active pattern AP3. The third gate electrode 320 may extend in the fourth direction Y2 to cross the third active pattern AP3. The third gate electrode 320 may cross the third lower pattern BP3. The third gate electrode 320 may surround each third sheet pattern NS3.

The fourth gate electrode 420 may be disposed on the fourth active pattern AP4. The fourth gate electrode 420 may extend in the fourth direction Y2 to cross the fourth active pattern AP4. The fourth gate electrode 420 may cross the fourth lower pattern BP4. The fourth gate electrode 420 may surround each fourth sheet pattern NS4. The fourth gate electrode 420 may be spaced apart from the third gate electrode 320 in the fourth direction Y2. The fourth gate electrode 420 may be separated from the third gate electrode 320.

Each of the first to fourth gate electrodes 120, 220, 320 and 420 may include at least one of a metal, a metal alloy, a conductive metal nitride, a metal silicide, a doped semiconductor material, a conductive metal oxide and a conductive metal oxynitride. Each of the first to fourth gate electrodes 120, 220, 320 and 420 may be, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or their combination, but is not limited thereto. The conductive metal oxide and the conductive metal oxynitride may include, but are not limited to, oxidized forms of the aforementioned materials.

The first gate electrode 120 may be disposed on both sides of a first source/drain pattern 150 that will be described later. For example, the first gate electrode 120 disposed on both sides of the first source/drain pattern 150 may be a normal gate electrode used as a gate of a transistor. In another example, the first gate electrode 120 disposed on one side of the first source/drain pattern 150 may be a gate of a transistor, but the first gate electrode 120 disposed on the other side of the first source/drain pattern 150 may be a dummy gate electrode. The above description of the first gate electrode 120 may also correspond to the second to fourth gate electrodes 220, 320 and 420.

A first gate insulating layer 130 may extend along the upper surface 105_US of the first field insulating layer 105 and the upper surface BP1_US of the first lower pattern BP1, as shown in FIG. 3. The first gate insulating layer 130 may surround each first sheet pattern NS1. The first gate insulating layer 130 may be disposed along the circumference of each of the first sheet pattern NS1.

A second gate insulating layer 230 may extend along the upper surface 105_US of the first field insulating layer 105 and the upper surface BP2_US of the second lower pattern BP2, as shown in FIG. 3. The second gate insulating layer 230 may surround each second sheet pattern NS2. The second gate insulating layer 230 may be disposed along the circumference of each of the second sheet pattern NS2.

Figure 4:
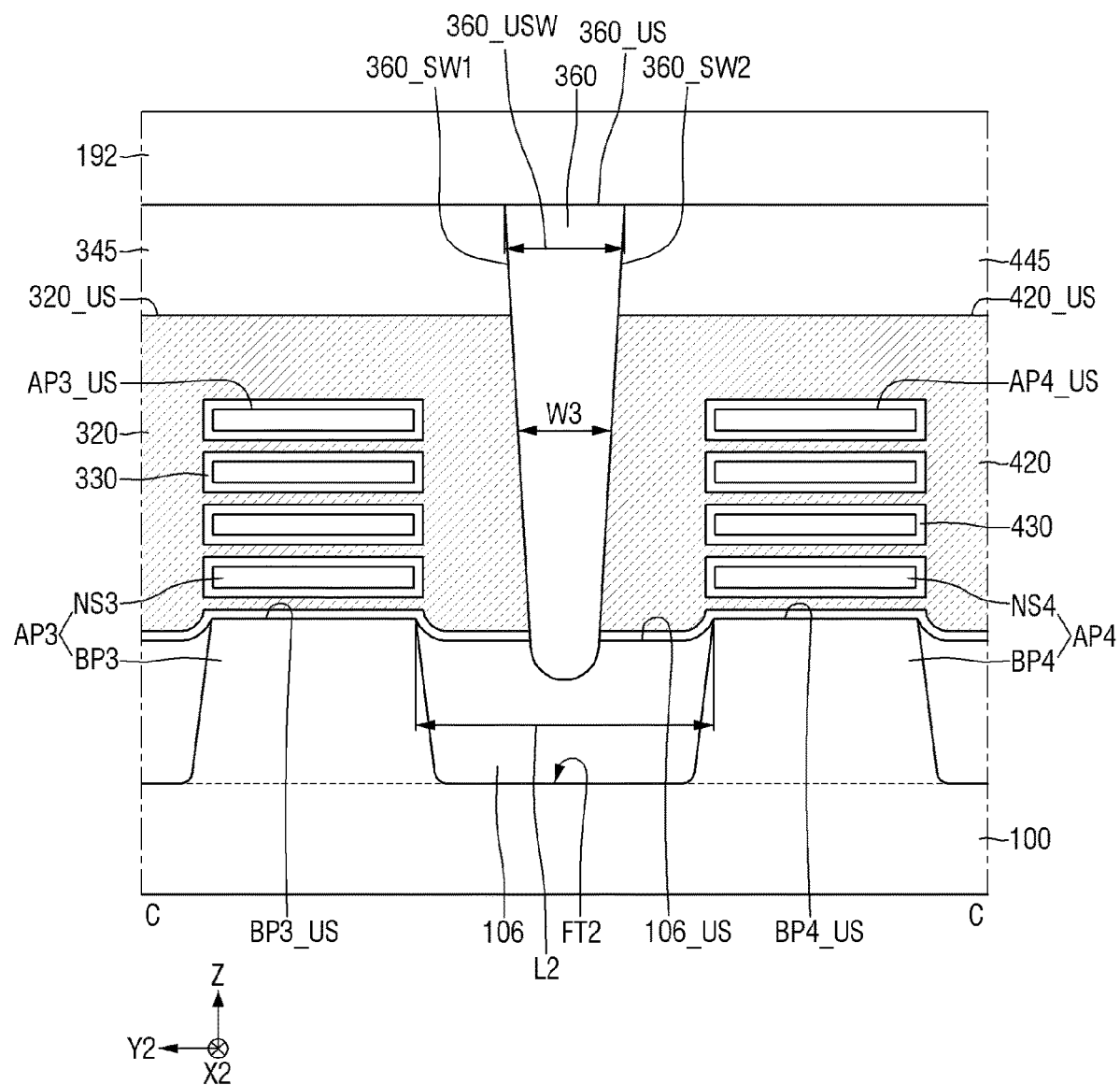

A third gate insulating layer 330 may extend along the upper surface 106_US of the second field insulating layer 106 and the upper surface BP3_US of the third lower pattern BP3, as shown in FIG. 4. The third gate insulating layer 330 may surround each third sheet pattern NS3. The third gate insulating layer 330 may be disposed along the circumference of each of the third sheet pattern NS3.

A fourth gate insulating layer 430 may extend along the upper surface 106_US of the second field insulating layer 106 and the upper surface BP4_US of the fourth lower pattern BP4, as shown in FIG. 4. The fourth gate insulating layer 430 may surround each fourth sheet pattern NS4. The fourth gate insulating layer 430 may be disposed along the circumference of each of the fourth sheet pattern NS4.

The first to fourth gate electrodes 120, 220, 320 and 420 may be disposed on the first to fourth gate insulating layers 130, 230, 330 and 430. The first to fourth gate insulating layers 130, 230, 330 and 430 may be disposed between the first to fourth gate electrodes 120, 220, 320 and 420 and the first to fourth active patterns AP1, AP2, AP3 and AP4.

Each of the first to fourth gate insulating layers 130, 230, 330 and 430 may include silicon oxide, silicon oxynitride, silicon nitride, or a high dielectric constant material having a dielectric constant greater than that of silicon oxide. The high dielectric constant material may include one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although each of the first to fourth gate insulating layers 130, 230, 330 and 430 is shown as a single layer, it is only an example for convenience of description and is not limited thereto. Each of the first to fourth gate insulating layers 130, 230, 330 and 430 may include a plurality of layers. For example, the first gate insulating layer 130 may include an interfacial layer and a high dielectric constant insulating layer disposed between the first sheet pattern NS1 and the first gate electrode 120.

The semiconductor device according to embodiments may include a negative capacitance (NC) FET based on a negative capacitor. According to an embodiment, each of the first to fourth gate insulating layers 130, 230, 330 and 430 may include a ferroelectric material layer having ferroelectric characteristics, and a paraelectric material layer having paraelectric characteristics.

The ferroelectric material layer may have a negative capacitance, and the paraelectric material layer may have a positive capacitance. For example, when two or more capacitors are connected in series, and the capacitance of each capacitor has a positive value, the total capacitance is more reduced than the capacitance of each individual capacitor. On the other hand, when at least one of capacitances of two or more capacitors connected in series has a negative value, the total capacitance may have a positive value and may be greater than an absolute value of each individual capacitance.

When a ferroelectric material layer having a negative capacitance and a paraelectric material layer having a positive capacitance are connected in series, the total capacitance value of the ferroelectric material layer and the paraelectric material layer connected in series may increase. Based on the total capacitance value that increases, a transistor having a ferroelectric material layer may have a subthreshold swing (SS) less than 60 mV/decade at a room temperature.

The ferroelectric material layer may have ferroelectric characteristics. The ferroelectric material layer may include at least one of, for example, hafnium oxide, hafnium zirconium oxide, barium strontium titanium oxide, barium titanium oxide, and lead zirconium titanium oxide. In this case, for example, hafnium zirconium oxide may be a material doped with zirconium (Zr) in hafnium oxide. For another example, hafnium zirconium oxide may be a compound of hafnium (Hf) and zirconium (Zr) and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of the dopant included in the ferroelectric material layer may vary depending on the ferroelectric material of the ferroelectric material layer.

When the ferroelectric material layer includes hafnium oxide, the dopant included in the ferroelectric material layer may include at least one of gadolinium (Gd), silicon (Si), zirconium (Zr), aluminum (Al), and yttrium (Y).

When the dopant is aluminum (Al), the ferroelectric material layer may include aluminum of 3 at % to 8 at % (atomic %). In this case, a ratio of the dopant may be a ratio of aluminum to a sum of hafnium and aluminum.

When the dopant is silicon (Si), the ferroelectric material layer may include silicon of 2 at % to 10 at %. When the dopant is yttrium (Y), the ferroelectric material layer may include yttrium of 2 at % to 10 at %. When the dopant is gadolinium (Gd), the ferroelectric material layer may include gadolinium of 1 at % to 7 at %. When the dopant is zirconium (Zr), the ferroelectric material layer may include zirconium of 50 at % to 80 at %.

The paraelectric material layer may have paraelectric characteristics. The paraelectric material layer may include, for example, at least one of silicon oxide and metal oxide having a high dielectric constant. The metal oxide included in the paraelectric material layer may include, but is not limited to, at least one of hafnium oxide, zirconium oxide, and aluminum oxide.

The ferroelectric material layer and the paraelectric material layer may include the same material. Although the ferroelectric material layer has ferroelectric characteristics, the paraelectric material layer may not have ferroelectric characteristics. According to an embodiment, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness having ferroelectric characteristics. The thickness of the ferroelectric material layer may be, for example, 0.5 nm to 10 nm, but is not limited thereto. Since a threshold thickness indicating ferroelectric characteristics may vary depending on each ferroelectric material, the thickness of the ferroelectric material layer may vary depending on the ferroelectric material.

According to an embodiment, each of the first to fourth gate insulating layers 130, 230, 330 and 430 may include one ferroelectric material layer. For another example, each of the first to fourth gate insulating layers 130, 230, 330 and 430 may include a plurality of ferroelectric material layers spaced apart from each other. Each of the first to fourth gate insulating layers 130, 230, 330 and 430 may have a deposited layer structure in which a plurality of ferroelectric material layers and a plurality of paraelectric material layers are alternately deposited.

An inter-gate structure GS_INT may be disposed between the first sheet patterns NS1 adjacent to each other in the fifth direction Z and between the first lower pattern BP1 and the first sheet pattern NS1. The inter-gate structure GS_INT may include the first gate electrode 120 and the first gate insulating layer 130, which are disposed between the adjacent first sheet patterns NS1 and between the first lower pattern BP1 and the first sheet pattern NS1. Although not shown, the inter-gate structure GS_INT may be disposed between the sheet patterns NS2, NS3 and NS4 adjacent to one another in the fifth direction Z and between the lower patterns BP2, BP3 and BP4 and the sheet patterns NS2, NS3 and NS4.

A gate spacer 140 may be disposed on the sidewall of the first gate electrode 120. The gate spacer 140 may be extended in the second direction Y1.

In FIG. 2A, the gate spacer 140 is not disposed between the first sheet patterns NS1 adjacent to each other in the fifth direction Z and between the first sheet pattern NS1 and the first lower pattern BP1. The gate spacer 140 may include only an outer spacer.

In FIG. 2B, the gate spacer 140 may be disposed between the first sheet patterns NS1 adjacent to each other in the fifth direction Z and between the first sheet pattern NS1 and the first lower pattern BP1. The gate spacer 140 may include an outer spacer 142 and an inner spacer 141. The inner spacer 141 may be disposed between the first sheet patterns NS1 adjacent to each other in the fifth direction Z and between the first sheet pattern NS1 and the first lower pattern BP1. The inner spacer 141 may be formed on the first gate insulating layer 130 of the inter-gate structure GS_INT.

The gate spacer 140 may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) and their combination.

FIGS. 2A and 2B are cross-sectional views taken along the first active pattern AP1. Although not shown, the drawings taken along the second to fourth active patterns AP2, AP3 and AP4 may be substantially the same as FIG. 2a or 2b.

A first gate capping pattern 145 may be disposed on the upper surface 120_US of the first gate electrode 120. A second gate capping pattern 245 may be disposed on an upper surface 220_US of the second gate electrode 220. A third gate capping pattern 345 may be disposed on an upper surface 320_US of the third gate electrode 320. A fourth gate capping pattern 445 may be disposed on an upper surface 420_US of the fourth gate electrode 420.

The first gate capping pattern 145 shown in FIGS. 2A and 2B are only an example. The first gate capping pattern 145 may be disposed on an upper surface of the gate spacer 140. Unlike the shown example, the first gate capping pattern 145 may be disposed between the gate spacers 140.

Each of the first to fourth gate capping patterns 145, 245, 345 and 445 may include at least one of, for example, silicon nitride (SiN), silicon oxynitride (SiON), silicon oxide ($SiO_2$), silicon carbonitride (SiCN), silicon oxycarbonitride (SiOCN), and their combination.

The first source/drain pattern 150 may be formed on the first active pattern AP1. The first source/drain pattern 150 may be disposed on the first lower pattern BP1. A second source/drain pattern 250 may be formed on the second active pattern AP2. The second source/drain pattern 250 may be disposed on the second lower pattern BP2. A third source/drain pattern 350 may be formed on the third active pattern AP3. The third source/drain pattern 350 may be disposed on the third lower pattern BP3. A fourth source/drain pattern 450 may be formed on the fourth active pattern AP4. The fourth source/drain pattern 450 may be disposed on the fourth lower pattern BP4.

The first source/drain pattern 150 shown in FIGS. 2A and 2B are only example. The first source/drain pattern 150 may be disposed on a side of the first gate electrode 120. The first source/drain pattern 150 may be disposed between the first gate electrodes 120. The first source/drain pattern 150 may be disposed on at least one side of the first gate electrode 120. According to an embodiment, the first source/drain pattern 150 may be disposed on both sides of the first gate electrode 120, as shown in FIGS. 2A and 2B. However, according to an embodiment, the first source/drain pattern 150 may be disposed on one side of the first gate electrode 120, and may not be disposed on the other side of the first gate electrode 120.

Each of the first to fourth source/drain patterns 150, 250, 350 and 450 may include an epitaxial pattern. Each of the first to fourth source/drain patterns 150, 250, 350 and 450 may include, for example, a semiconductor material.

The first source/drain pattern 150 may be included in a source/drain of a transistor that uses the first active pattern AP1, for example, the first sheet pattern NS1 as a channel region. The second source/drain pattern 250 may be included in a source/drain of a transistor that uses the second sheet pattern NS2 as a channel region. The third source/drain pattern 350 may be included in a source/drain of a transistor that uses the third active pattern AP3, for example, the third sheet pattern NS3 as a channel region. The fourth source/drain pattern 450 may be included in a source/drain of a transistor that uses the fourth sheet pattern NS4 as a channel region.

A source/drain etch stop layer 156 may be disposed along the upper surface 105_US of the first field insulating layer 105, the upper surface 106_US of the second field insulating layer 106, a profile of the first source/drain pattern 150, a profile of the second source/drain pattern 250, a profile of the third source/drain pattern 350, and a profile of the fourth source/drain pattern 450.

The source/drain etch stop layer 156 may include a material having an etch selectivity with respect to a first interlayer insulating layer 191 that will be described later. The source/drain etch stop layer 156 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC) and their combination. Unlike the shown example, the source/drain etch stop layer 156 may not be formed.

The first interlayer insulating layer 191 may be disposed on the first field insulating layer 105 and the second field insulating layer 106. The first interlayer insulating layer 191 may be disposed on the first to fourth source/drain patterns 150, 250, 350 and 450.

According to an embodiment, the first interlayer insulating layer 191 is not disposed on an upper surface of the first gate capping pattern 145, an upper surface of the second gate capping pattern 245, an upper surface of the third gate capping pattern 345 and an upper surface of the fourth gate capping pattern 445.

The first interlayer insulating layer 191 may include at least one of, for example, silicon oxide, silicon nitride, silicon oxynitride, and a low dielectric constant material. according to an embodiment, the low dielectric constant material may include, for example, Fluorinated TetraEthyl-OrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica or their combination, but is not limited thereto.

Although not shown, source/drain contacts connected to the source/drain patterns 150, 250, 350 and 450 may be disposed in the first interlayer insulating layer 191. A gate contact connected with the first to fourth gate electrodes 120, 220, 320 and 420 may be disposed in the gate capping patterns 145, 245, 345 and 445.

The first gate isolation structure 160 may be disposed on the first field insulating layer 105. The first gate isolation structure 160 may be disposed between the first active pattern AP1 and the second active pattern AP2. The first gate isolation structure 160 may separate the first gate electrode 120 from the second gate electrode 220. The first gate isolation structure 160 may separate the first gate capping pattern 145 from the second gate capping pattern 245.

The first gate isolation structure 160 may extend from the first field insulating layer 105 to a level of the upper surface of the first interlayer insulating layer 191. In FIG. 5, the first gate isolation structure 160 passing between the first source/drain pattern 150 and the second source/drain pattern 250 may be disposed in the first interlayer insulating layer 191.

The first gate isolation structure 160 may include a lower isolation pattern 160B and an upper isolation pattern 160U. The upper isolation pattern 160U may be disposed on the lower isolation pattern 160B. The upper isolation pattern 160U is disposed on an upper surface 160B_US of the lower isolation pattern 160B. In the semiconductor device according to embodiments, the upper surface 160B_US of the lower isolation pattern 160B may be a flat plane.

The lower isolation pattern 160B is in contact with the first field insulating layer 105. However, the upper isolation pattern 160U is separated from the first field insulating layer 105 with the lower isolation pattern interposed therebetween. The upper isolation pattern 160U does not extend to the upper surface 105_US of the first field insulating layer 105.

The lower isolation pattern 160B does not protrude above a level of the upper surface 120_US of the first gate electrode 120 and a level of the upper surface 220_US of the second gate electrode 220. Based on the upper surface BP1_US of the first lower pattern BP1, the upper surface 160B_US of the lower isolation pattern 160B is lower than the upper surface 120_US of the first gate electrode 120 and the upper surface 220_US of the second gate electrode 220. The upper isolation pattern 160U protrudes above the level of the upper surface 120_US of the first gate electrode 120 and the level of the upper surface 220_US of the second gate electrode 220.

The upper isolation pattern 160U may extend to a level of the upper surface of the first gate capping pattern 145 and a level of the upper surface of the second gate capping pattern 245. Based on the upper surface BP1_US of the first lower pattern BP1, an upper surface 160U_US of the upper isolation pattern 160U is higher than the upper surface 120_US of the first gate electrode 120 and the upper surface 220_US of the second gate electrode 220.

The first gate capping pattern 145 and the second gate capping pattern 245 are not separated from each other by the lower isolation pattern 160B. The first gate capping pattern 145 and the second gate capping pattern 245 may be separated from each other by the upper isolation pattern 160U.

In the semiconductor device according to embodiments, a height H1 from the upper surface BP1_US of the first lower pattern BP1 to the upper surface AP1_US of the first active pattern AP1 may be the same as a height H2 from the upper surface BP1_US of the first lower pattern BP1 to a level of the upper surface 160B_US of the lower isolation pattern 160B. The upper surface 160B_US of the lower isolation pattern 160B may not protrude above a level of the upper surface AP1_US of the first active pattern AP1 and a level of the upper surface AP2_US of the second active pattern AP2.

The upper surface of the first gate isolation structure 160 may be the upper surface 160U_US of the upper isolation pattern 160U. The lower isolation pattern 160B may include a first sidewall 160B_SW1 and a second sidewall 160B_SW2, which are opposite to each other in the second direction Y1. The upper isolation pattern 160U may include a first sidewall 160U_SW1 and a second sidewall 160U_SW2, which are opposite to each other in the second direction Y1. The first sidewall 160B_SW1 of the lower isolation pattern 160B and the first sidewall 160U_SW1 of the upper isolation pattern 160U face the first gate electrode 120. The second sidewall 160B_SW2 of the lower isolation pattern 160B and the second sidewall 160U_SW2 of the upper isolation pattern 160U may face the second gate electrode 220.

The lower isolation pattern 160B may include an upper region 160B_UR and a lower region 160B_BR. The upper region 160B_UR of the lower isolation pattern 160B may be disposed above the upper surface 105_US of the first field insulating layer 105. The upper region 160B_UR of the lower isolation pattern 160B may protrude above the upper surface 105_US of the first field insulating layer 105. The lower region 160B_BR of the lower isolation pattern 160B may be disposed below the upper surface 105_US of the first field insulating layer 105. The lower region 160B_BR of the lower isolation pattern 160B is in contact with the first field insulating layer 105. A boundary between the upper region 160B_UR of the lower isolation pattern 160B and the lower region 160B_BR of the lower isolation pattern 160B may be a virtual point or line where the lower isolation pattern 160B is in contact with the upper surface 105_US of the first field insulating layer 105.

In at least a portion of the upper region 160B_UR of the lower isolation pattern 160B, a width of the lower isolation pattern 160B in the second direction Y1 may increase in a downward direction from the upper isolation pattern 160U. In the semiconductor device according to embodiments, in the upper region 160B_UR of the lower isolation pattern 160B, the width of the lower isolation pattern 160B in the second direction Y1 may increase and then decrease in the downward direction from the upper isolation pattern 160U. According to an embodiment, the width of the lower isolation pattern 160B in the second direction Y1 may be a distance between the first sidewall 160B_SW1 of the lower isolation pattern 160B and the second sidewall 160B_SW2 of the lower isolation pattern 160B.

In at least a portion of the lower region 160B_BR of the lower isolation pattern 160B, the width of the lower isolation pattern 160B in the second direction Y1 may decrease in the downward direction from the upper isolation pattern 160U. In the semiconductor device according to embodiments, in the lower region 160B_BR of the lower isolation pattern 160B, the width of the lower isolation pattern 160B in the second direction Y1 decrease in the downward direction from the upper isolation pattern 160U.

The lower isolation pattern 160B may include a first portion 160B_P1 and a second portion 160B_P2. The second portion 160B_P2 of the lower isolation pattern 160B is disposed below the first portion 160B_P1 of the lower isolation pattern 160B. The first portion 160B_P1 and the second portion 160B_P2 may be divided by a virtual horizontal line having the greatest width of the lower isolation pattern 160B in the second direction Y1.

The second portion 160B_P2 of the lower isolation pattern 160B is in contact with the first field insulating layer 105. The first portion 160B_P1 of the lower isolation pattern 160B is disposed above the upper surface 105_US of the first field insulating layer 105. In the semiconductor device according to embodiments, the first portion 160B_P1 of the lower isolation pattern 160B is directly connected with the second portion 160B_P2 of the lower isolation pattern 160B. The first portion 160B_P1 of the lower isolation pattern 160B may include the upper surface 160B_US of the lower isolation pattern 160B.

In the first portion 160B_P1 of the lower isolation pattern 160B, a width W11 of the lower isolation pattern 160B in the second direction Y1 may increase in the downward direction from the upper isolation pattern 160U. In the second portion 160B_P2 of the lower isolation pattern 160B, a width W12 of the lower isolation pattern 160B in the second direction Y1 may decrease in the downward direction from the upper isolation pattern 160U.

The upper region 160B_UR of the lower isolation pattern 160B includes the first portion 160B_P1 and a portion of the second portion 160B_P2. The lower region 160B_BR of the lower isolation pattern 160B includes the remainder of the second portion 160B_P2 of the lower isolation pattern 160B.

The upper isolation pattern 160U includes a first portion 160U_P1 (see FIG. 16) protruding above the level of the upper surface 120_US of the first gate electrode 120 and the level of the upper surface 220_US of the second gate electrode 220. In the first portion 160U_P1 of the upper isolation pattern 160U, a width W21 of the upper isolation pattern 160U in the second direction Y1 increases in an upward direction from the lower isolation pattern 160B.

The second gate isolation structure 360 may be disposed on the second field insulating layer 106. The second gate isolation structure 360 may be disposed between the third active pattern AP3 and the fourth active pattern AP4. The second gate isolation structure 360 may separate the third gate electrode 320 and the fourth gate electrode 420 from each other. The second gate isolation structure 360 may separate the third gate capping pattern 345 and the fourth gate capping pattern 445 from each other.

The second gate isolation structure 360 may extend from the second field insulating layer 106 to the level of the upper surface of the first interlayer insulating layer 191. In FIG. 6, the second gate isolation structure 360 passing between the third source/drain pattern 350 and the fourth source/drain pattern 450 may be disposed in the first interlayer insulating layer 191.

Based on the upper surface BP3_US of the third lower pattern BP3, an upper surface 360_US of the second gate isolation structure 360 is higher than the upper surface 320_US of the third gate electrode 320 and the upper surface 420_US of the fourth gate electrode 420. The second gate isolation structure 360 may include a first sidewall 360_SW1 and a second sidewall 360_SW2, which are opposite to each other in the fourth direction Y2. The first sidewall 360_SW1 of the second gate isolation structure 360 faces the third gate electrode 320. The second sidewall 360_SW2 of the second gate isolation structure 360 faces the fourth gate electrode 420.

A width W3 of the second gate isolation structure 360 in the fourth direction Y2 increases in an upward direction from the second field insulating layer 106.

Each of the lower isolation pattern 160B and the upper isolation pattern 160U of the first gate isolation structure 160 and the second gate isolation structure 360 may include at least one of silicon nitride (SiN), silicon oxynitride (SiON), silicon oxide ($SiO_2$), silicon oxycarbonitride (SiOCN), silicon oxycarbide (SiOC), and their combination.

According to an embodiment, the lower isolation pattern 160B may include a material different from that of the upper isolation pattern 160U. For example, the lower isolation pattern 160B may include, but is not limited to, an insulating material containing carbon, and the upper isolation pattern 160U may include, but is not limited to, silicon nitride. For another example, the lower isolation pattern 160B may include the same material as that of the upper isolation pattern 160U.

According to an embodiment, the upper isolation pattern 160U of the first gate isolation structure 160 may include the same material as that of the second gate isolation structure 360. The upper isolation pattern 160U of the first gate isolation structure 160 and the second gate isolation structure 360 may be formed at the same step. In this case, the "same step" means that the corresponding elements are formed by the same manufacturing process.

Although the lower isolation pattern 160B is shown as a single layer, it is only for convenience of description and is not limited thereto. Unlike the shown example, an oxide layer may be disposed in a portion that forms a boundary with the upper isolation pattern 160U.

According to an embodiment, a width 160_USW of the upper surface 160U_US of the upper isolation pattern 160U in the second direction Y1 may be the same as a width 360_USW of the upper surface 360_US of the second gate isolation structure 360 in the fourth direction Y2 (see FIGS. 3 and 4). However, according to an embodiment, the width 160_USW of the upper surface 160U_US of the upper isolation pattern 160U in the second direction Y1 may be smaller than the width 360_USW of the upper surface 360_US of the second gate isolation structure 360 in the fourth direction Y2.

In the semiconductor device according to embodiments, a width of the upper surface 160B_US of the lower isolation pattern 160B in the second direction Y1 may be the same as a width of a bottom surface of the upper isolation pattern 160U in the second direction Y1.

In the semiconductor device according to embodiments, the first gate insulating layer 130 extends along the first sidewall 160B_SW1 of the lower isolation pattern 160B, but does not extend along the first sidewall 160U_SW1 of the upper isolation pattern 160U, as shown in FIGS. 3 and 7. The second gate insulating layer 230 extends along the second sidewall 160B_SW2 of the lower isolation pattern 160B, but does not extend along the second sidewall 160U_SW2 of the upper isolation pattern 160U, also as shown in FIGS. 3 and 7. The first gate insulating layer 130 and the second gate insulating layer 230 are not disposed on the sidewalls 160U_SW1 and 160U_SW2 of the upper isolation pattern 160U. The third gate insulating layer 330 does not extend along the first sidewall 360_SW1 of the second gate isolation structure 360. The fourth gate insulating layer 430 does not extend along the second sidewall 360_SW2 of the second gate isolation structure 360, as shown in FIG. 4.

As described above, the first gate isolation structure 160 may have a multi-structure that includes a lower isolation pattern 160B and an upper isolation pattern 160U. The first gate electrode 120 and the second gate electrode 220 are separated from each other by the first gate isolation structure 160 that includes a plurality of isolation patterns. The second gate isolation structure 360 may have a single structure extending from above a level of the upper surface 320_US of the third gate electrode 320 to below a level of the upper surface 106_US of the second field insulating layer 106. The third gate electrode 320 and the fourth gate electrode 420 are separated from each other by the second gate isolation structure 360 that includes one isolation pattern.

As described above, the source/drain etch stop layer 156 may extend along the first sidewall 160B_SW1 of the lower isolation pattern 160B and the second sidewall 160B_SW2 of the lower isolation pattern 160B, as shown in FIG. 5. The source/drain etch stop layer 156 does not extend along the first sidewall 160U_SW1 of the upper isolation pattern 160U and the second sidewall 160U_SW2 of the upper isolation pattern 160U. The source/drain etch stop layer 156 does not extend along the first sidewall 360_SW1 of the second gate isolation structure 360 and the second sidewall 360_SW2 of the second gate isolation structure 360, as shown in FIG. 6.

Although not shown, at least one of the first source/drain pattern 150 and the second source/drain pattern 250 may be in contact with the lower isolation pattern 160B. When the first source/drain pattern 150 is in contact with the lower isolation pattern 160B, the source/drain etch stop layer 156 is not disposed along the upper surface 105_US of the first field insulating layer 105 positioned between the first source/drain pattern 150 and the lower isolation pattern 160B. In addition, an air gap may be disposed between the first source/drain pattern 150, the first field insulating layer 105 and the lower isolation pattern 160B.

Although shown that the first gate isolation structure 160 separates two gate electrodes 120 adjacent to each other in the first direction X1 and two gate electrodes 220 adjacent to each other in the first direction X1, and the second gate isolation structure 360 separates two gate electrodes 320 adjacent to each other in the third direction X2 and two gate electrodes 420 adjacent to each other in the third direction X2, these gate isolation structures are not limited thereto. Unlike the shown example, the first gate isolation structure 160 may separate one gate electrode 120 and one gate electrode 220, or may separate three or more gate electrodes 120 adjacent to one another in the first direction X1 and three or more gate electrodes 220 adjacent to one another in the first direction X1. Likewise, the second gate isolation structure 360 may separate one gate electrode 320 and one gate electrode 420, or may separate three or more gate electrodes 320 adjacent to one another in the third direction X2 and three or more gate electrodes 420 adjacent to one another in the third direction X2.

The second interlayer insulating layer 192 may be disposed on the first interlayer insulating layer 191, the first gate isolation structure 160 and the second gate isolation structure 360. The second interlayer insulating layer 192 may include at least one of, for example, silicon oxide, silicon nitride, silicon carbonitride, silicon oxynitride and a low dielectric constant material.

Although not shown, a via plug and/or a wiring line, which will be connected to the source/drain patterns 150, 250, 350 and 450 and the gate electrodes 120, 220, 320 and 420, may be disposed in the second interlayer insulating layer 192.

FIGS. 8 to 14 are views illustrating a semiconductor device according to embodiments. For convenience of description, the following description will be based on a difference from the description made with reference to FIGS. 1 to 7. For reference, FIGS. 8 to 14 are enlarged views illustrating a portion P of FIG. 3, respectively.

Figure 8:
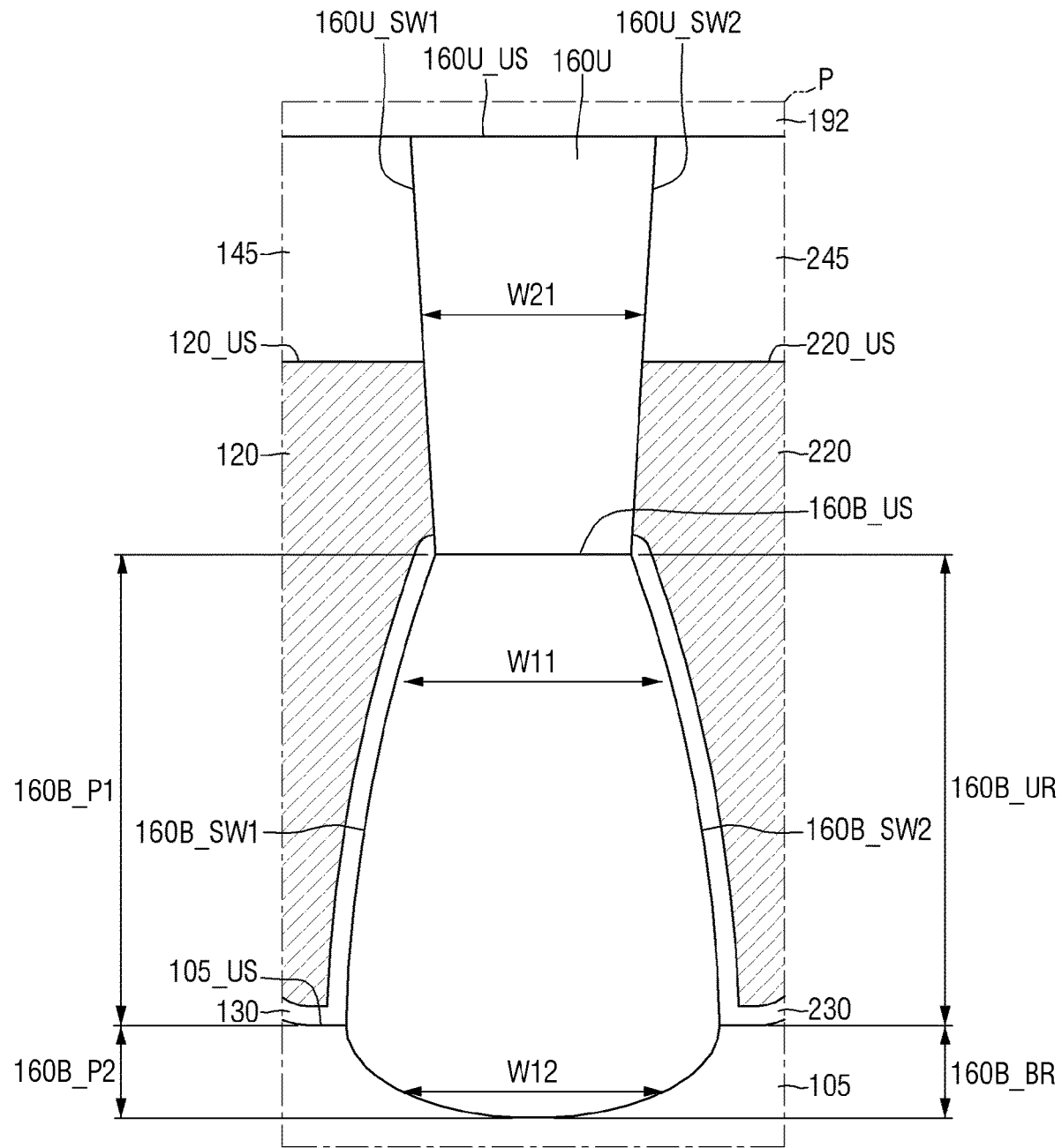
FIGS. 8 to 14 are views illustrating a semiconductor device according to embodiments.

Referring to FIG. 8, in the semiconductor device according to embodiments, in the upper region 160B_UR of the lower isolation pattern 160B, the width of the lower isolation pattern 160B in the second direction Y1 increases in a downward from the upper isolation pattern 160U.

The upper region 160B_UR of the lower isolation pattern 160B does not include the second portion 160B_P2 of the lower isolation pattern 160B. Like in the embodiment shown in FIG. 7, the first portion 160B_P1 and the second portion 160B_P2 may be divided by a virtual horizontal line having the greatest width of the lower isolation pattern 160B in the second direction Y1.

Figure 9:
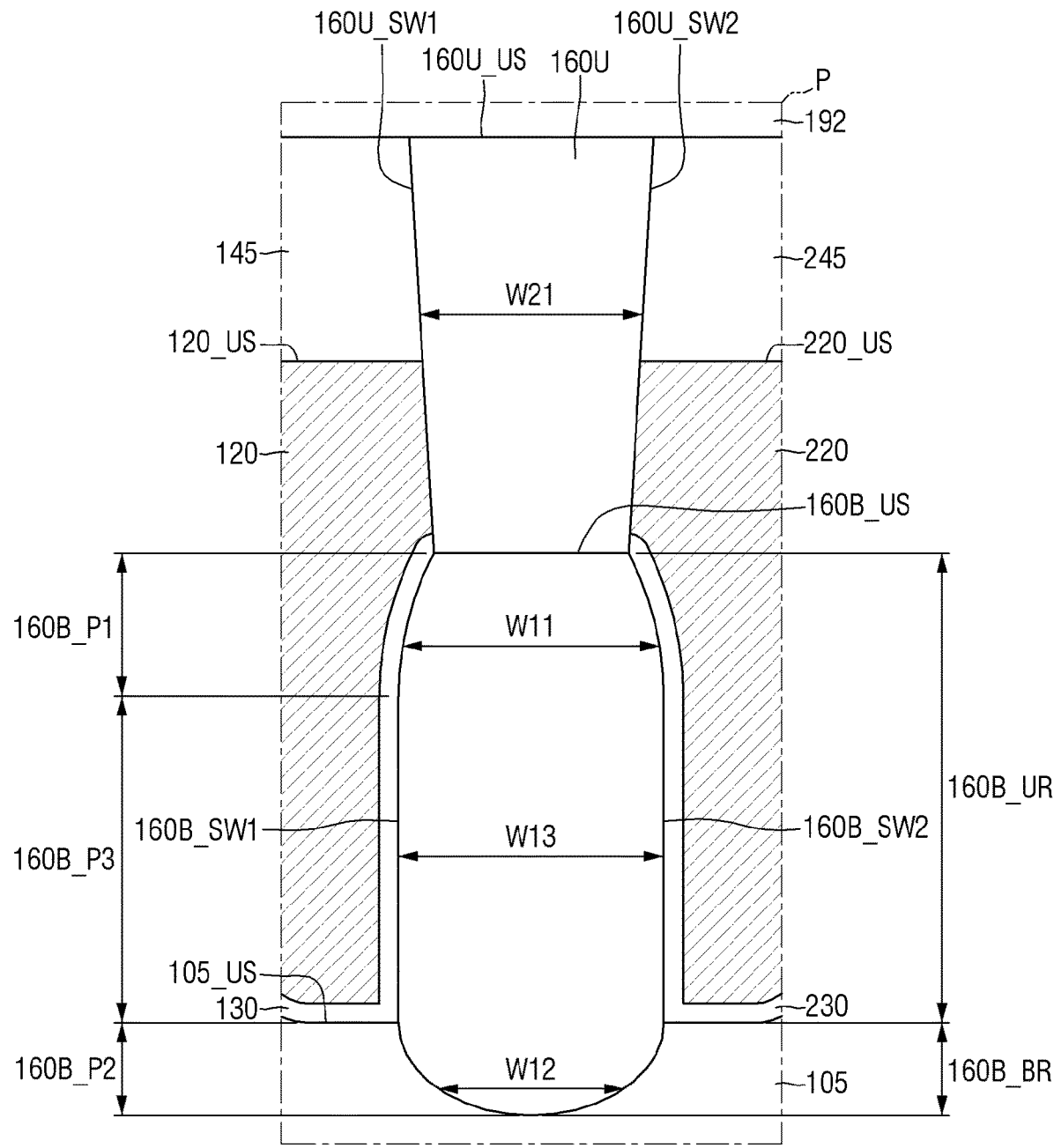

Referring to FIG. 9, in the semiconductor device according to embodiments, in the upper region 160B_UR of the lower isolation pattern 160B, the width of the lower isolation pattern 160B in the second direction Y1 may increase and then remain constant in a downward direction from the upper isolation pattern 160U.

The lower isolation pattern 160B may further include a third portion 160B_P3 disposed between the second portion 160B_P2 of the lower isolation pattern 160B and the first portion 160B_P1 of the lower isolation pattern 160B. In the third portion 160B_P3 of the lower isolation pattern 160B, a width W13 of the lower isolation pattern 160B in the second direction Y1 may be constant in the downward direction from the upper isolation pattern 160U.

The upper region 160B_UR of the lower isolation pattern 160B may include the first portion 160B_P1 of the lower isolation pattern 160B and the third portion 160B_P3 of the lower isolation pattern 160B.

Figure 10:
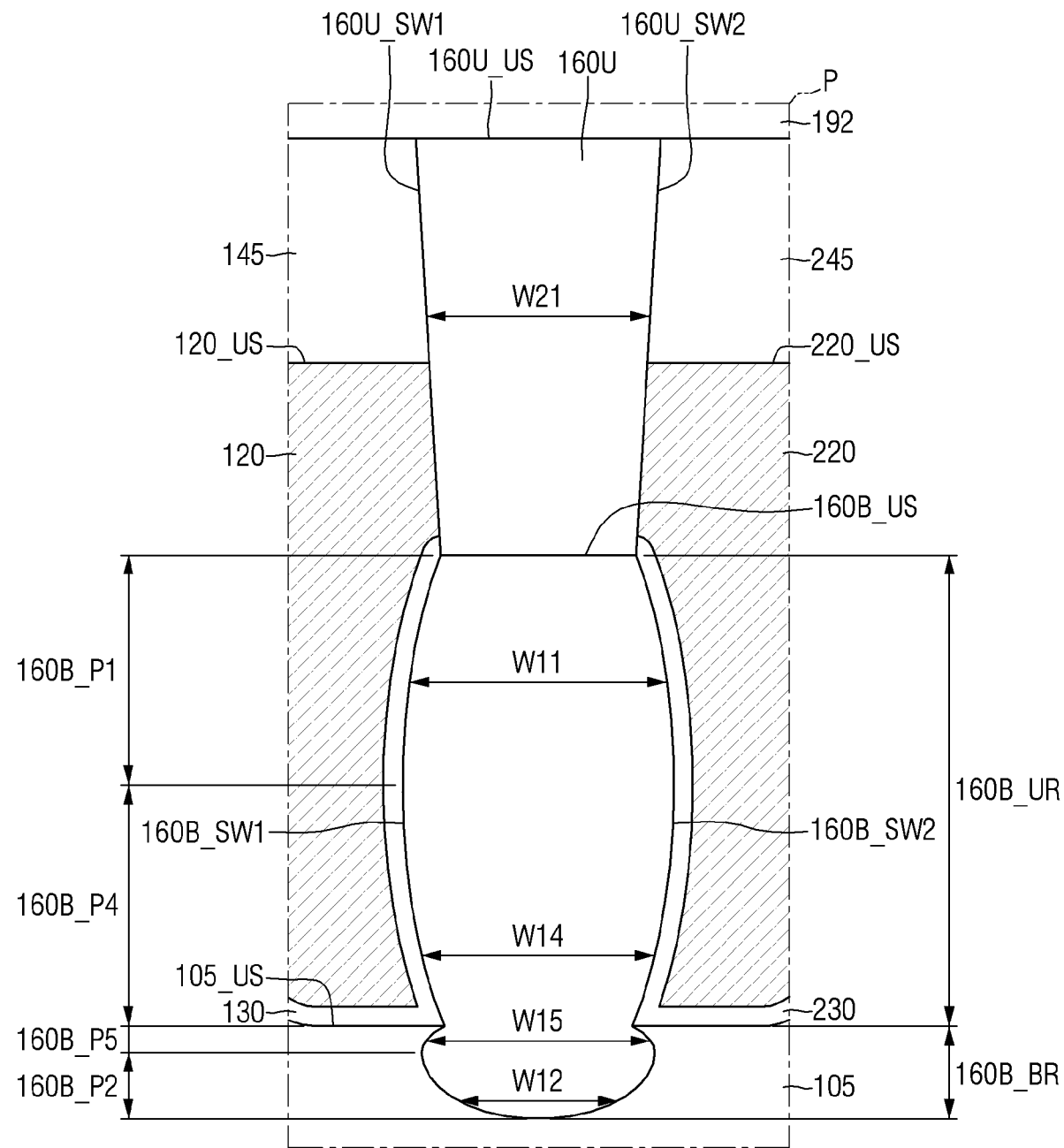
Figure 11:
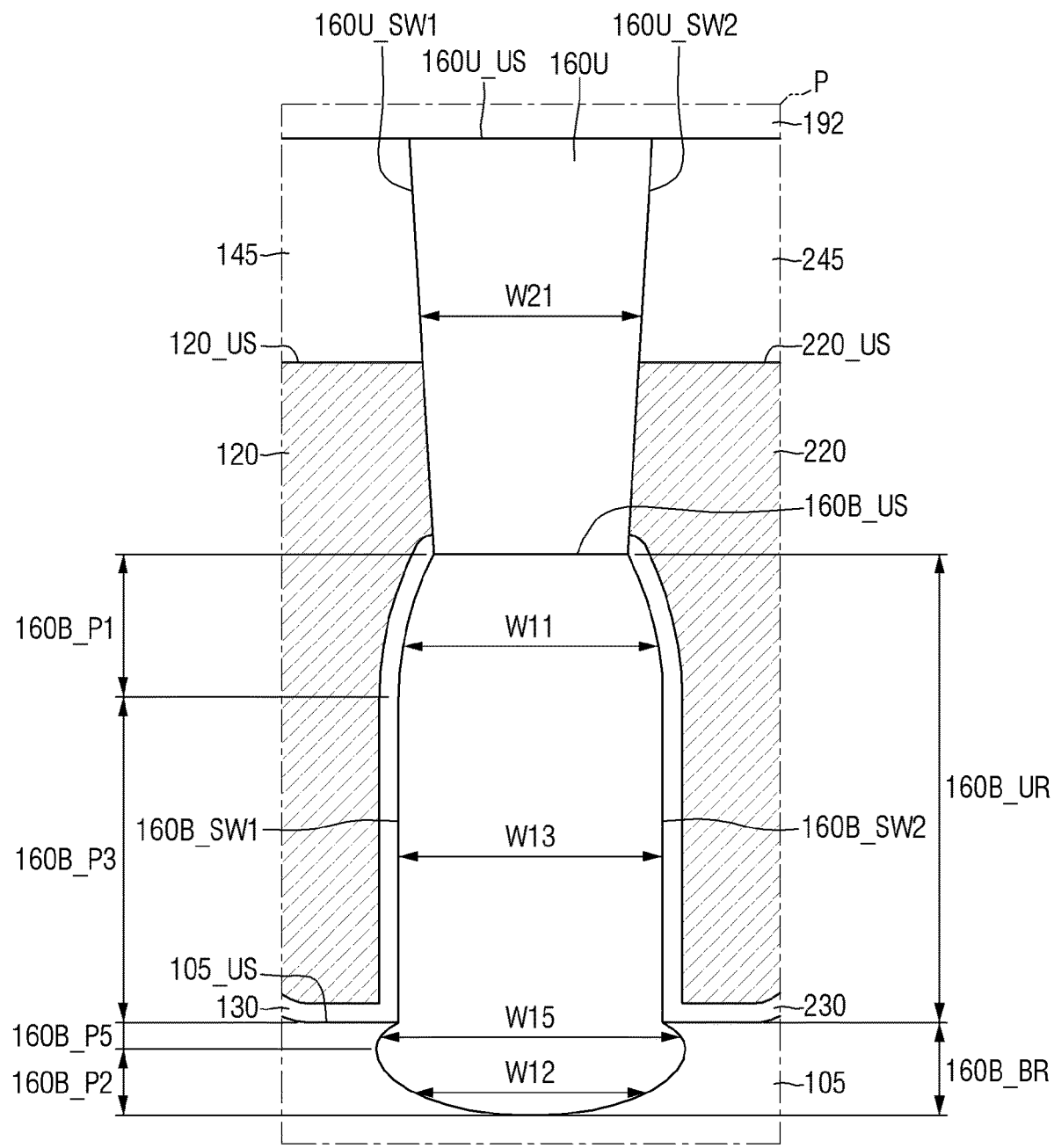

Referring to FIGS. 10 and 11, in the semiconductor device according to embodiments, in the lower region 160B_BR of the lower isolation pattern, the width of the lower isolation pattern 160B in the second direction Y1 may increase and then decrease as it moves away from the upper isolation pattern 160U.

In FIG. 10, in the upper region 160B_UR of the lower isolation pattern 160B, the width of the lower isolation pattern 160B in the second direction Y1 may increase and then decrease in a downward direction from the upper isolation pattern 160U.

The lower isolation pattern 160B may further include a fourth portion 160B_P4 and a fifth portion 160B_P5, which are disposed between the second portion 160B_P2 of the lower isolation pattern 160B and the first portion 160B_P1 of the lower isolation pattern 160B. The fourth portion 160B_P4 of the lower isolation pattern 160B is disposed between the first portion 160B_P1 of the lower isolation pattern 160B and the fifth portion 160B_P5 of the lower isolation pattern 160B.

In the fourth portion 160B_P4 of the lower isolation pattern 160B, a width W14 of the lower isolation pattern 160B in the second direction Y1 may decrease in the downward direction from the upper isolation pattern 160U. In the fifth portion 160B_P5 of the lower isolation pattern 160B, a width W15 of the lower isolation pattern 160B in the second direction Y1 may increase in the downward direction from the upper isolation pattern 160U.

The upper region 160B_UR of the lower isolation pattern 160B may include the first portion 160B_P1 of the lower isolation pattern and the fourth portion 160B_P4 of the lower isolation pattern 160B. The lower region 160B_BR of the lower isolation pattern 160B may include the second portion 160B_P2 of the lower isolation pattern 160B and the fifth portion 160B_P5 of the lower isolation pattern 160B.

In FIG. 11, in the upper region 160B_UR of the lower isolation pattern 160B, the width of the lower isolation pattern 160B in the second direction Y1 may increase and then remain constant in a downward direction from the upper isolation pattern 160U.

The lower isolation pattern 160B may further include a third portion 160B_P3 and a fifth portion 160B_P5, which are disposed between the second portion 160B_P2 of the lower isolation pattern 160B and the first portion 160B_P1 of the lower isolation pattern 160B. The third portion 160B_P3 of the lower isolation pattern 160B is disposed between the first portion 160B_P1 of the lower isolation pattern 160B and the fifth portion 160B_P5 of the lower isolation pattern 160B.

In the third portion 160B_P3 of the lower isolation pattern 160B, the width W13 of the lower isolation pattern 160B in the second direction Y1 may be constant in the downward direction from the upper isolation pattern 160U. In the fifth portion 160B_P5 of the lower isolation pattern 160B, the width W15 of the lower isolation pattern 160B in the second direction Y1 may increase in the downward direction from the upper isolation pattern 160U.

The upper region 160B_UR of the lower isolation pattern 160B may include the first portion 160B_P1 of the lower isolation pattern 160B and the third portion 160B_P3 of the lower isolation pattern 160B. The lower region 160B_BR of the lower isolation pattern 160B may include the second portion 160B_P2 of the lower isolation pattern 160B and the fifth portion 160B_P5 of the lower isolation pattern 160B.

Figure 12:
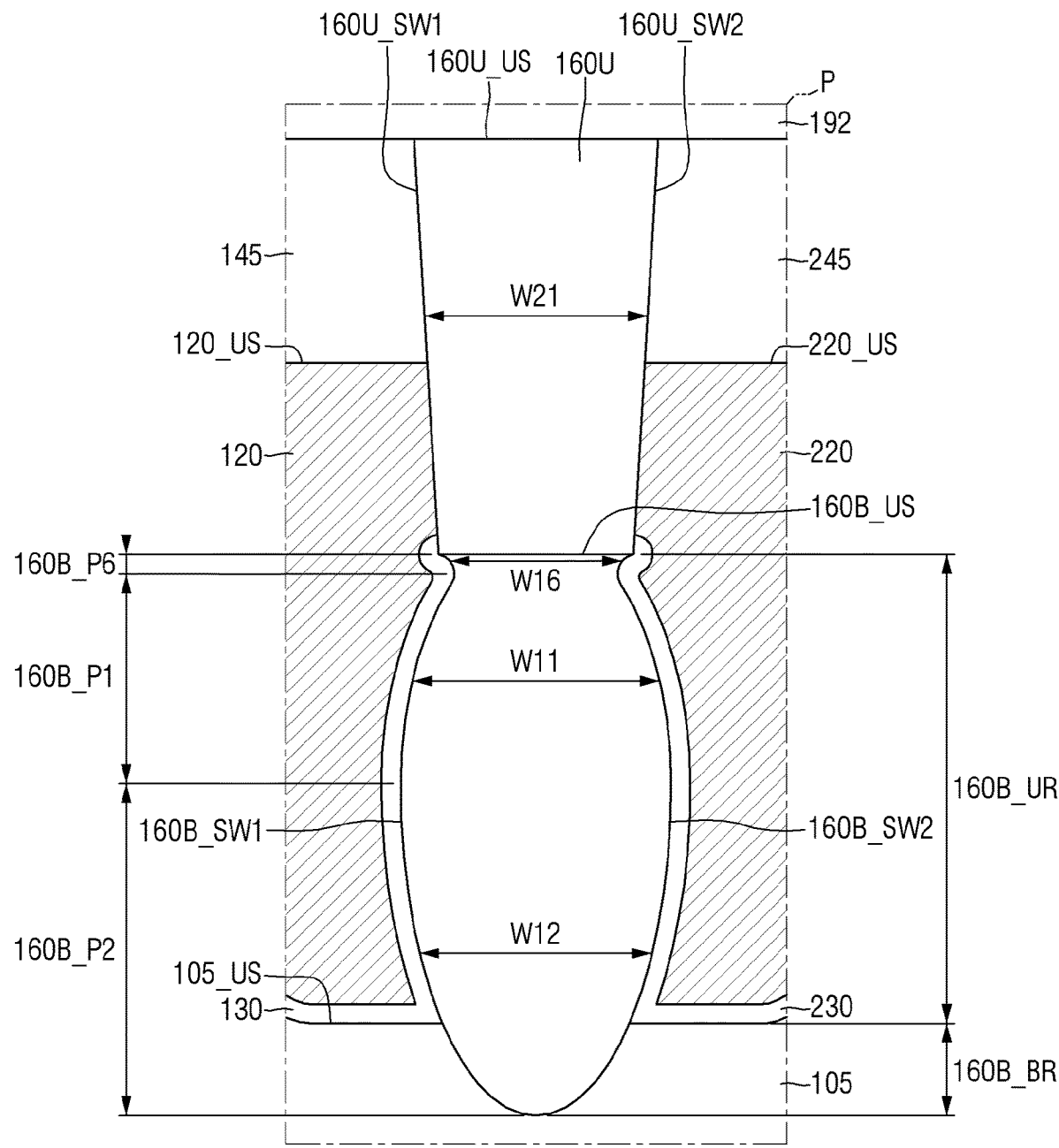

Referring to FIG. 12, in the semiconductor device according to embodiments, in the upper region 160B_UR of the lower isolation pattern 160B, the width of the lower isolation pattern 160B in the second direction Y1 may decrease and then increase and decrease again in a downward direction the upper isolation pattern 160U.

The lower isolation pattern 160B may further include a sixth portion 160B_P6 disposed on the first portion 160B_P1 of the lower isolation pattern 160B. In the sixth portion 160B_P6 of the lower isolation pattern 160B, a width W16 of the lower isolation pattern 160B in the second direction Y1 may increase in an upward direction the upper isolation pattern 160U.

The upper region 160B_UR of the lower isolation pattern 160B may include a portion of the second portion 160B_P2 of the lower isolation pattern 160B, the first portion 160B_P1 of the lower isolation pattern 160B, and the sixth portion 160B_P6 of the lower isolation pattern 160B.

Figure 13:
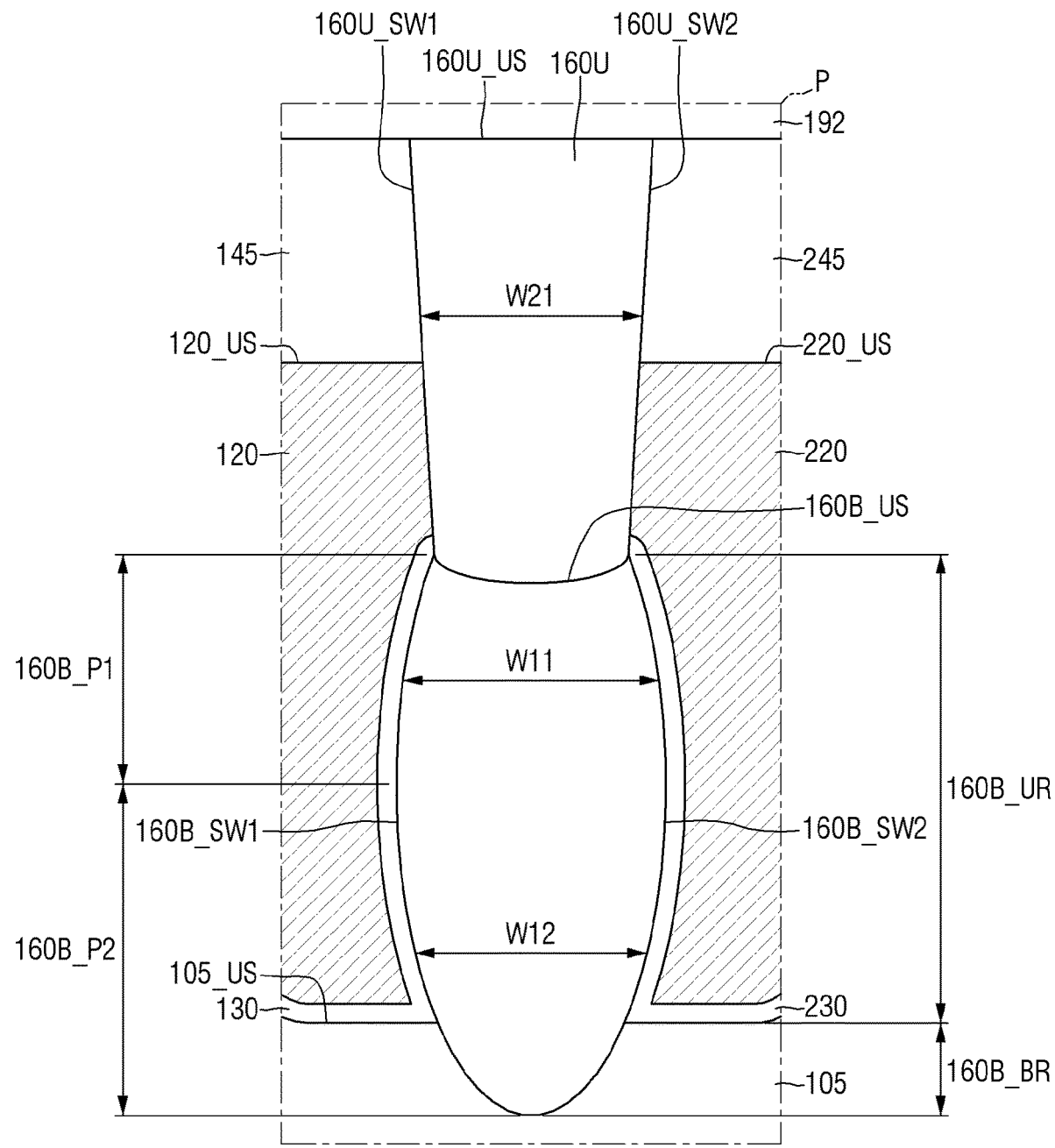

Referring to FIG. 13, in the semiconductor device according to embodiments, the upper surface 160B_US of the lower isolation pattern 160B may include a curved surface. For example, the upper surface 160B_US of the lower isolation pattern 160B may include a concave curved surface.

Figure 14:
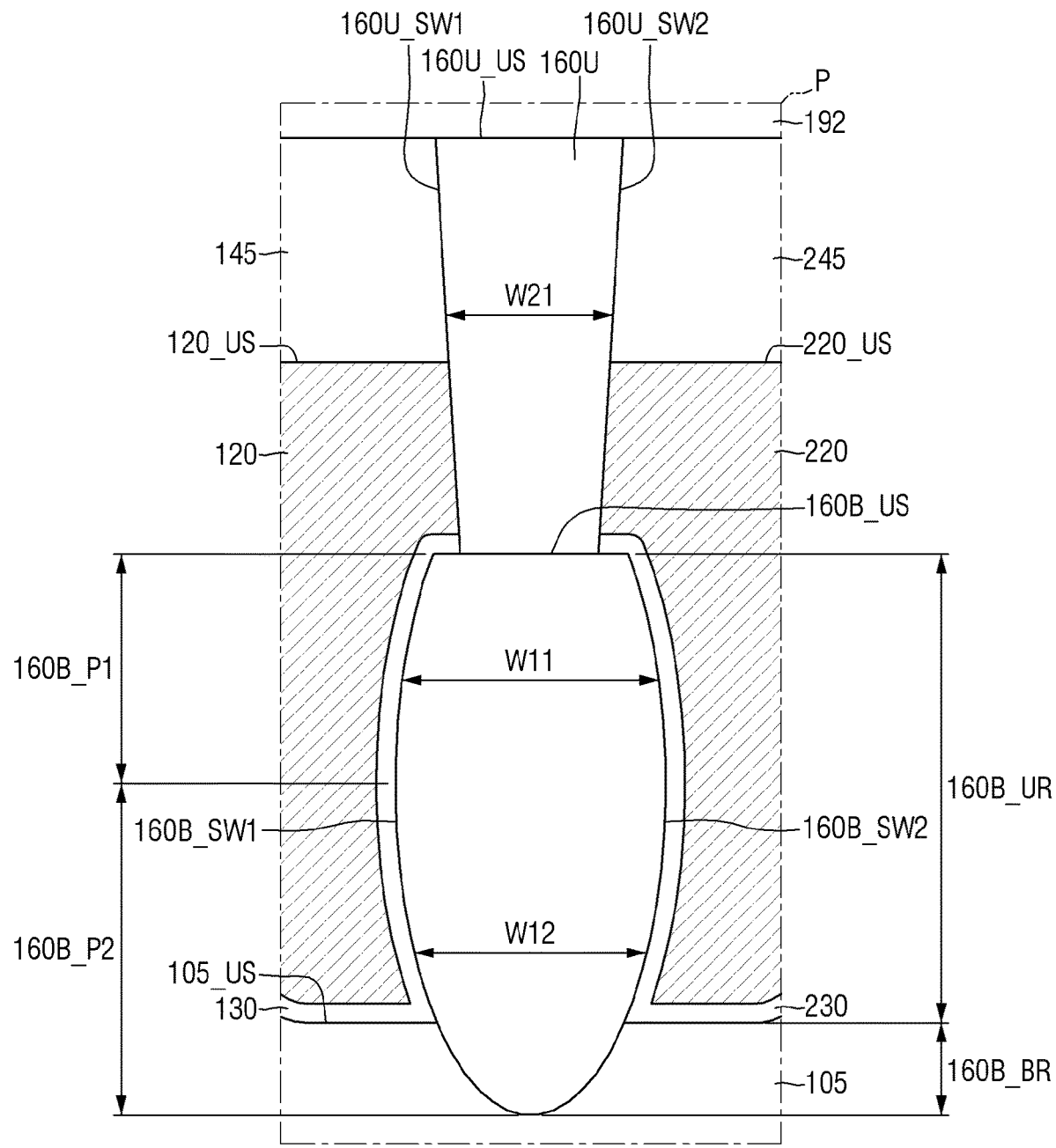

Referring to FIG. 14, in the semiconductor device according to some embodiments, the width of the upper surface 160B_US of the lower isolation pattern 160B in the second direction Y1 may be greater than that of the bottom surface of the upper isolation pattern 160U in the second direction Y1.

The first gate insulating layer 130 and/or the second gate insulating layer 230 may extend along a portion of the upper surface 160B_US of the lower isolation pattern 160B.

Figure 15:
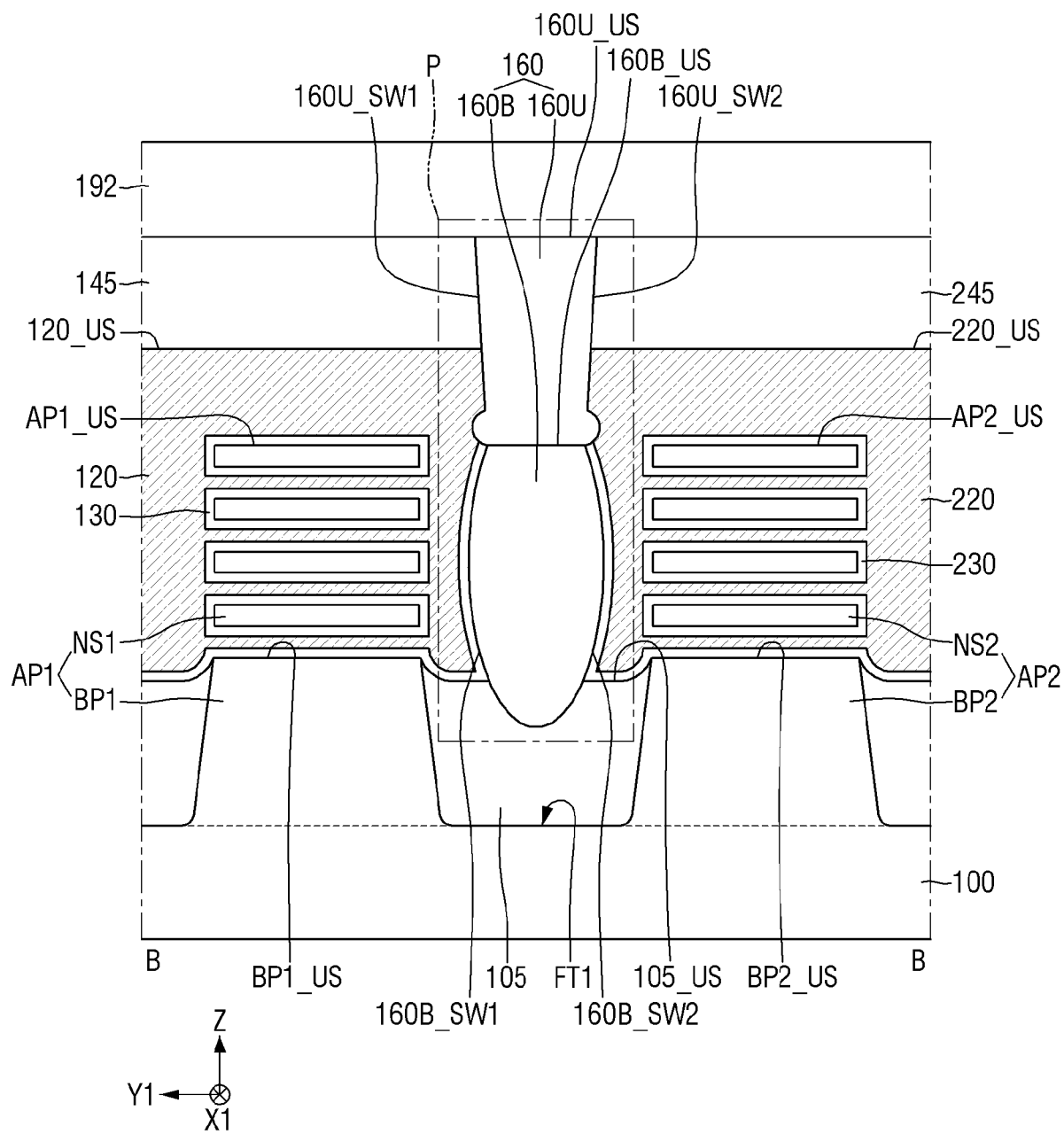
FIGS. 15 and 16 are views illustrating a semiconductor device according to embodiments.
Figure 16:
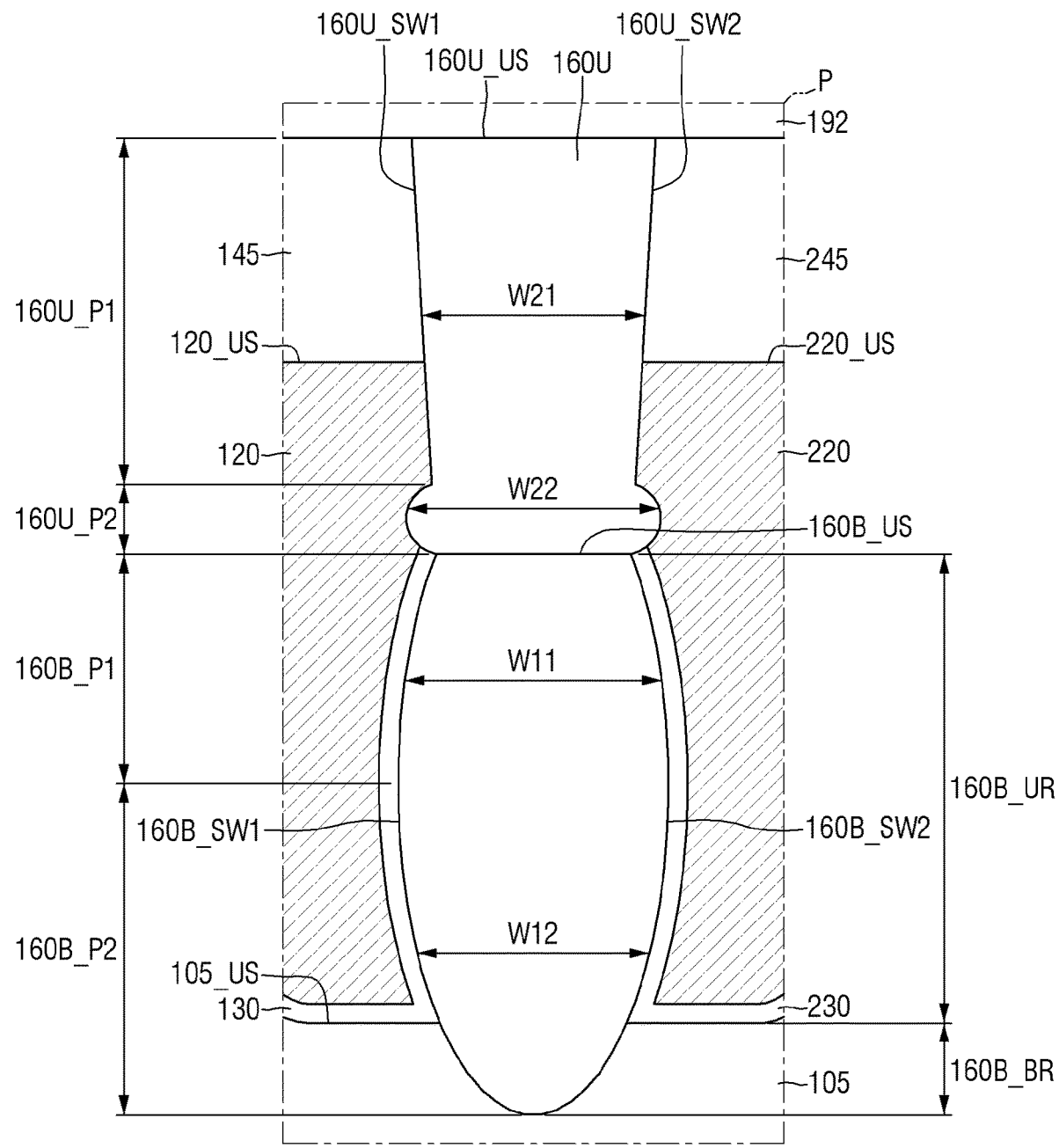

FIGS. 15 and 16 are views illustrating a semiconductor device according to embodiments. For convenience of description, the following description will be based on a difference from the description made with reference to FIGS. 1 to 7.

Referring to FIGS. 15 and 16, in the semiconductor device according to embodiments, the upper isolation pattern 160U may include a first portion 160U_P1 and a second portion 160U_P2. The second portion 160U_P2 of the upper isolation pattern 160U is disposed below the first portion 160U_P1 of the upper isolation pattern 160U.

In the first portion 160U_P1 of the upper isolation pattern 160U, a width W21 of the upper isolation pattern 160U in the second direction Y1 may increase in an upward direction from the lower isolation pattern 160B. In the second portion 160U_P2 of the upper isolation pattern 160U, a width W22 of the upper isolation pattern 160U in the second direction Y1 may increase and then decrease in the upward direction from the lower isolation pattern 160B.

The second portion 160U_P2 of the upper isolation pattern 160U may be disposed above the upper surface 160B_US of the lower isolation pattern 160B and below the level of the upper surface 120_US of the first gate electrode 120 and the level of the upper surface 220_US of the second gate electrode 220. The second portion 160U_P2 of the upper isolation pattern 160U does not include a portion protruding above the level of the upper surface 120_US of the first gate electrode 120 and the level of the upper surface 220_US of the second gate electrode 220.

FIGS. 17 to 20 are views illustrating a semiconductor device according to embodiments. For convenience of description, the following description will be based on a difference from the description made with reference to FIGS. 1 to 7.

Figure 17:
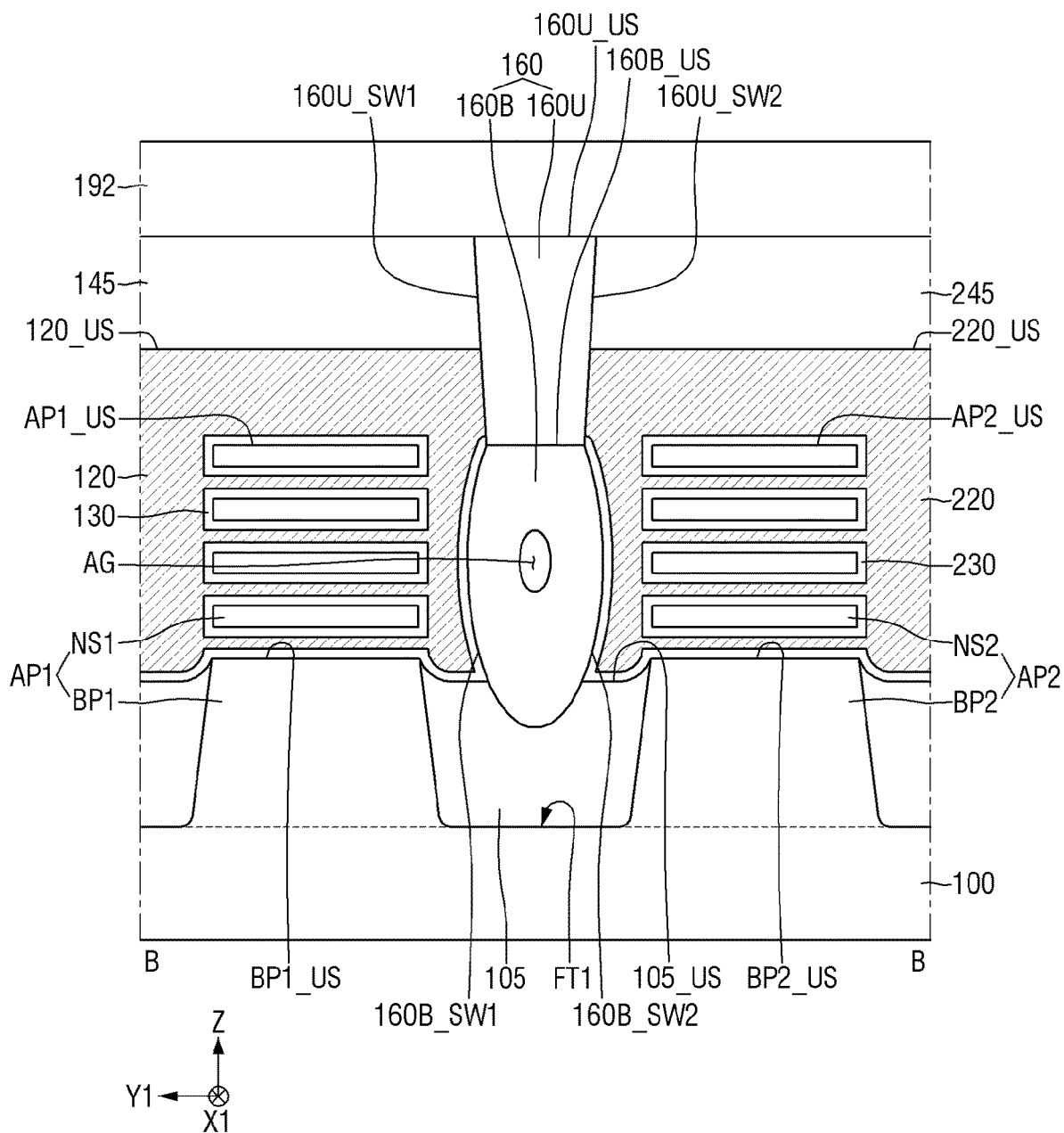
FIGS. 17 to 20 are views illustrating a semiconductor device according to embodiments.

Referring to FIG. 17, in the semiconductor device according to embodiments, the first gate isolation structure 160 may include an air gap AG.

The air gap AG may be disposed in the lower isolation pattern 160B. The lower isolation pattern 160B may include an air gap AG.

Figure 18:
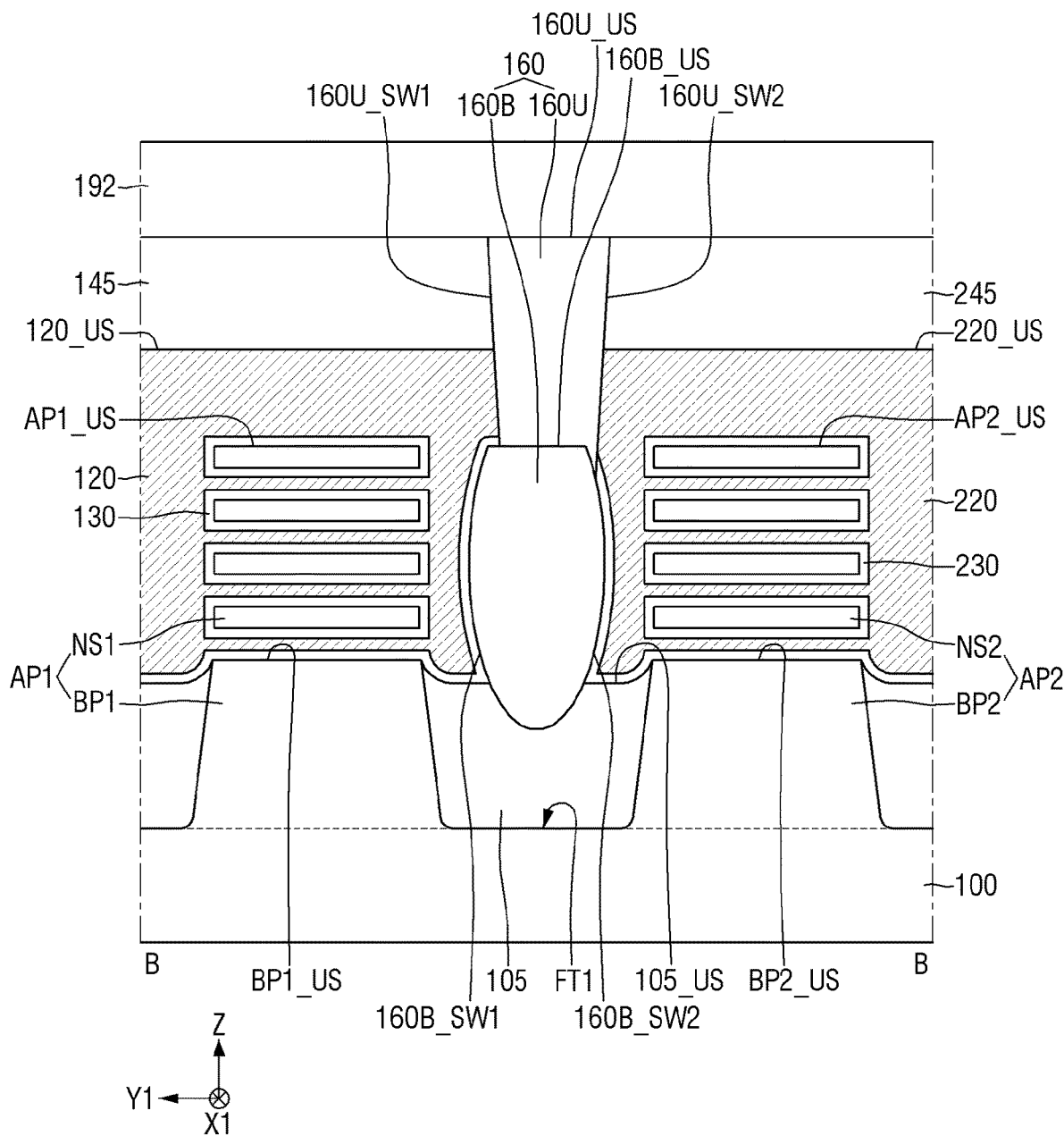

Referring to FIG. 18, in the semiconductor device according to embodiments, the upper isolation pattern 160U and the lower isolation pattern 160B may be mis-aligned in a vertical direction.

The upper isolation pattern 160U may be disposed on a portion of the second sidewall 160B_SW2 of the lower isolation pattern 160B. However, the upper isolation pattern 160U may not be disposed on the first sidewall 160B_SW1 of the lower isolation pattern 160B.

Figure 19:
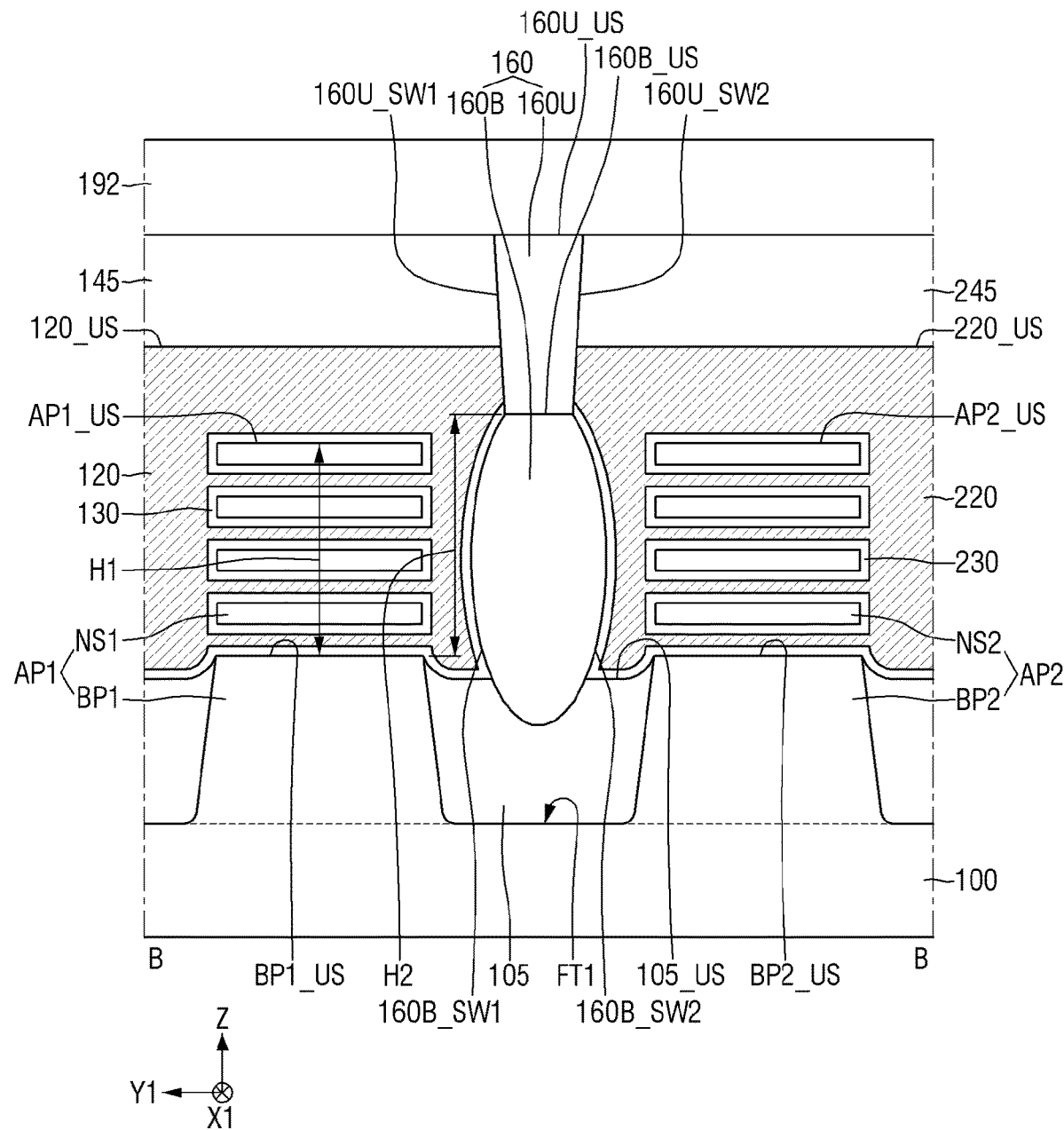
Figure 20:
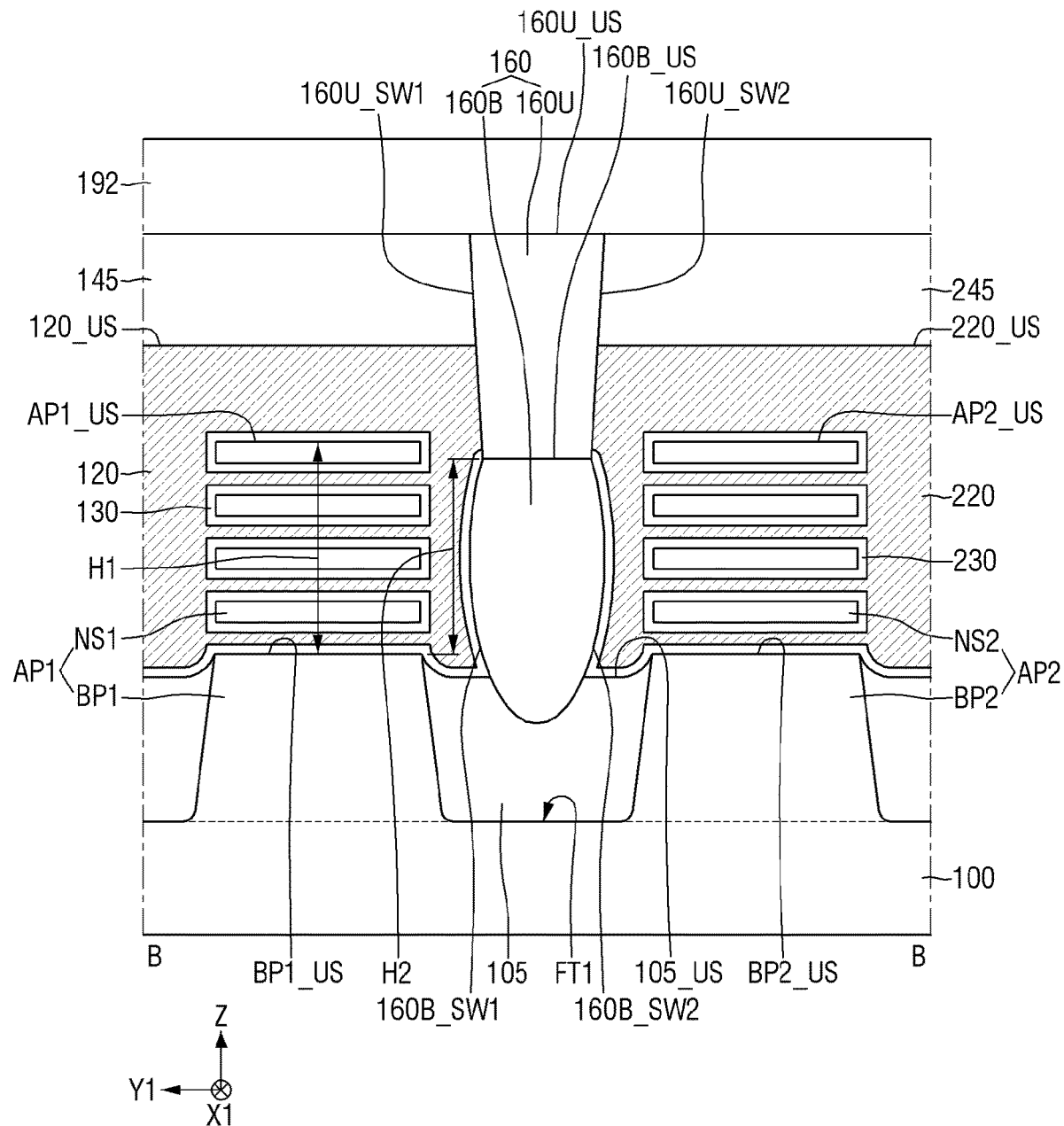

Referring to FIGS. 19 and 20, in the semiconductor device according to embodiments, a height H1 from the upper surface BP1_US of the first lower pattern BP1 to the upper surface AP1_US of the first active pattern AP1 is different from a height H2 from the upper surface BP1_US of the first lower pattern BP1 to the level of the upper surface 160B_US of the lower isolation pattern 160B.

In FIG. 19, the height H1 from the upper surface BP1_US of the first lower pattern BP1 to the upper surface AP1_US of the first active pattern AP1 is smaller than the height H2 from the upper surface BP1_US of the first lower pattern BP1 to the level of the upper surface 160B_US of the lower isolation pattern 160B.

In FIG. 20, the height H1 from the upper surface BP1_US of the first lower pattern BP1 to the upper surface AP1_US of the first active pattern AP1 is greater than the height H2 from the upper surface BP1_US of the first lower pattern BP1 to the level of the upper surface 160B_US of the lower isolation pattern 160B.

Figure 21:
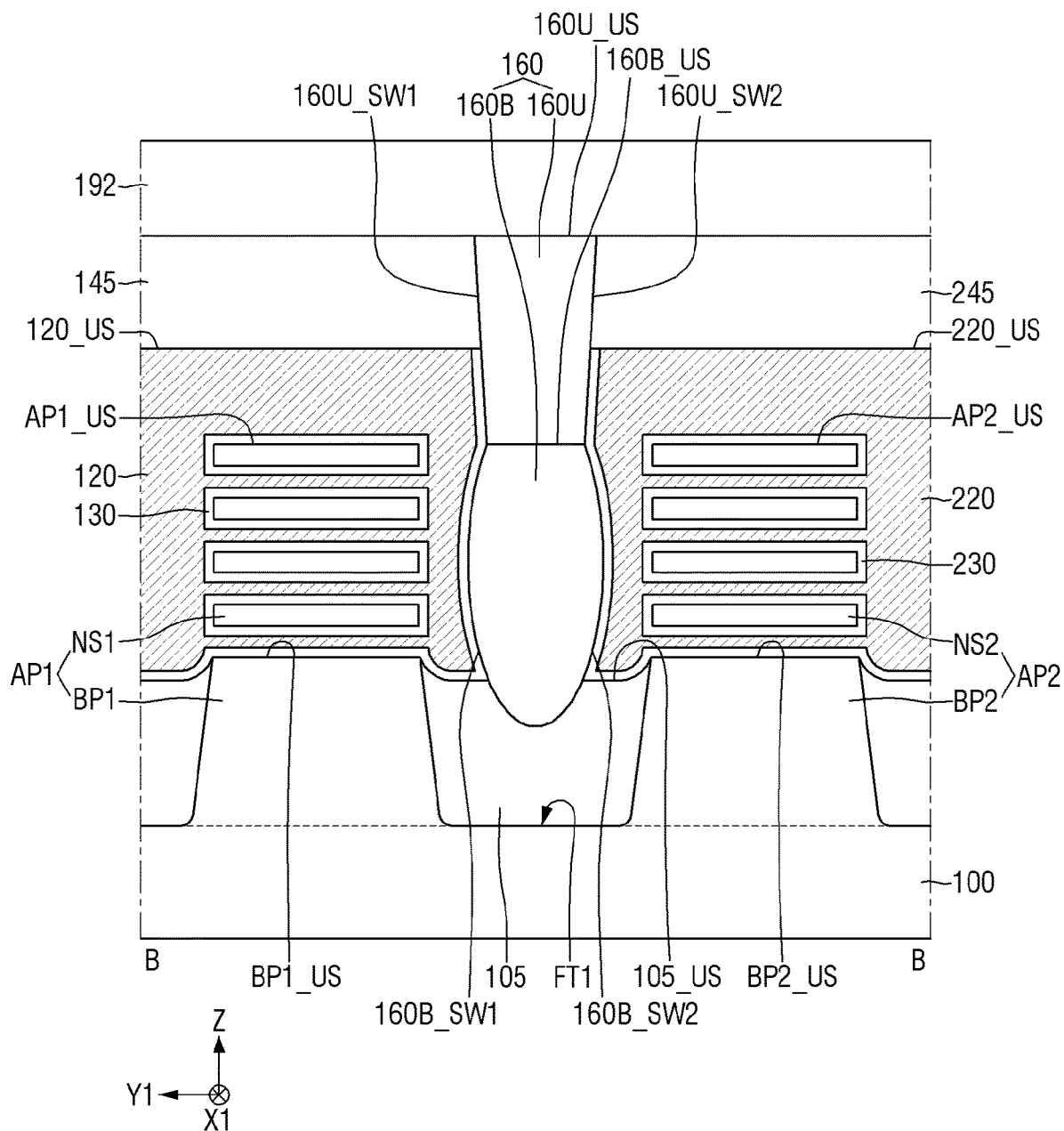
FIGS. 21 and 22 are views illustrating a semiconductor device according to embodiments.
Figure 22:
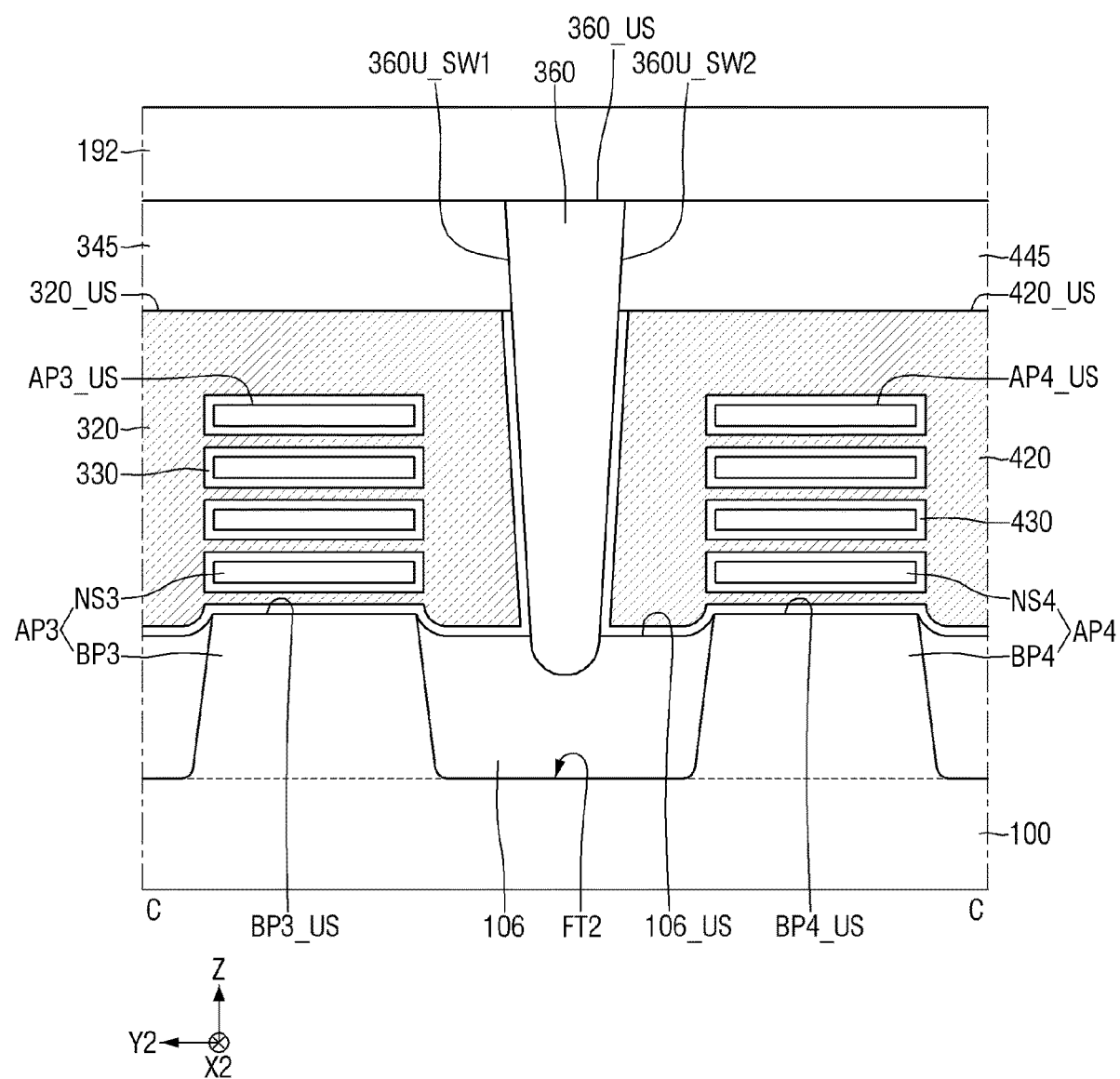

FIGS. 21 and 22 are views illustrating a semiconductor device according to embodiments. For convenience of description, the following description will be based on a difference from the description made with reference to FIGS. 1 to 7.

Referring to FIGS. 21 and 22, in the semiconductor device according to embodiments, the first gate insulating layer 130 may extend along the first sidewall 160B_SW1 of the lower isolation pattern 160B and a portion of the first sidewall 160U_SW1 of the upper isolation pattern 160U.

The second gate insulating layer 230 may extend along the second sidewall 160B_SW2 of the lower isolation pattern 160 and a portion of the second sidewall 160U_SW2 of the upper isolation pattern 160UB.

The first gate insulating layer 130 is not disposed between the first gate capping pattern 145 and the upper isolation pattern 160U. The second gate insulating layer 230 is not disposed between the second gate capping pattern 245 and the upper isolation pattern 160U.

The third gate insulating layer 330 may extend along the first sidewall 360_SW1 of the second gate isolation structure 360. The fourth gate insulating layer 430 may extend along the second sidewall 360_SW2 of the second gate isolation structure 360.

The third gate insulating layer 330 is not disposed between the third gate capping pattern 345 and the upper isolation pattern 160U. The fourth gate insulating layer 430 is not disposed between the fourth gate capping pattern 445 and the upper isolation pattern 160U.

Figure 23:
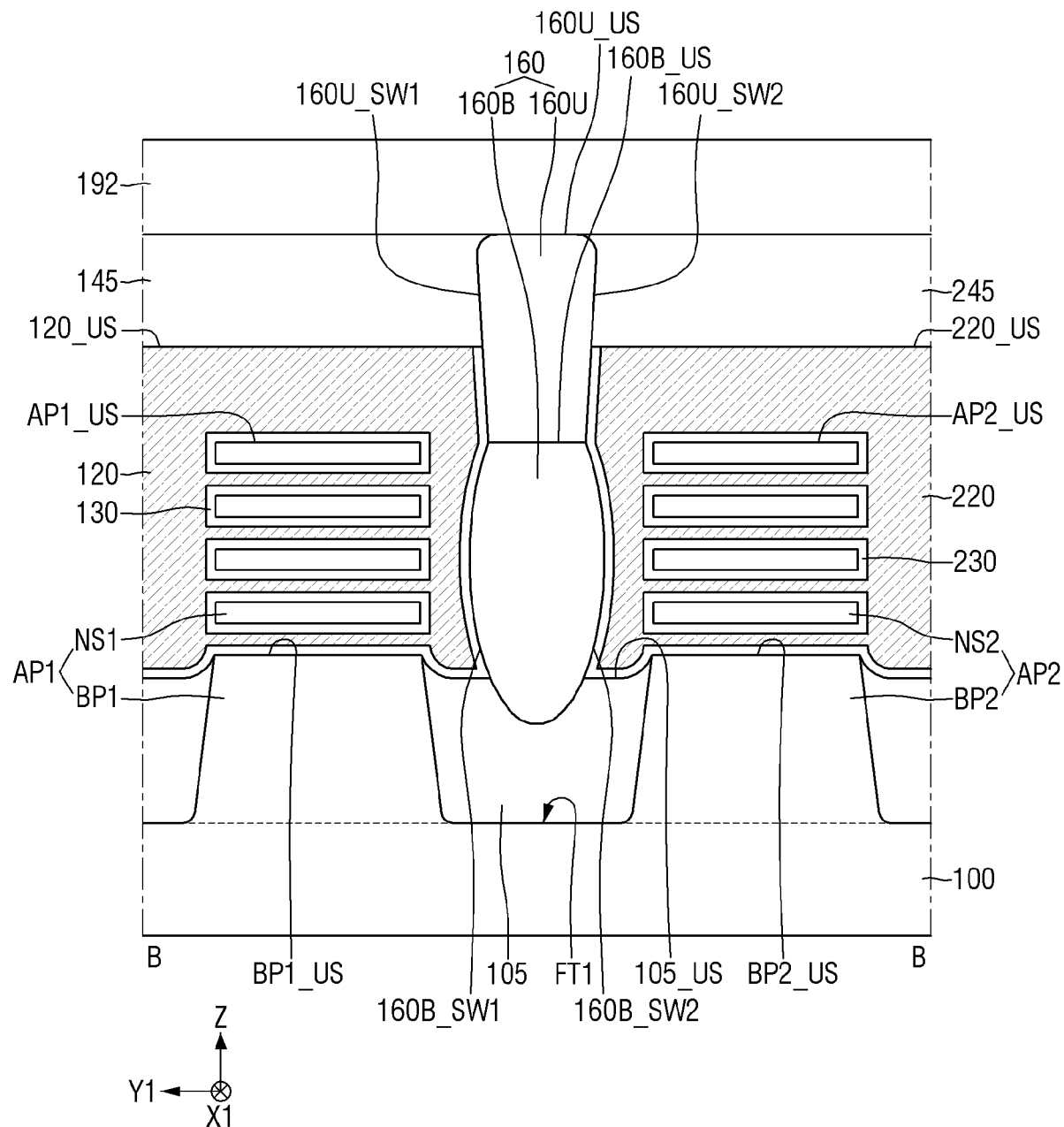
FIG. 23 is a view illustrating a semiconductor device according to embodiments.

FIG. 23 is a view illustrating a semiconductor device according to embodiments. For convenience of description, the following description will be based on a difference from the description made with reference to FIGS. 21 and 22.

Referring to FIG. 23, in the semiconductor device according to embodiments, the upper surface 160U_US of the upper isolation pattern 160U may include a convex curved surface.

A portion of the upper surface 160U_US of the upper isolation pattern 160U may be covered by the first gate capping pattern 145 and the second gate capping pattern 245.

Although not shown, the upper surface (360_US of FIG. 6) of the second gate isolation structure 360 may also include a convex curved edge like the upper surface 160U_US of the upper isolation pattern 160U.

Figure 24:
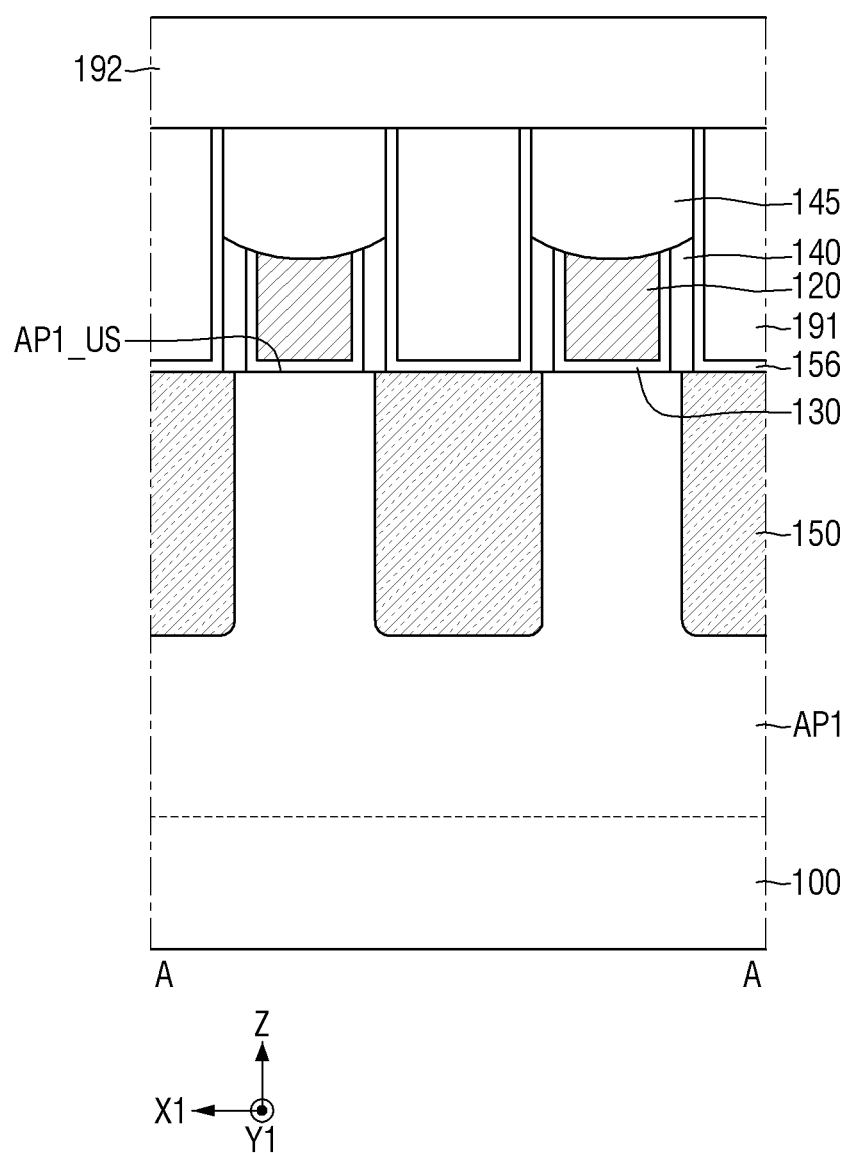
FIGS. 24 and 25 are views illustrating a semiconductor device according to embodiments.
Figure 25:
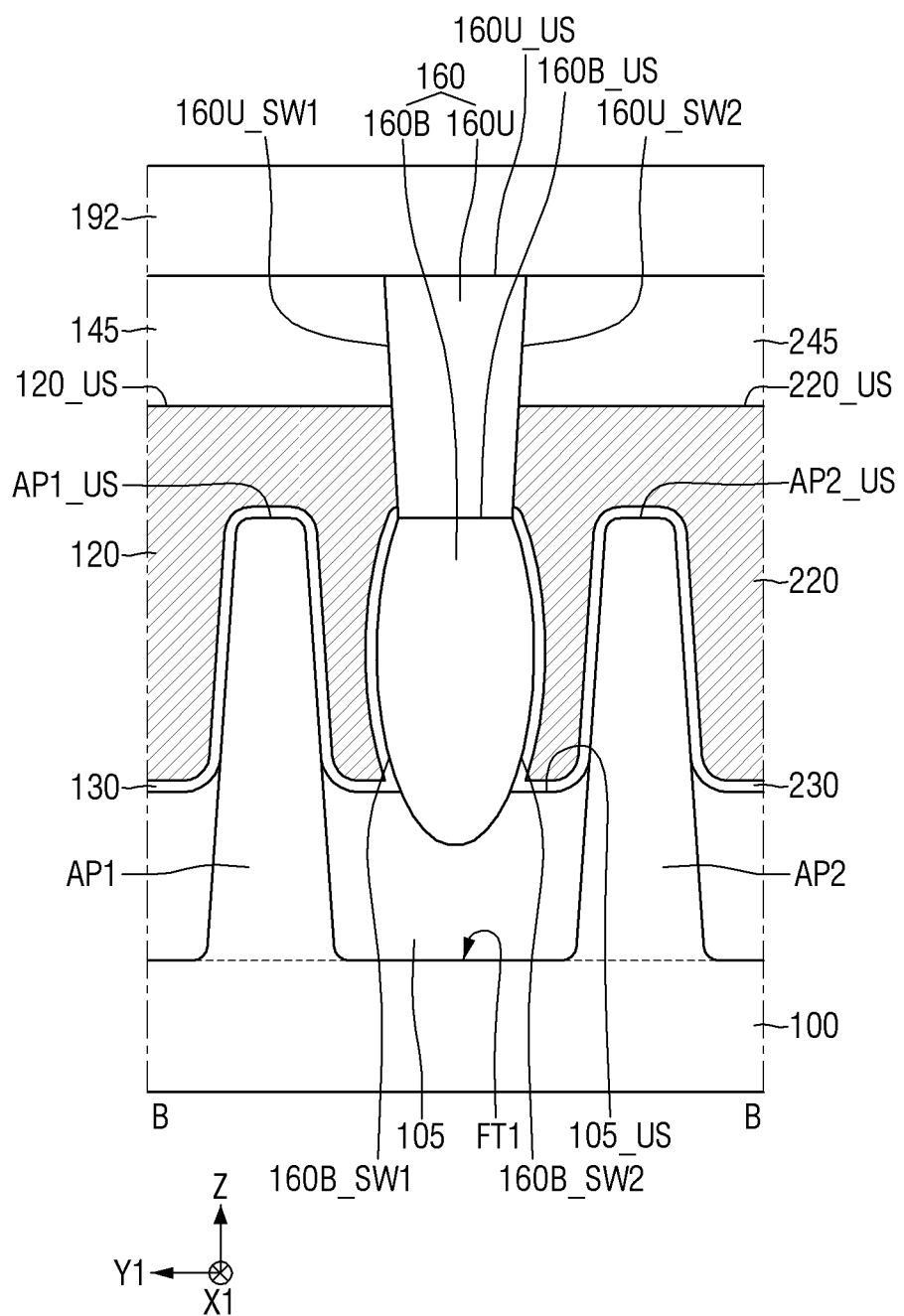

FIGS. 24 and 25 are views illustrating a semiconductor device according to embodiments. For convenience of description, the following description will be based on a difference from the description made with reference to FIGS. 1 to 7.

Referring to FIGS. 24 and 25, in the semiconductor device according to embodiments, each of the first active pattern AP1 and the second active pattern AP2 may be a fin-type pattern protruded above the upper surface 105_US of the first field insulating layer 105.

The fin-type pattern protruded above the upper surface 105_US of the first field insulating layer 105 may be used as a channel region of a transistor.

Although not shown, as an example, a deep trench deeper than the first fin trench FT1 may be disposed between the first active pattern AP1 and the second active pattern AP2. As another example, a dummy fin-type pattern may be disposed between the first active pattern AP1 and the second active pattern AP2. A height of the dummy fin-type pattern is lower than the height of the first active pattern AP1 and the height of the second active pattern AP2. The first field insulating layer 105 may be disposed on an upper surface of the dummy fin-type pattern.

According to an embodiment, the third active pattern AP3 and the fourth active pattern AP4, which are disposed in the second region II, may be active patterns that include a nanosheet or a nanowire, as shown in FIG. 4. According to an embodiment, the third active pattern AP3 and the fourth active pattern AP4, which are disposed in the second region, may be fin-type patterns like the first active pattern AP1 and the second active pattern AP2.

Figure 26:
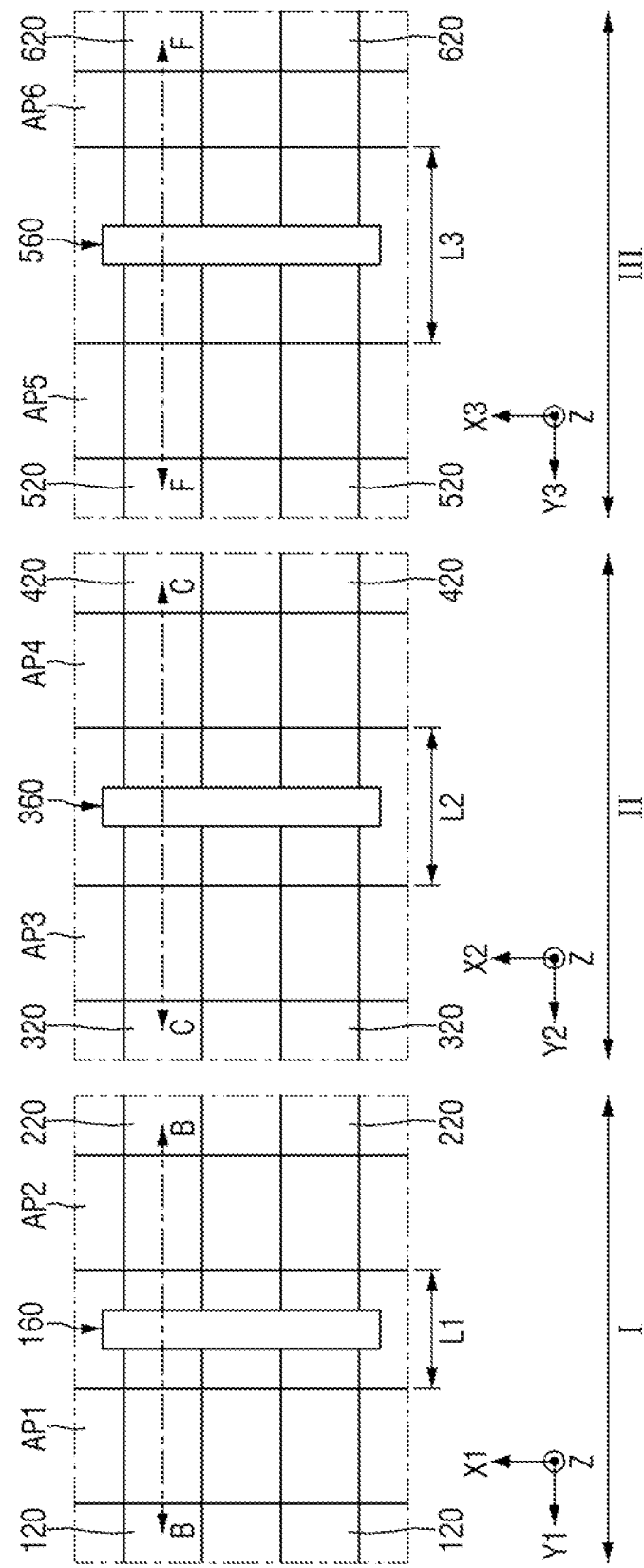
FIG. 26 is a layout view illustrating a semiconductor device according to embodiments.
Figure 27:
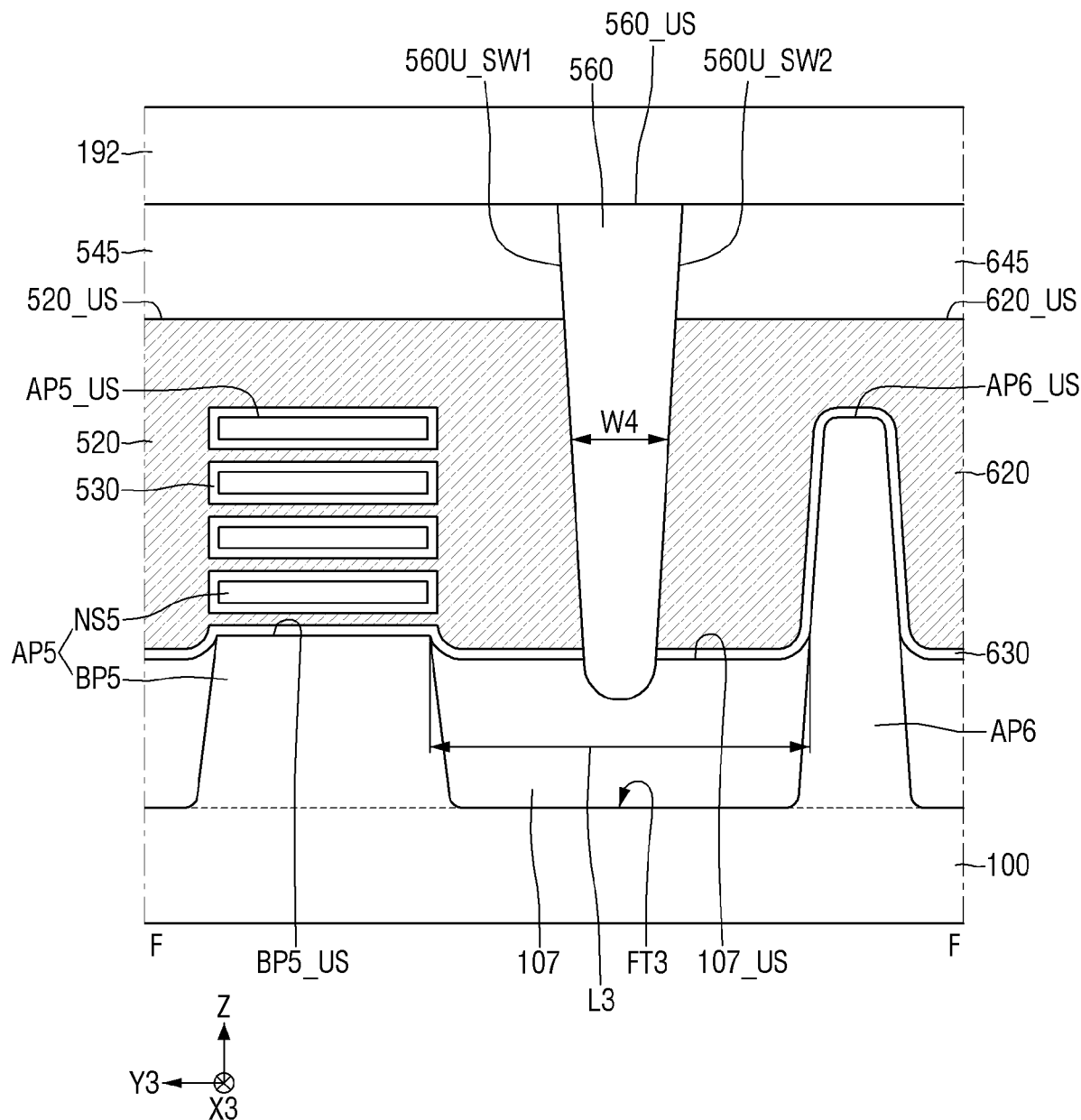
FIG. 27 is a cross-sectional view taken along line F-F of FIG. 26.

FIG. 26 is a layout view illustrating a semiconductor device according to embodiments. FIG. 27 is a cross-sectional view taken along line F-F of FIG. 26.

For reference, the cross-sectional view taken along lines B-B and C-C of FIG. 26 may substantially be the same as one of FIGS. 3, 4, 7 to 23 and 25. Further, the description of the first region I and the second region II in FIG. 26 may substantially be the same as that made with reference to FIGS. 1 to 25. Therefore, the following description will be based on the third region III of FIG. 26.

Referring to FIGS. 26 and 27, the semiconductor device according to embodiments may include first to sixth active patterns AP1, AP2, AP3, AP4, AP5 and AP6, first to sixth gate electrodes 120, 220, 320, 420, 520 and 620, a first gate isolation structure 160, a second gate isolation structure 360, and a third gate isolation structure 560.

The substrate 100 may include a first region I, a second region II, and a third region III. The first active pattern AP1, the second active pattern AP2, the first gate electrode 120, the second gate electrode 220 and the first gate isolation structure 160 may be disposed in the first region I. The third active pattern AP3, the fourth active pattern AP4, the third gate electrode 320, the fourth gate electrode 420 and the second gate isolation structure 360 may be disposed in the second region II. The fifth active pattern AP5, the sixth active pattern AP6, the fifth gate electrode 520, the sixth gate electrode 620 and the third gate isolation structure 560 may be disposed in the third region III.

The fifth active pattern AP5 and the sixth active pattern AP6 may be disposed on the substrate 100. The fifth active pattern AP5 and the sixth active pattern AP6 may be extended long in a sixth direction X3, respectively. The fifth active pattern AP5 and the sixth active pattern AP6 may be spaced apart from each other in a seventh direction Y3. Here, the sixth direction X3 is a direction crossing the seventh direction Y3.

The fifth active pattern AP5 may include a fifth lower pattern BP5 and a plurality of fifth sheet patterns NS5. In the semiconductor device according to embodiments, the fifth active pattern AP5 is an active pattern that includes a nanosheet or a nanowire, and the sixth active pattern AP6 may be a fin-type pattern.

The fifth lower pattern BP5 and the sixth active pattern AP6 may be protruded from the substrate 100, respectively. The fifth lower pattern BP5 and the sixth active pattern AP6 may be extended long in the sixth direction X3, respectively. The fifth lower pattern BP5 and the sixth active pattern AP6 may be spaced apart from each other in the seventh direction Y3. The fifth lower pattern BP5 and the sixth active pattern AP6 may be separated from each other by a third fin trench FT3 extended in the sixth direction X3. The plurality of fifth sheet patterns NS5 may be disposed on the fifth lower pattern BP5. An upper surface AP5_US of the fifth active pattern may be an upper surface of the sheet pattern, which is disposed on the uppermost portion, among the fifth sheet patterns NS5. An upper surface AP6_US of the sixth active pattern may be an upper surface of a fin-type pattern.

Each of the fifth lower pattern BP5, the fifth sheet pattern NS5 and the sixth active pattern AP6 may include at least one of a silicon and germanium, which is an elemental semiconductor material, or at least one of a group IV-IV compound semiconductor and a group III-V compound semiconductor.

According to an embodiment, the fifth active pattern AP5 and the sixth active pattern AP6 may be spaced apart from each other in the seventh direction Y3 by a third interval L3. The third interval L3 is greater than the first interval L1. The third interval L3 may be a distance between the fifth active pattern AP5 and the sixth active pattern AP6 based on an upper surface BP5_US of the fifth lower pattern BP5.

The third field insulating layer 107 may be formed on the substrate 100. The third field insulating layer 107 may fill at least a portion of the third fin trench FT3.

The fifth gate electrode 520 may be disposed on the fifth active pattern AP5. The fifth gate electrode 520 may extend in the seventh direction Y3 to cross the fifth active pattern AP5. The fifth gate electrode 520 may cross the fifth lower pattern BP5. The fifth gate electrode 520 may surround each fifth sheet pattern NS5.

The sixth gate electrode 620 may be disposed on the sixth active pattern AP6. The sixth gate electrode 620 may extend in the seventh direction Y3 to cross the sixth active pattern AP6. The sixth gate electrode 620 may be spaced apart from the fifth gate electrode 520 in the seventh direction Y3. The sixth gate electrode 620 may be separated from the fifth gate electrode 520.

Each of the fifth and sixth gate electrodes 520 and 620 may include at least one of a metal, a metal alloy, a conductive metal nitride, a metal silicide, a doped semiconductor material, a conductive metal oxide and a conductive metal oxynitride.

A fifth gate insulating layer 530 may extend along an upper surface 107_US of the third field insulating layer and the upper surface BP5_US of the fifth lower pattern BP5. The fifth gate insulating layer 530 may surround each fifth sheet pattern NS5.

A sixth gate insulating layer 630 may extend along the upper surface 107_US of the third field insulating layer. The sixth gate insulating layer 630 may extend along a profile of the sixth active pattern AP6 protruded above a level of the upper surface 107_US of the third field insulating layer.

Each of the fifth and sixth gate insulating layers 530 and 630 may include silicon oxide, silicon oxynitride, silicon nitride, or a high dielectric constant material having a dielectric constant greater than that of silicon oxide.

A fifth gate capping pattern 545 may be disposed on an upper surface 520_US of the fifth gate electrode 520. A sixth gate capping pattern 645 may be disposed on an upper surface 620_US of the sixth gate electrode 620.

The third gate isolation structure 560 may be disposed on the third field insulating layer 107. The third gate isolation structure 560 may be disposed between the fifth active pattern AP5 and the sixth active pattern AP6. The third gate isolation structure 560 may separate the fifth gate electrode 520 and the sixth gate electrode 620 from each other. The third gate isolation structure 560 may separate the fifth gate capping pattern 545 and the sixth gate capping pattern 645 from each other.

The third gate isolation structure 560 may be extended from the third field insulating layer 107 to the level of the upper surface of the first interlayer insulating layer 191.

Based on the upper surface BP5_US of the fifth lower pattern BP5, an upper surface 560_US of the third gate isolation structure 560 is higher than the upper surface 520_US of the fifth gate electrode 520 and the upper surface 620_US of the sixth gate electrode 620. The third gate isolation structure 560 may include a first sidewall 560_SW1 and a second sidewall 560_SW2, which are opposite to each other in the seventh direction Y3. The first sidewall 560U_SW1 of the third gate isolation structure 560 faces the fifth gate electrode 520. The second sidewall 560U_SW2 of the third gate isolation structure 560 faces the sixth gate electrode 620.

A width W4 of the third gate isolation structure 560 in the seventh direction Y3 increases in an upward direction from the third field insulating layer 107.

The third gate isolation structure 560 is formed at the same step as that of the second gate isolation structure 360.

FIGS. 28 to 47 are views illustrating intermediate steps to describe a method of manufacturing a semiconductor device according to embodiments. For example, FIG. 29 is a cross-sectional view taken along line B-B of FIG. 28, and FIG. 30 is a cross-sectional view taken along line C-C of FIG. 28.

Figure 28:
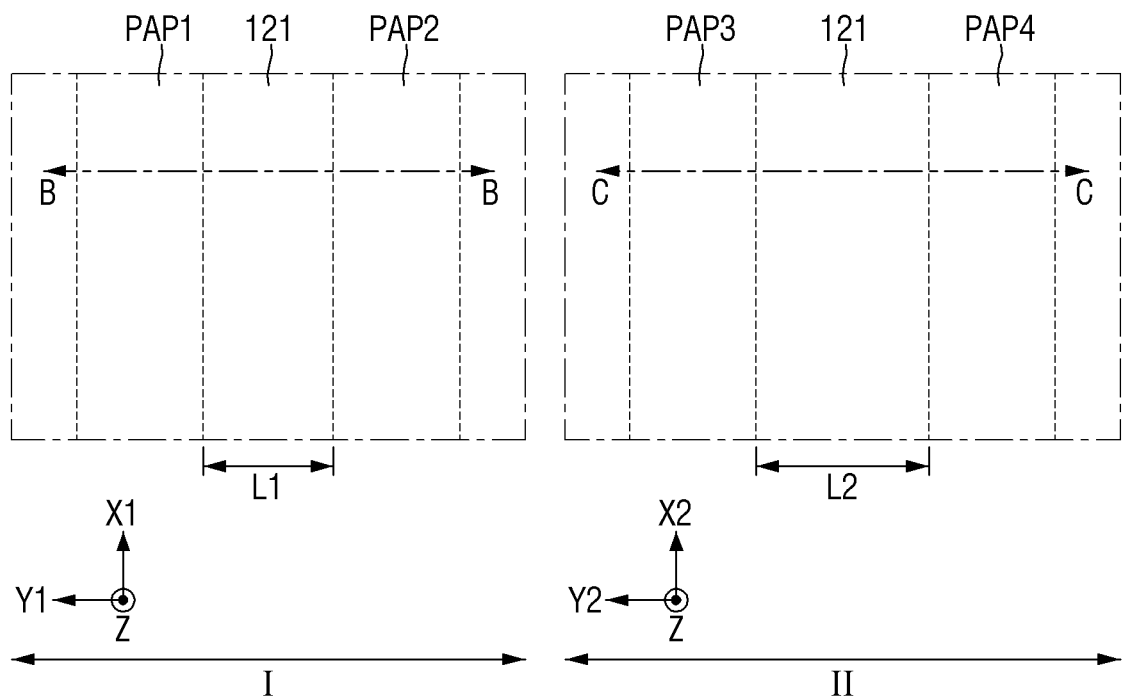
FIGS. 28 to 47 are views illustrating intermediate steps to describe a method of manufacturing a semiconductor device according to embodiments.
Figure 29:
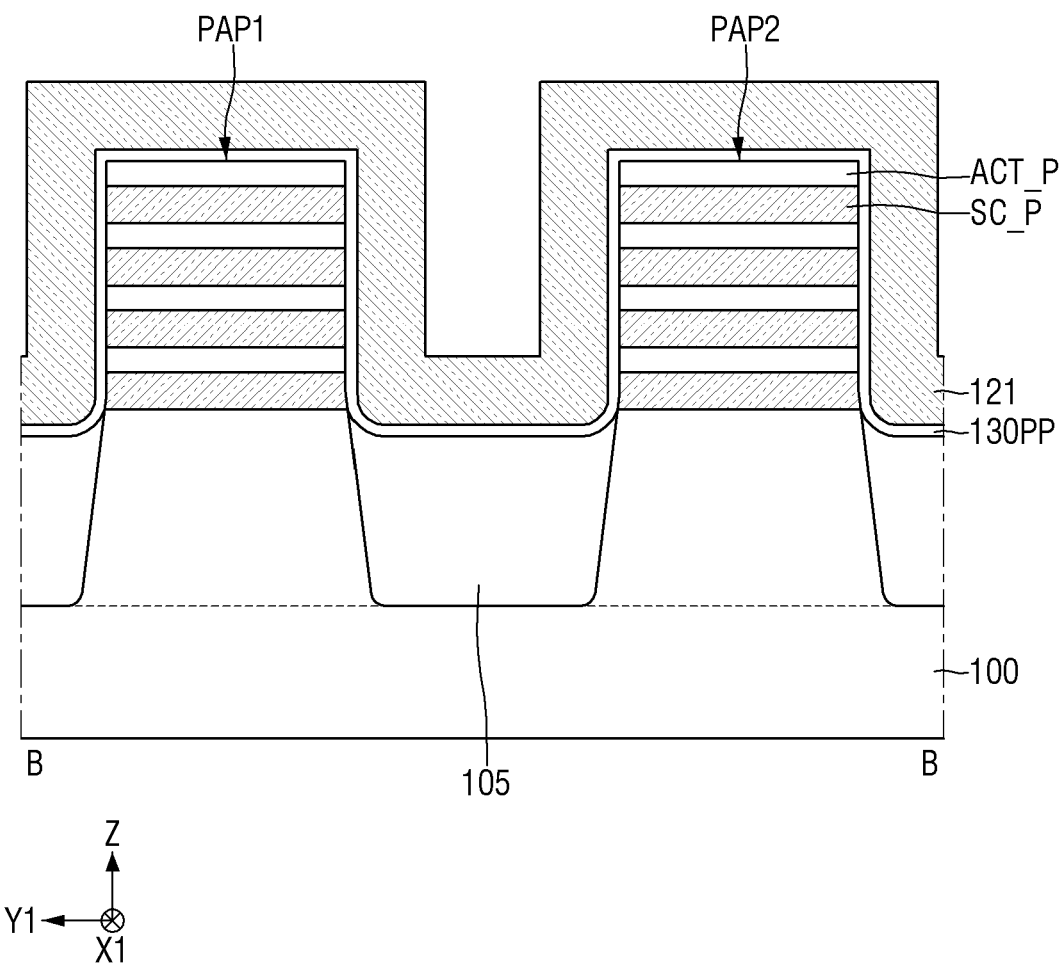
Figure 30:
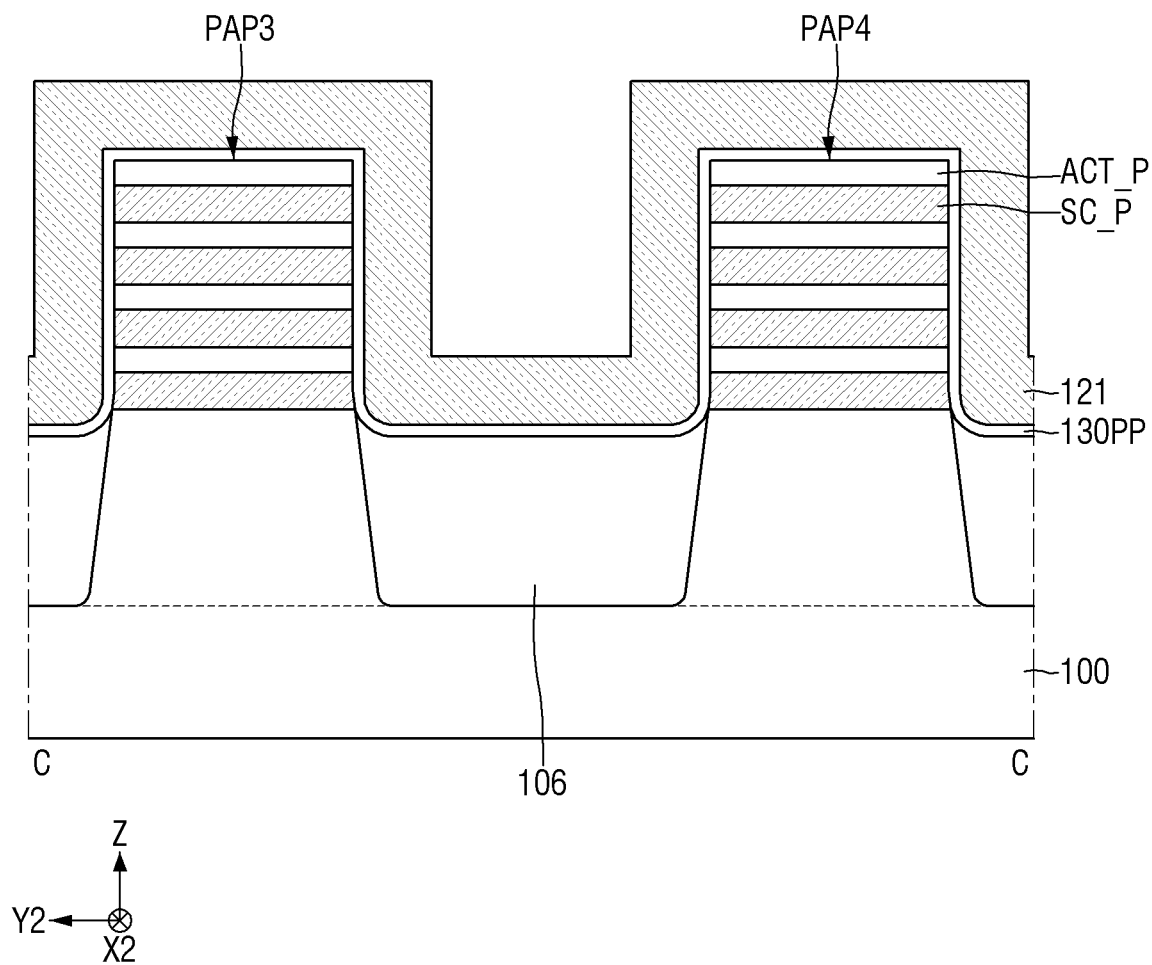

Referring to FIGS. 28 to 30, a first pre-active pattern PAP1 and a second pre-active pattern PAP2, which extend in the first direction X1, are formed in a first region I of a substrate 100. The first pre-active pattern PAP1 and the second pre-active pattern PAP2 may be spaced apart from each other in the second direction Y1.

The first pre-active pattern PAP1 and the second pre-active pattern PAP2 may be spaced apart from each other in the second direction Y1 by a first interval L1.

A third pre-active pattern PAP3 and a fourth pre-active pattern PAP4, which extend in the third direction X2, are formed in a second region II of the substrate 100. The third pre-active pattern PAP3 and the fourth pre-active pattern PAP4 may be spaced apart from each other in the fourth direction Y4.

The third pre-active pattern PAP3 and the fourth pre-active pattern PAP4 may be spaced apart from each other in the fourth direction Y4 by a second interval L2.

The first to fourth pre-active patterns PAP1, PAP2, PAP3 and PAP4 may include a plurality of sacrificial layers SC_P and a plurality of active layers ACT_P, which are alternately deposited in the fifth direction Z. The active layers ACT_P may become sheet patterns NS1, NS2, NS3 and NS4 through a process.

Subsequently, a first field insulating layer 105 is formed on the substrate 100 between the first pre-active pattern PAP1 and the second pre-active pattern PAP2. A second field insulating layer 106 is formed on the substrate 100 between the third pre-active pattern PAP3 and the fourth pre-active pattern PAP4. A portion of the first pre-active pattern PAP1 and a portion of the second pre-active pattern PAP2 may protrude above a level of an upper surface of the first field insulating layer 105. A portion of the third pre-active pattern PAP3 and a portion of the fourth pre-active pattern PAP4 may protrude above a level of an upper surface of the second field insulating layer 106. For example, the sacrificial layers SC_P and the active layers ACT_P, which are alternately deposited, may protrude above the levels of the upper surfaces of the first field insulating layer 105 and the second field insulating layer 106.

Subsequently, a dummy insulating layer 130PP and a semiconductor liner 121 may sequentially be formed on the first to fourth pre-active patterns PAP1, PAP2, PAP3 and PAP4. The dummy insulating layer 130PP may include, for example, silicon oxide, but is not limited thereto. The semiconductor liner 121 may include, for example, polycrystalline silicon, but is not limited thereto.

The dummy insulating layer 130PP and the semiconductor liner 121 may be formed along a profile of the portion of the first pre-active pattern PAP1 and a profile of the portion of the second pre-active pattern PAP2, which protrude above the level of the first field insulating layer 105, and the upper surface of the first field insulating layer 105. The dummy insulating layer 130PP and the semiconductor liner 121 may be formed along a profile of the portion of the third pre-active pattern PAP3 and a profile of the portion of the fourth pre-active pattern PAP4, which protrude above the level of the second field insulating layer 106, and the upper surface of the second field insulating layer 106.

Figure 31:
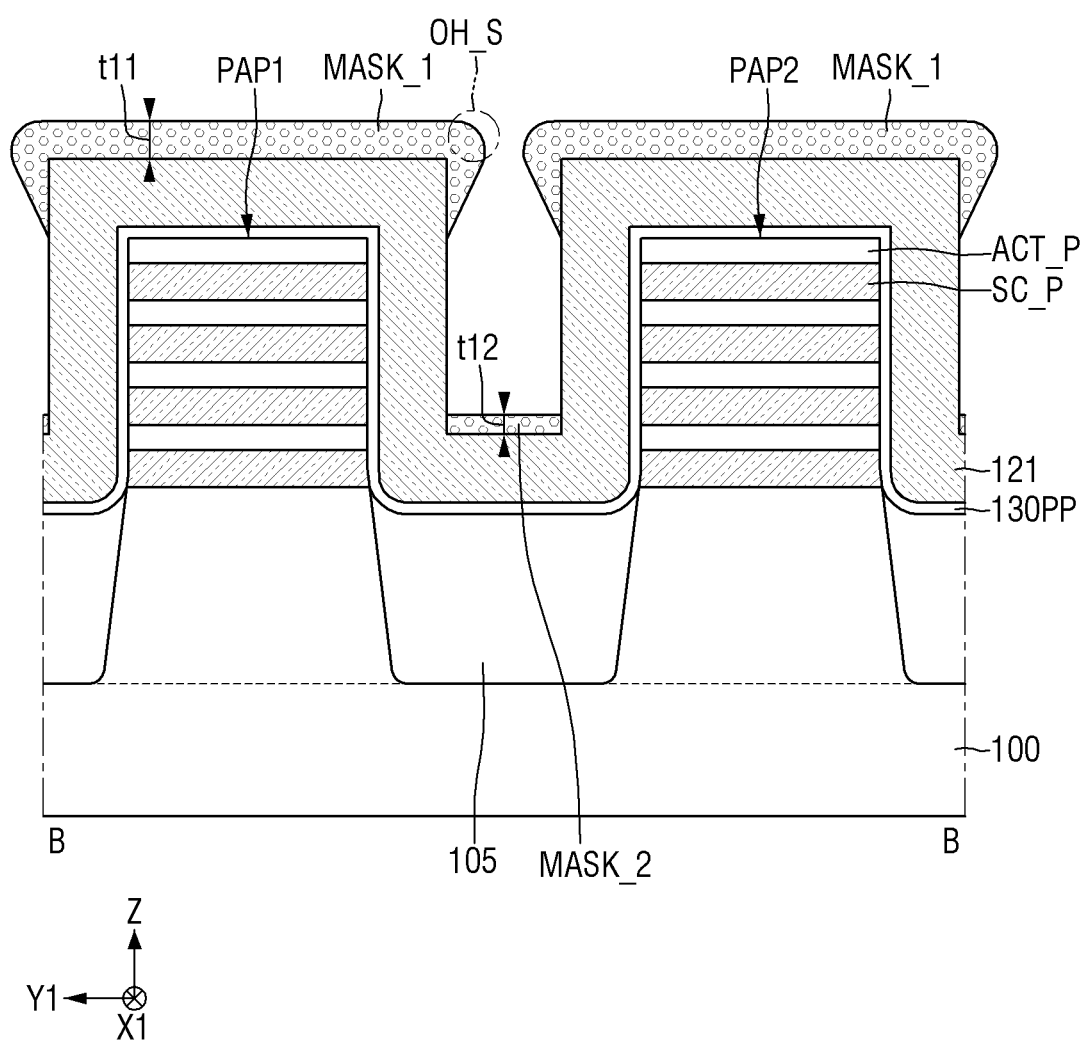
Figure 32:
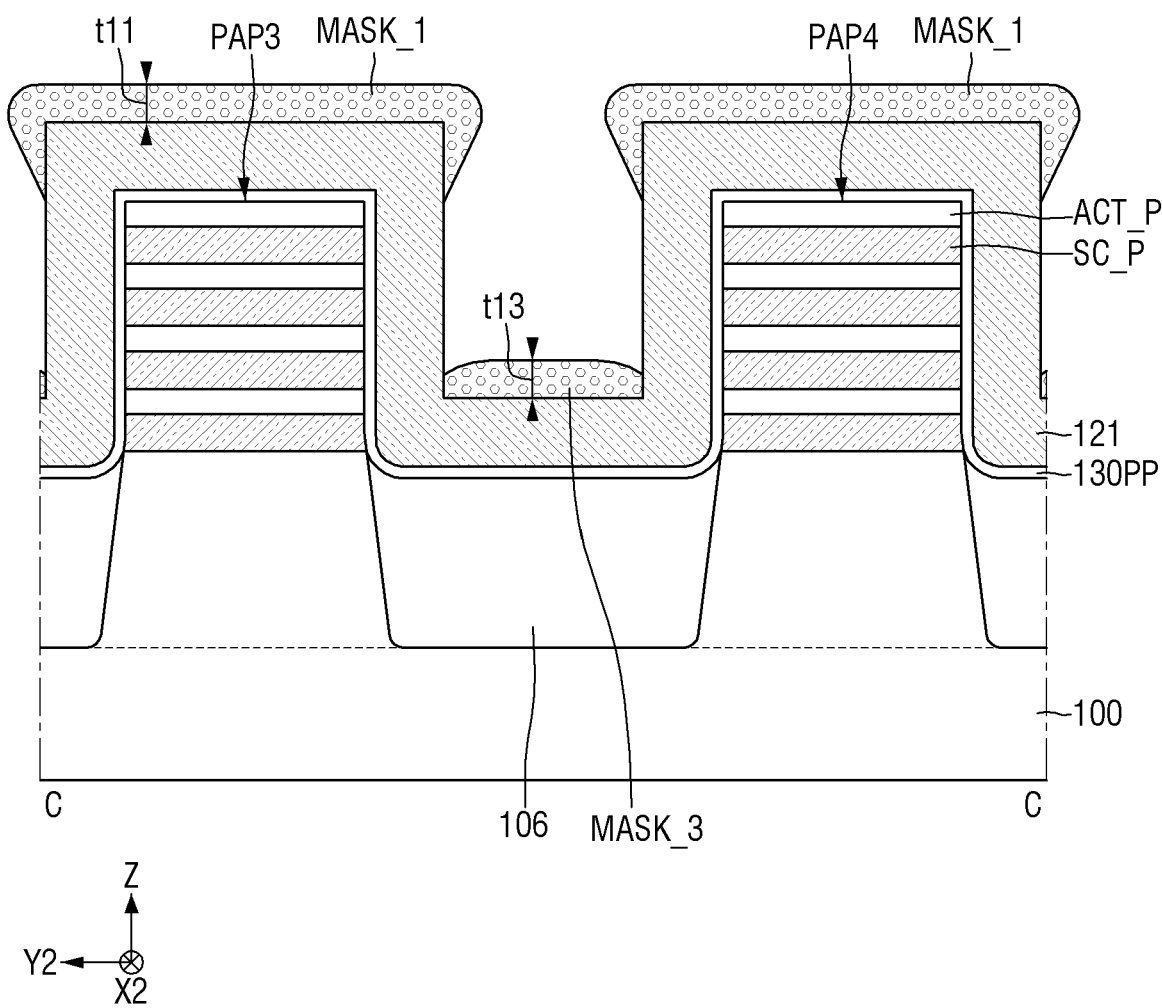

Referring to FIGS. 31 and 32, mask patterns MASK_1, MASK_2 and MASK_3 may be formed on the semiconductor liner 121.

The mask patterns MASK_1, MASK_2 and MASK_3 may include an overhang structure OH_S. For example, the first mask pattern MASK_1 may be formed on upper surfaces of the first to fourth pre-active patterns PAP1, PAP2, PAP3 and PAP4. The first mask pattern MASK_1 may include an overhang structure OH_S. The second mask pattern MASK_2 may be formed on the first field insulating layer 105 between the first pre-active pattern PAP1 and the second pre-active pattern PAP2. The third mask pattern MASK_3 may be formed on the second field insulating layer 106 between the third pre-active pattern PAP3 and the fourth pre-active pattern PAP4.

The mask patterns MASK_1, MASK_2 and MASK_3 may be formed using a deposition method in which step coverage is not good. For example, the mask patterns MASK_1, MASK_2 and MASK_3 may be formed using a Plasma Enhanced Chemical Vapor Deposition (PE-CVD), but is not limited thereto. For example, the mask patterns MASK_1, MASK_2 and MASK_3 may include, but is not limited to, silicon nitride.

The first mask pattern MASK_1 is shown as being separated from the second mask pattern MASK_2, but is not limited thereto. The first mask pattern MASK_1 shown as being separated from the third mask pattern MASK_3, but is not limited thereto.

A thickness t11 of the first mask pattern MASK_1 is greater than a thickness t12 of the second mask pattern MASK_2. The thickness t12 of the second mask pattern MASK_2 is smaller than a thickness t13 of the third mask pattern MASK_3. Since the first interval L1 is smaller than the second interval L2, a thickness difference between the second mask pattern MASK_2 and the third mask pattern MASK_3 may occur due to a loading effect.

Figure 33:
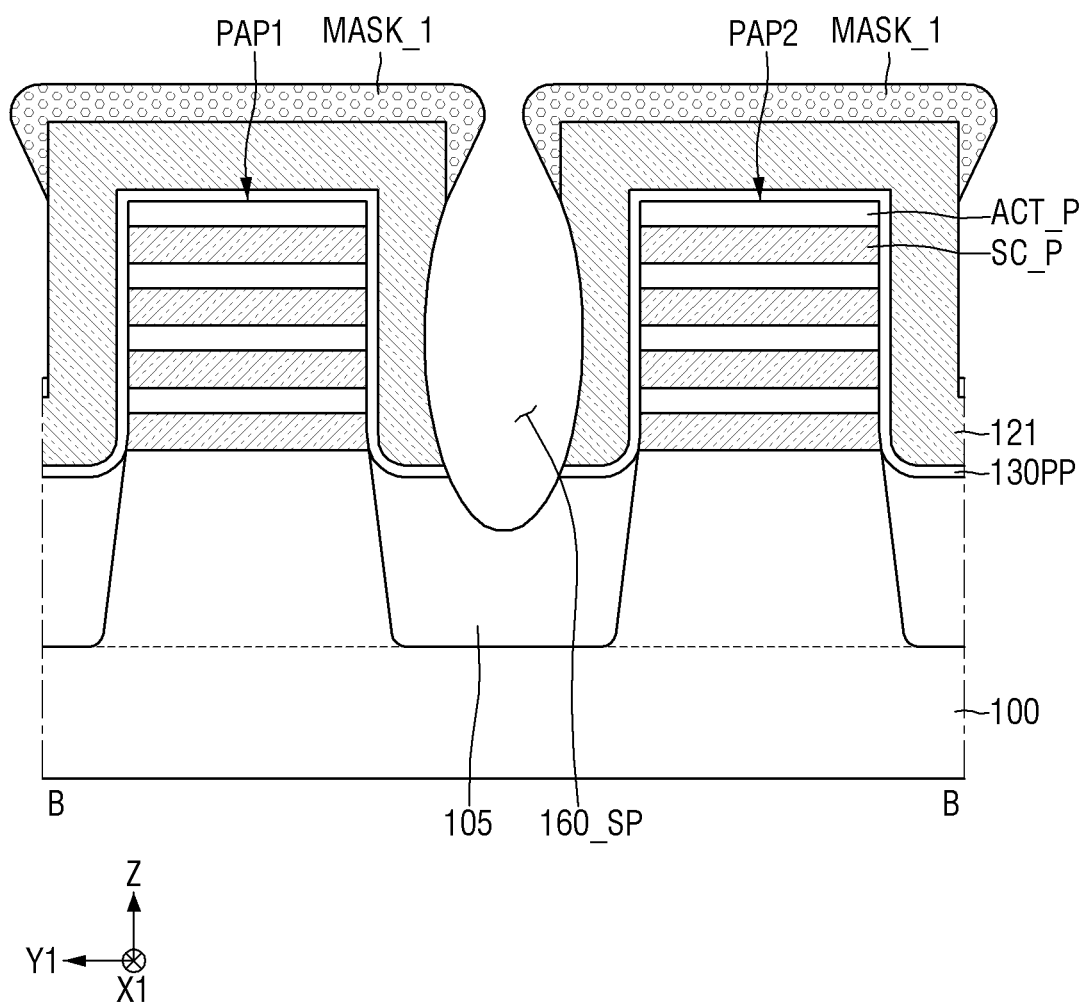

Referring to FIG. 33, the semiconductor liner 121 on the upper surface of the first field insulating layer 105 may be removed using the first mask pattern MASK_1 as a mask. A portion of the first field insulating layer 105 may be removed while the semiconductor liner 121 is being removed.

As a result, a lower isolation space 160_SP may be formed between the first pre-active pattern PAP1 and the second pre-active pattern PAP2.

In more detail, the second mask pattern MASK_2 may be removed using the first mask pattern MASK_1 as a mask. Subsequently, a portion of the semiconductor liner 121, a portion of the dummy insulating layer 130PP and a portion of the first field insulating layer 105 may be removed.

A portion of the semiconductor liner 121 on a sidewall of the first pre-active pattern PAP1 and a sidewall of the second pre-active pattern PAP2 may be removed while the lower isolation space 160_SP is being formed, but the technical spirits of the present disclosure are not limited thereto.

In order to define a region in which the lower isolation space 160_SP is formed, additional mask layer may be formed on the mask patterns MASK_1, MASK_2 and MASK_3, but is not limited thereto.

A portion of the first mask pattern MASK_1 may be removed while the lower isolation space 160_SP is being formed.

Figure 34:
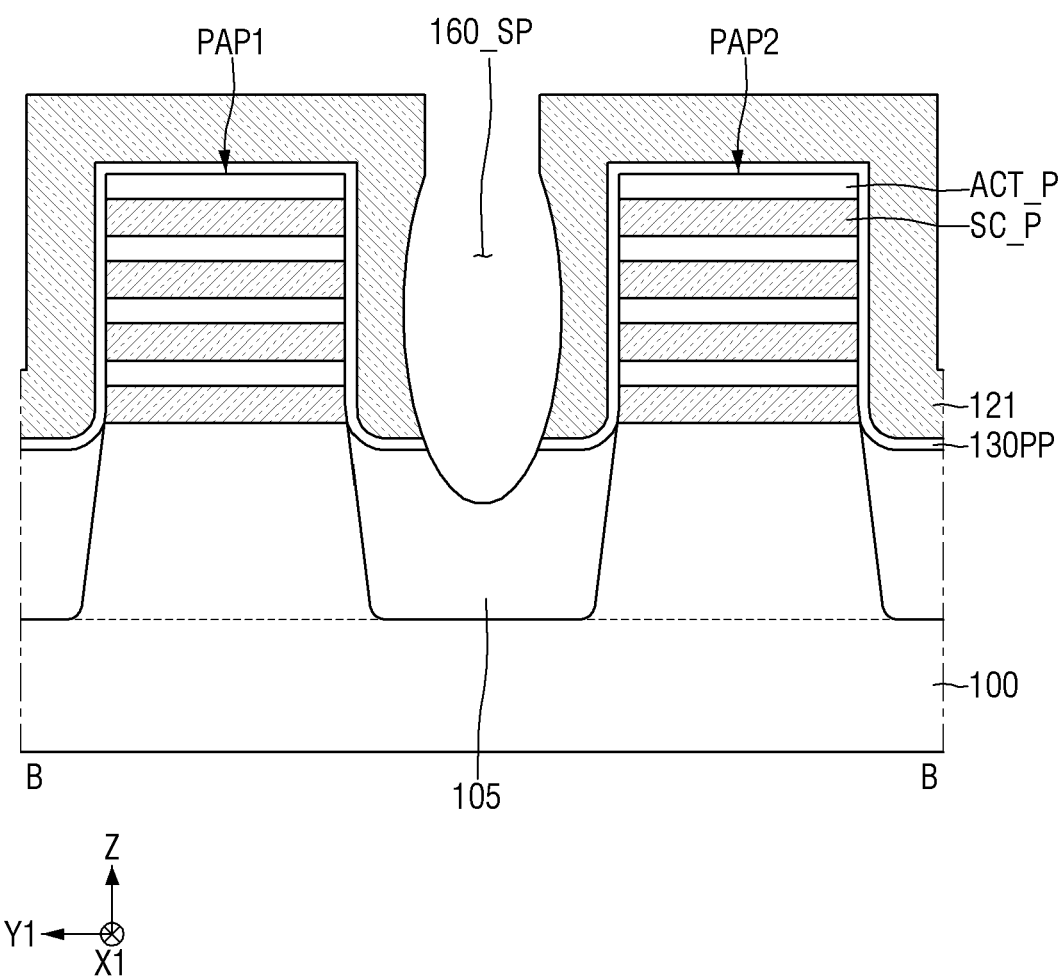

Referring to FIG. 34, after the lower isolation space 160_SP is formed, the mask patterns MASK_1, MASK_2 and MASK_3 may be removed.

Figure 35:
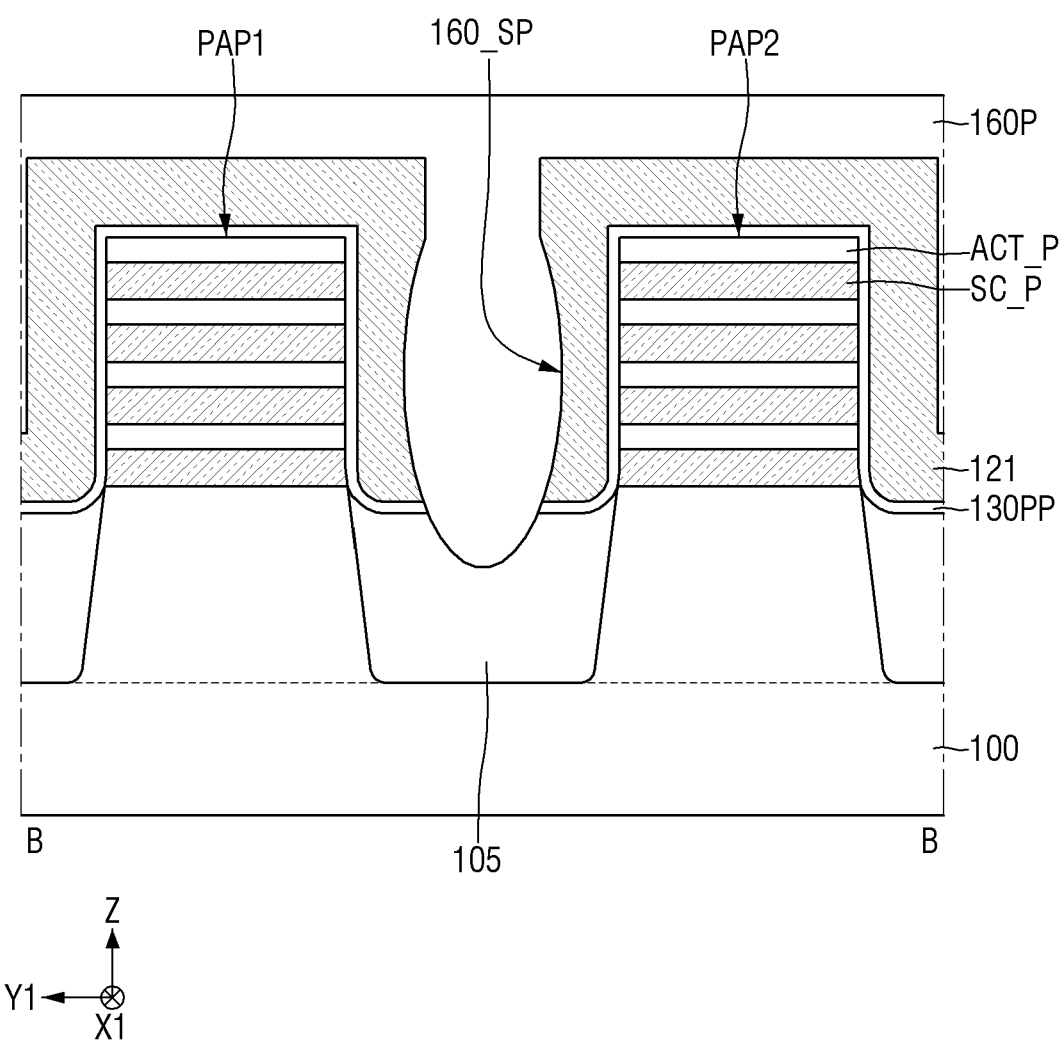
Figure 36:
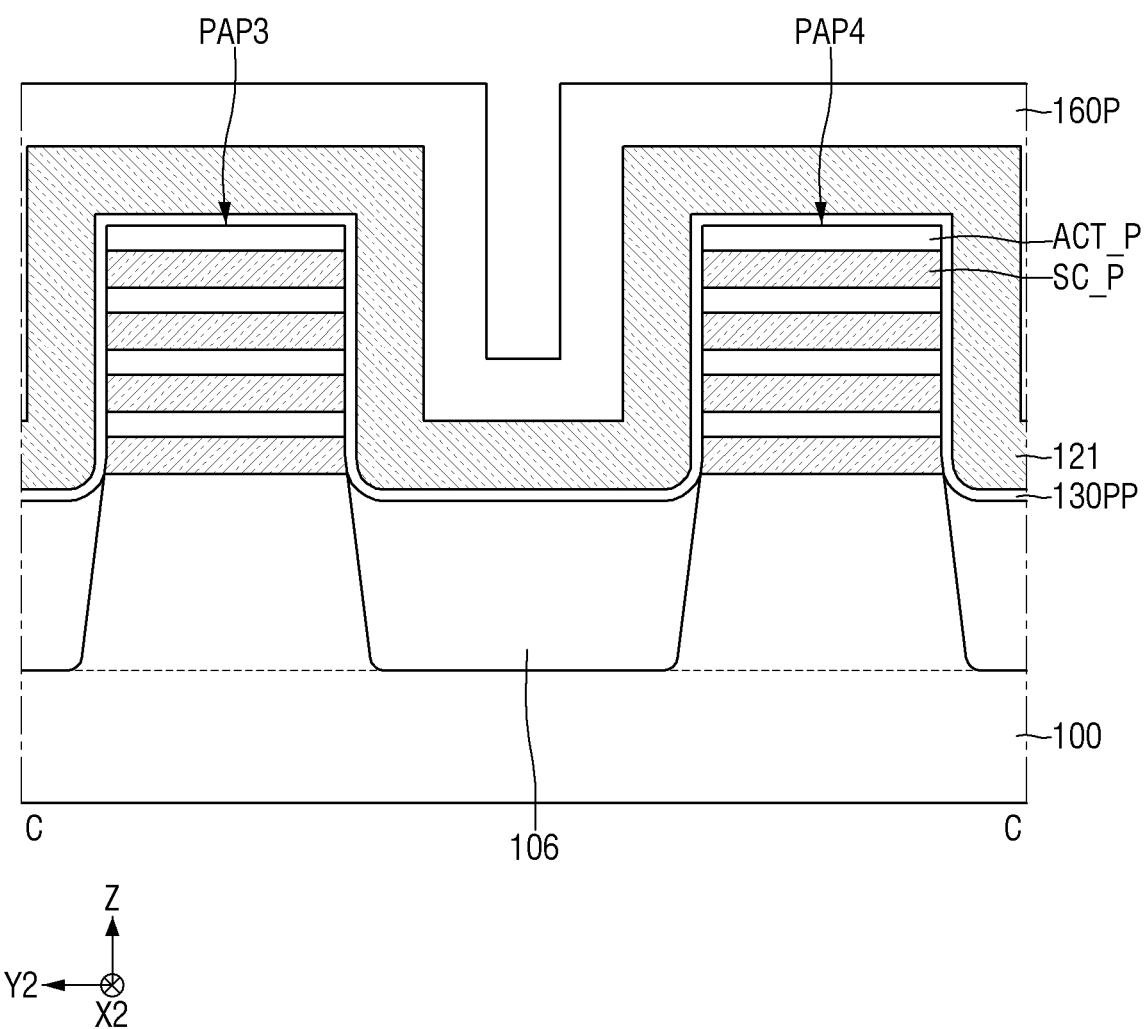

Referring to FIGS. 35 and 36, a lower isolation pattern layer 160P may be formed on the semiconductor liner 121.

The lower isolation pattern layer 160P may fill the lower isolation space 160_SP. The lower isolation pattern layer 160P may also be formed on the upper surfaces of the first to fourth pre-active patterns PAP1, PAP2, PAP3 and PAP4.

Figure 37:
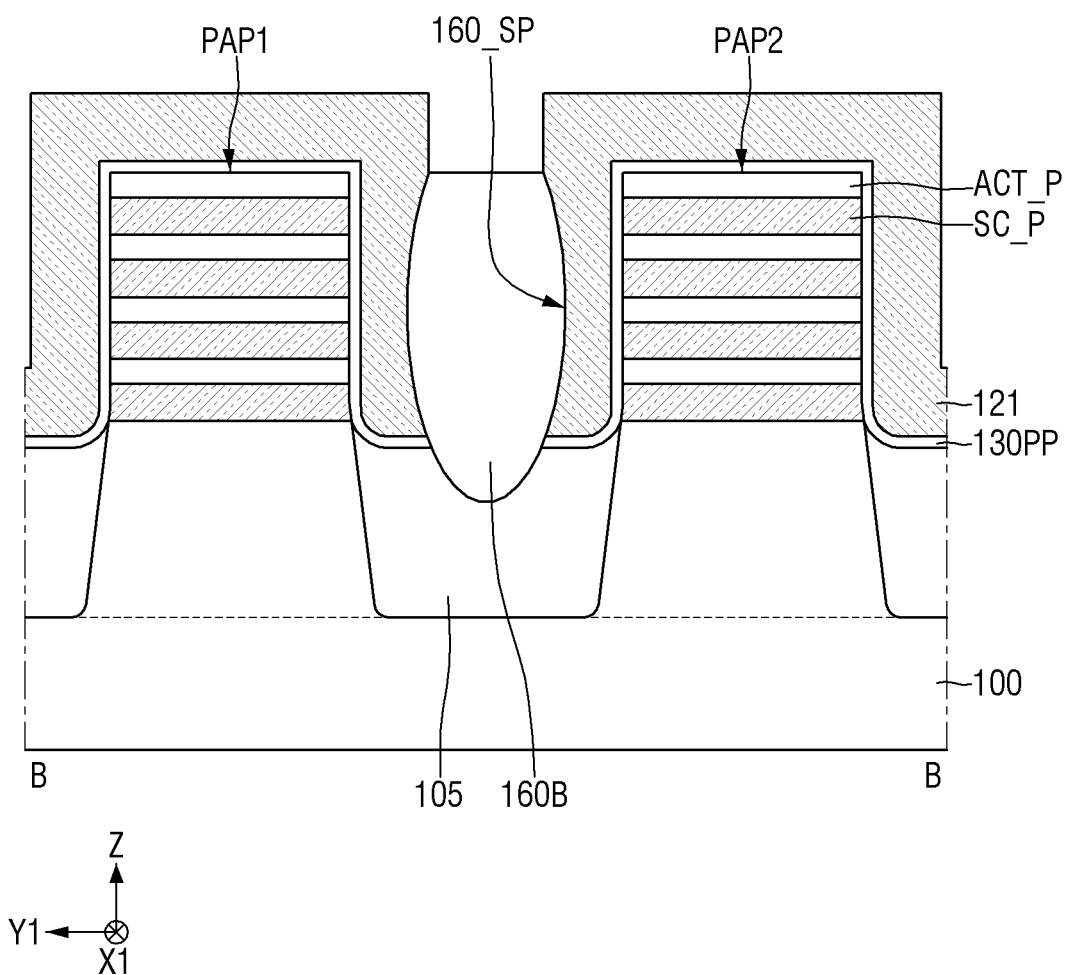

Referring to FIG. 37, a portion of the lower isolation pattern layer 160P may be removed to form a lower isolation pattern 160B for filling the lower isolation space 160_SP.

A portion of the lower isolation pattern layer 160P may be removed, for example, through a wet etching process.

The lower isolation pattern layer 160P disposed in the second region II is removed while the lower isolation pattern 160B is being formed.

Figure 38:
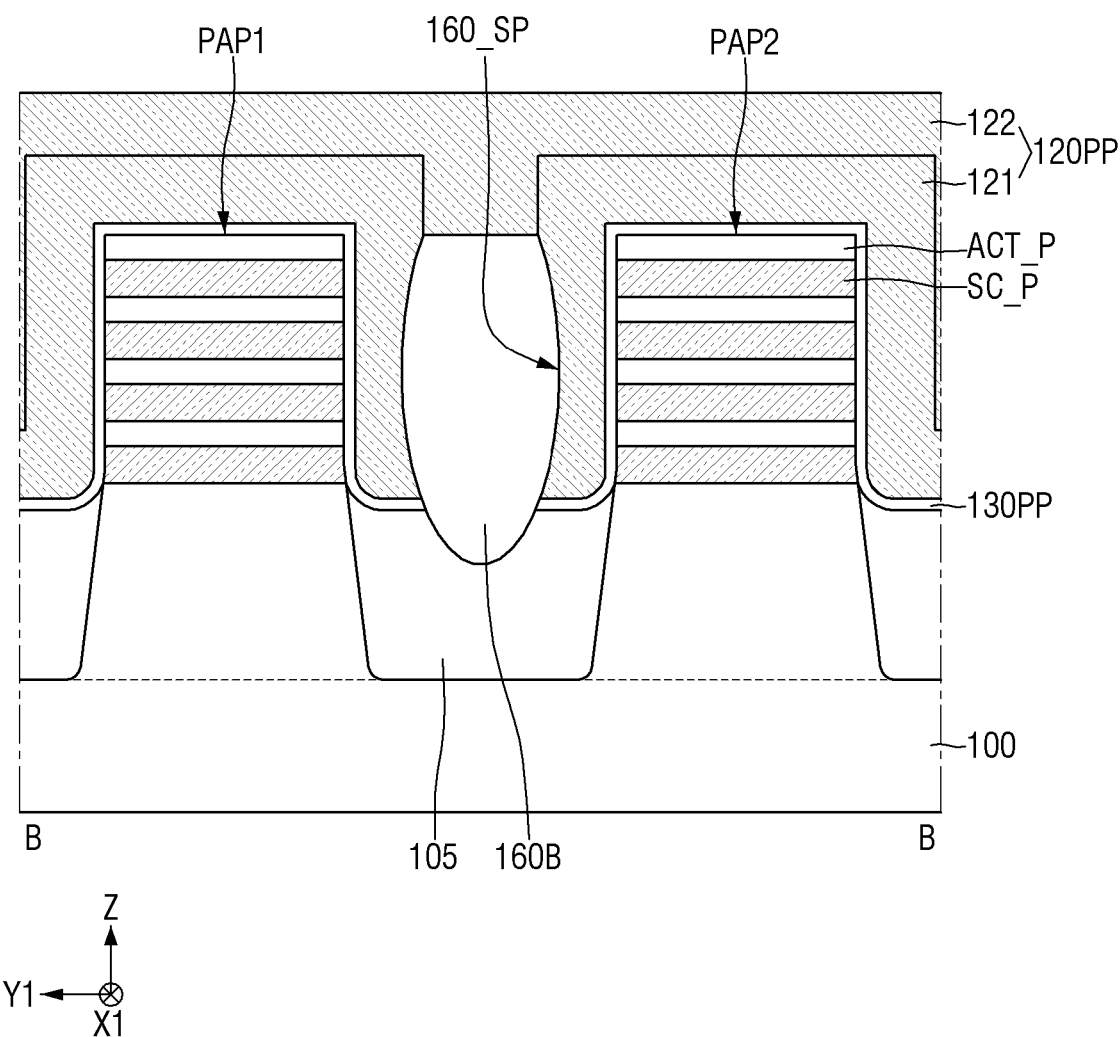
Figure 39:
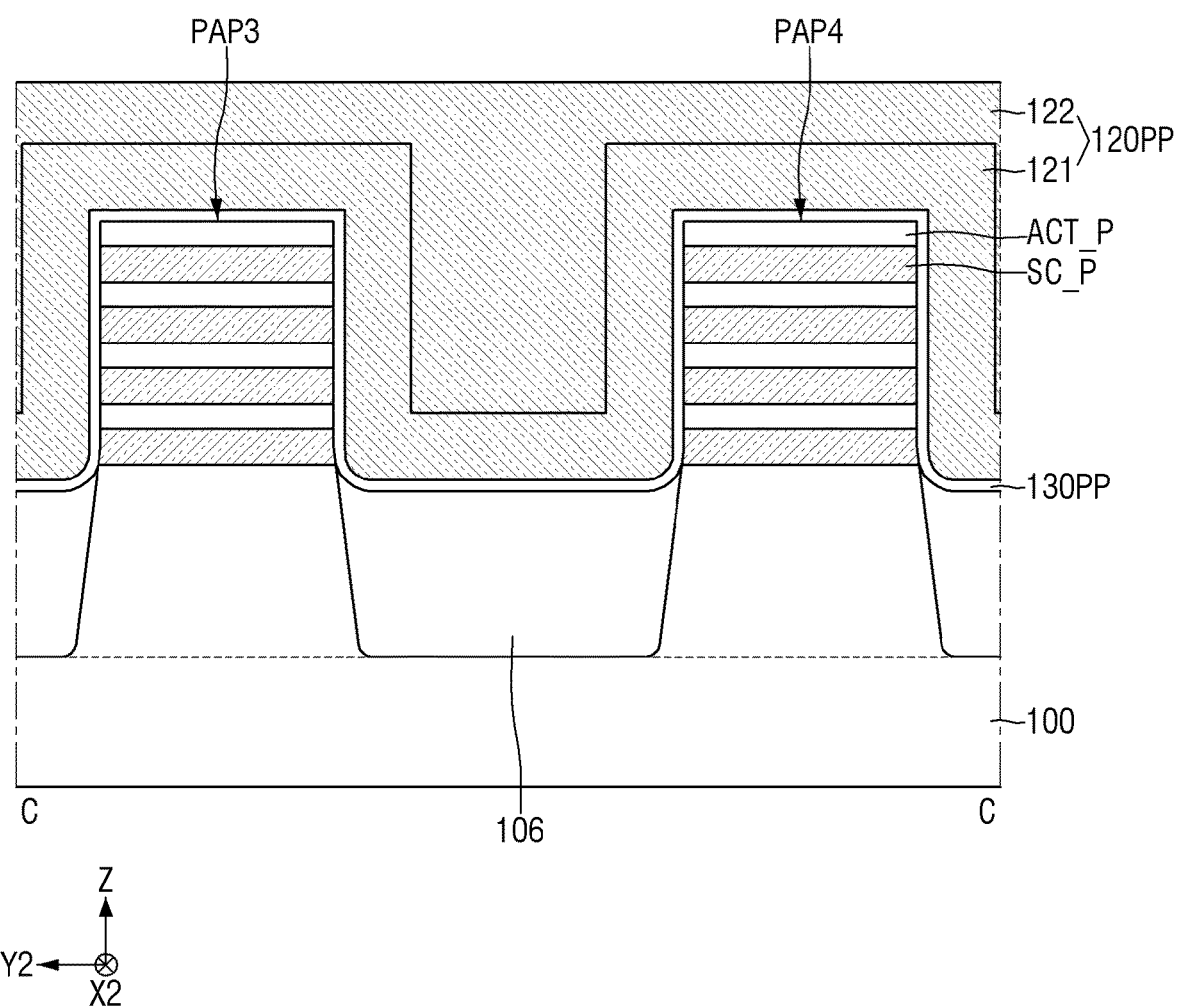

Referring to FIGS. 38 and 39, a mold semiconductor layer 122 may be formed on the semiconductor liner 121 and the lower isolation pattern 160B.

The mold semiconductor layer 122 may include, for example, polycrystalline silicon.

Figure 40:
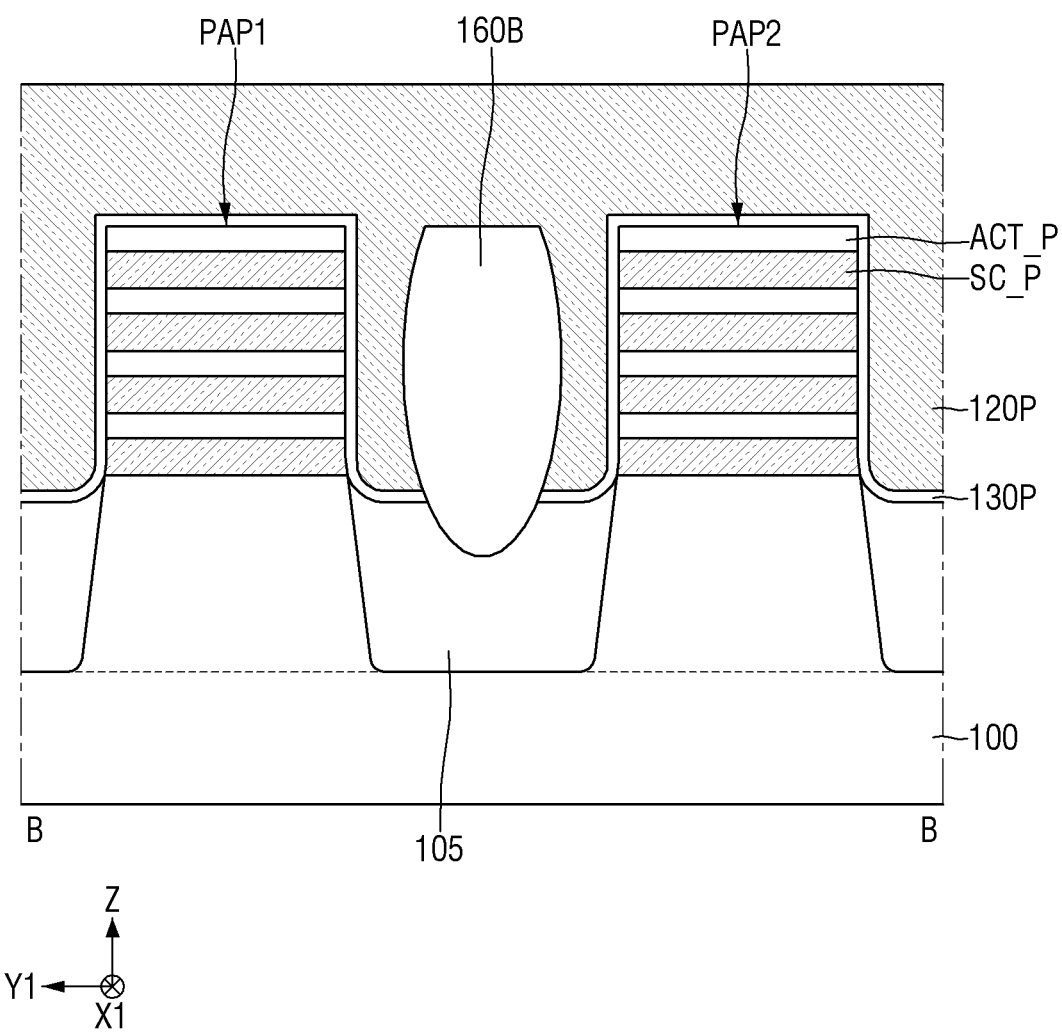
Figure 41:
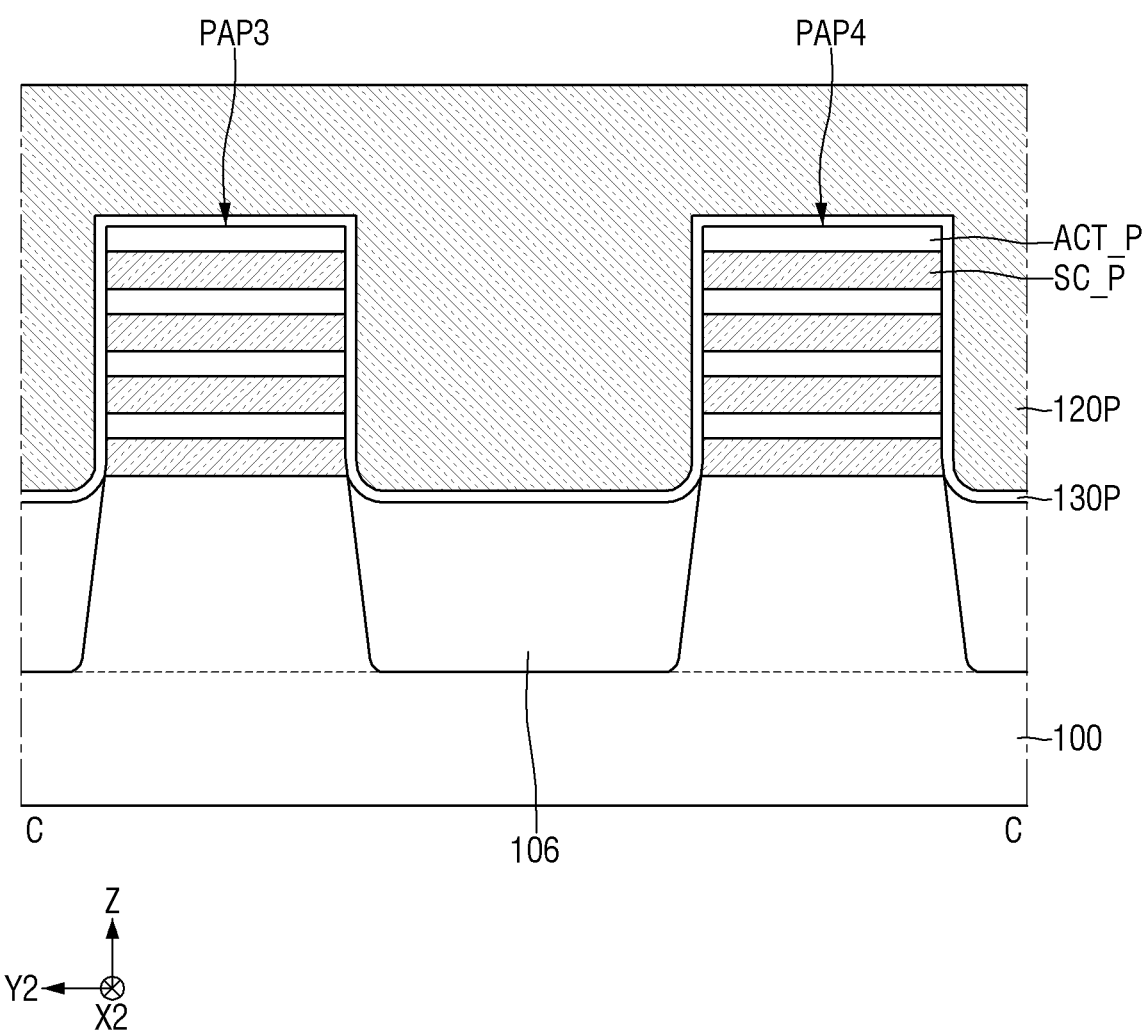

Referring to FIGS. 40 and 41, the semiconductor liner 121 and the mold semiconductor layer 122 may be patterned to form a mold gate electrode 120P crossing the first to fourth pre-active patterns PAP1, PAP2, PAP3 and PAP4. The mold gate electrode 120P is formed on the lower isolation pattern 160B.

The dummy insulating layer 130PP may be patterned to form a dummy gate insulating layer 130P crossing the first to fourth pre-active patterns PAP1, PAP2, PAP3 and PAP4.

Figure 42:
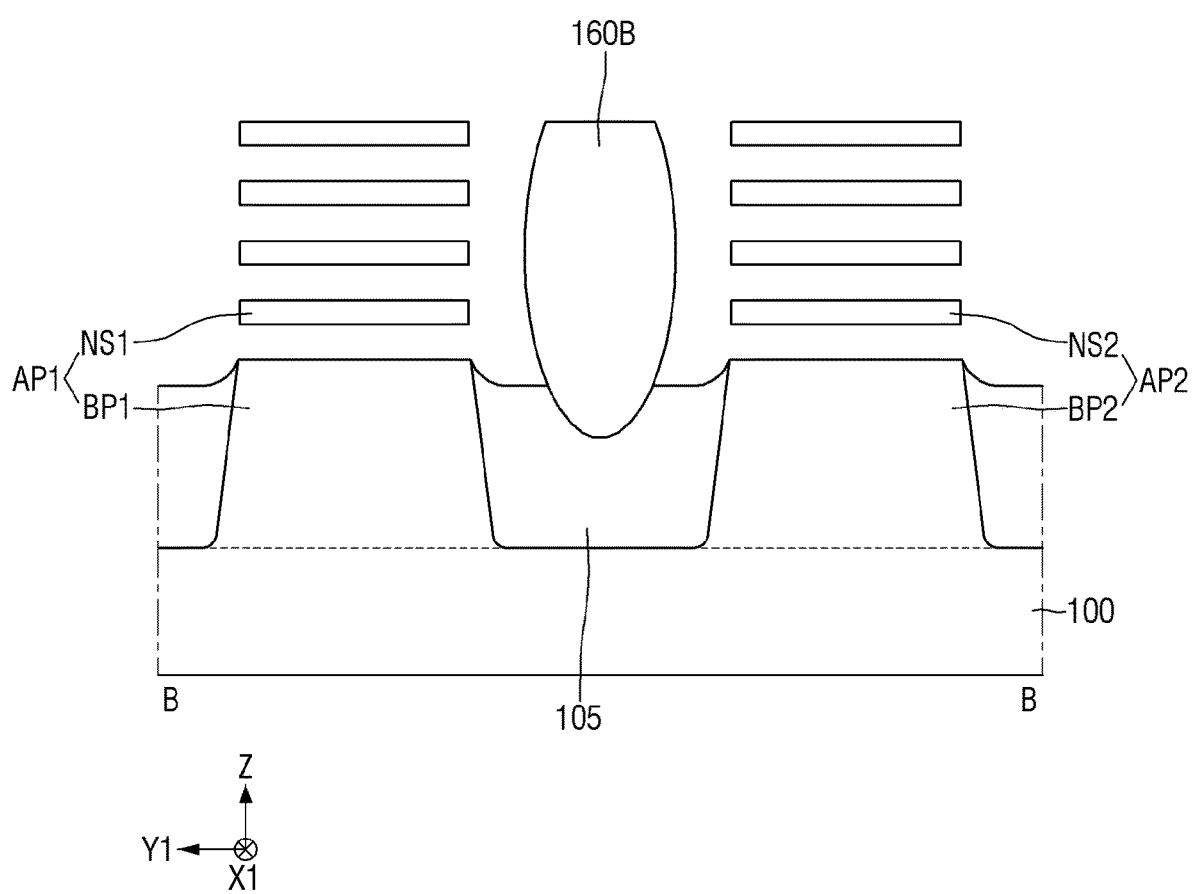
Figure 43:
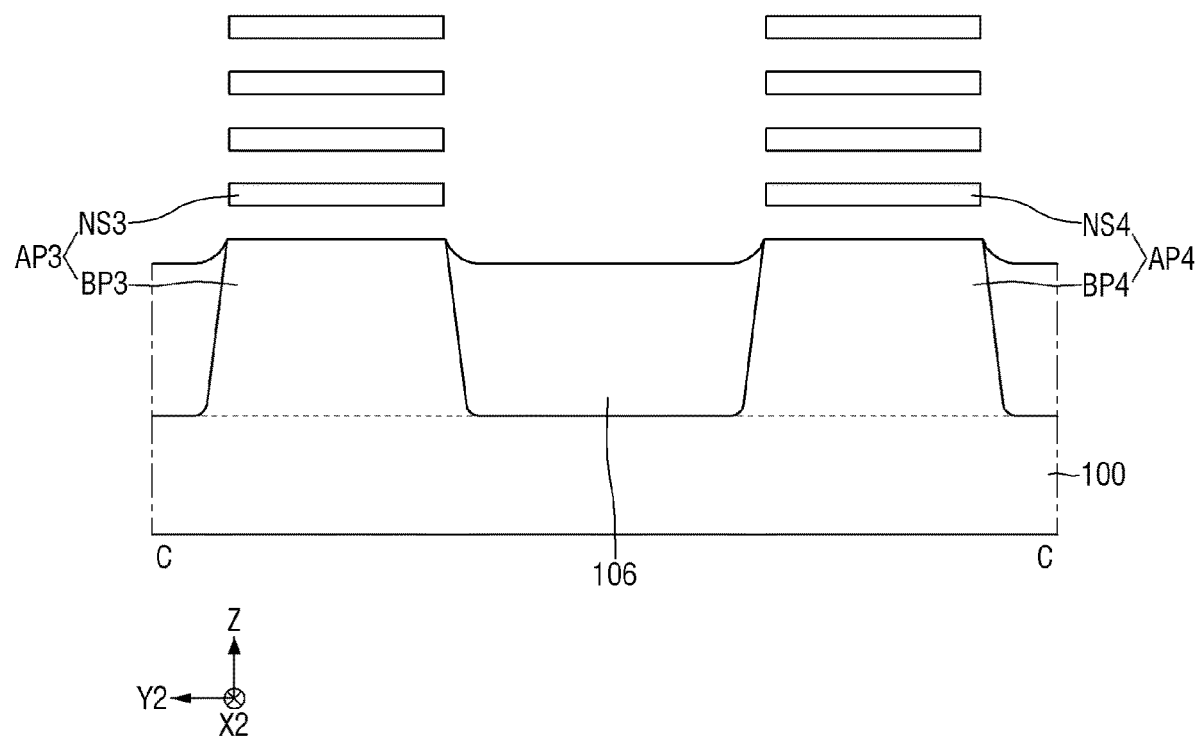

Referring to FIGS. 42 and 43, the mold gate electrode 120P and the dummy gate insulating layer 130P may be removed.

Subsequently, the sacrificial layers SC_P may be removed to form first to fourth sheet patterns NS1, NS2, NS3 and NS4. As a result, first to fourth active patterns AP1, AP2, AP3 and AP4 may be formed.

Figure 44:
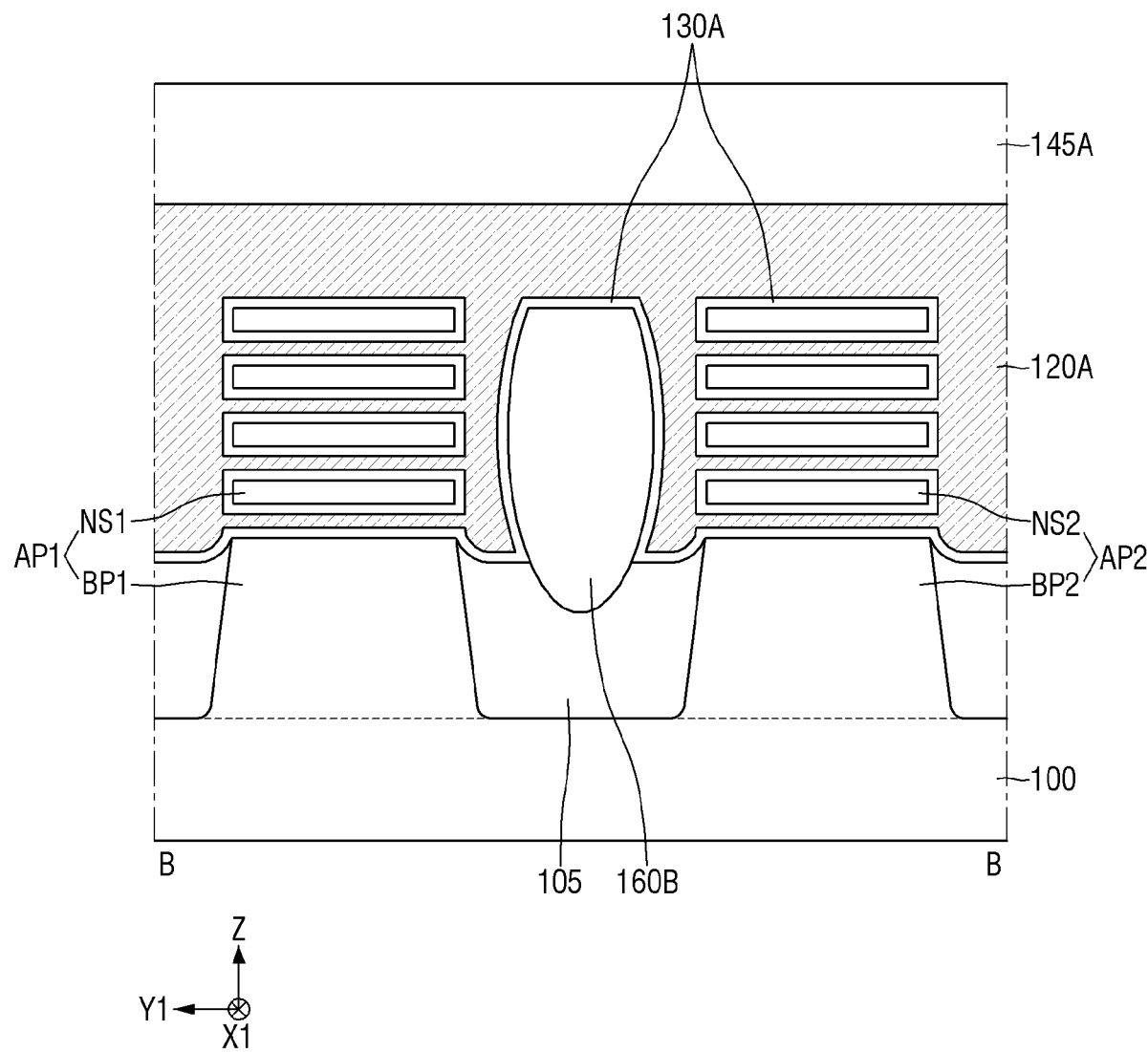
Figure 45:
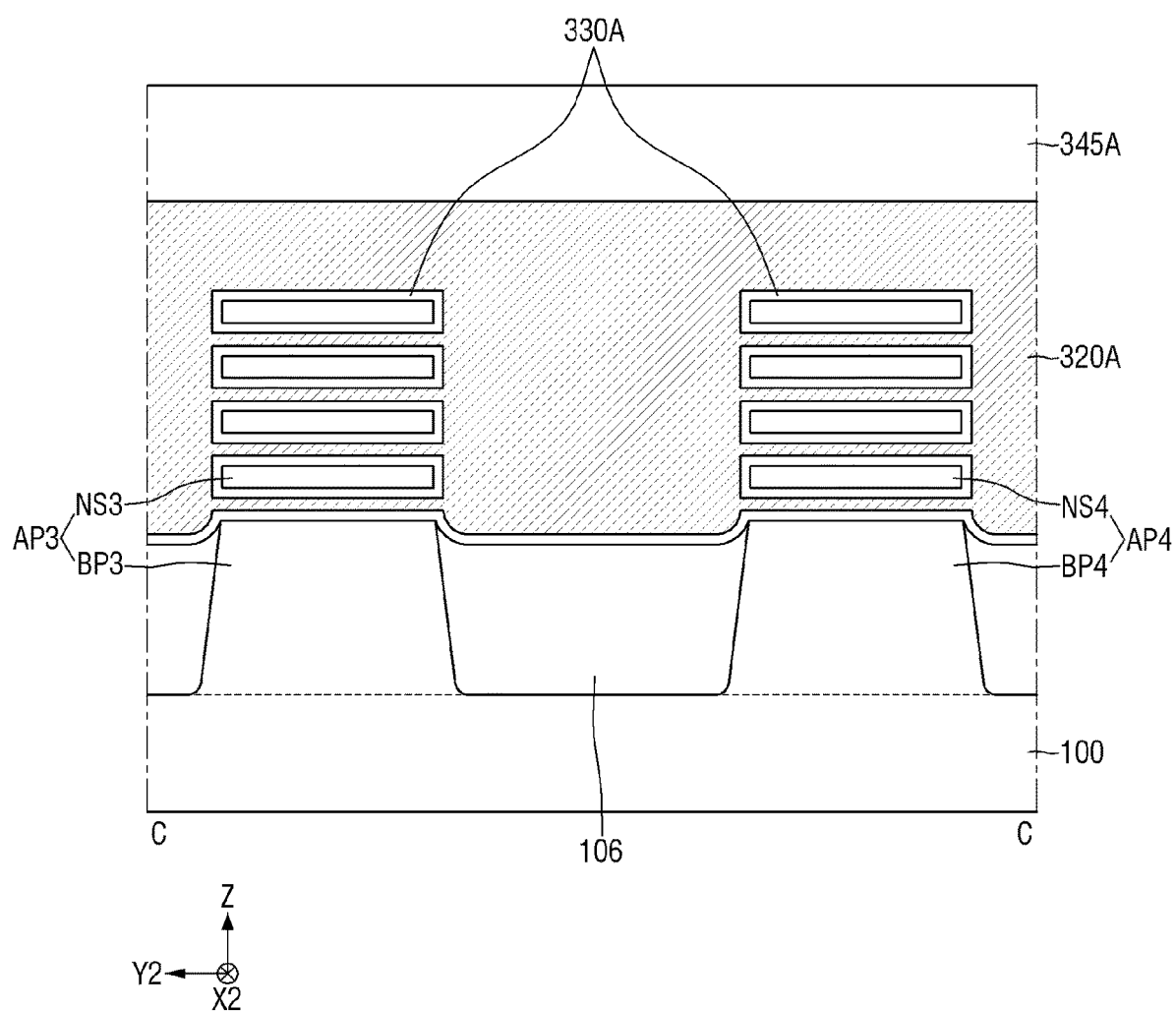

Referring to FIGS. 44 and 45, a first connection gate insulating layer 130A may be formed along circumferences of the first sheet patterns NS1, circumferences of the second sheet patterns NS2, and a sidewall and an upper surface of the lower isolation pattern 160B.

A first connection gate electrode 120A crossing the first active pattern AP1 and the second active pattern AP2 may be formed on the first connection gate insulating layer 130A. A first connection gate capping pattern 145A may be formed on the first connection gate electrode 120A.

A second connection gate insulating layer 330A may be formed along circumferences of the third sheet patterns NS3 and circumferences of the fourth sheet patterns NS4.

A second connection gate electrode 320A crossing the third active pattern AP3 and the fourth active pattern AP4 may be formed on the second connection gate insulating layer 330A. A second connection gate capping pattern 345A may be formed on the second connection gate electrode 320A.

Figure 46:
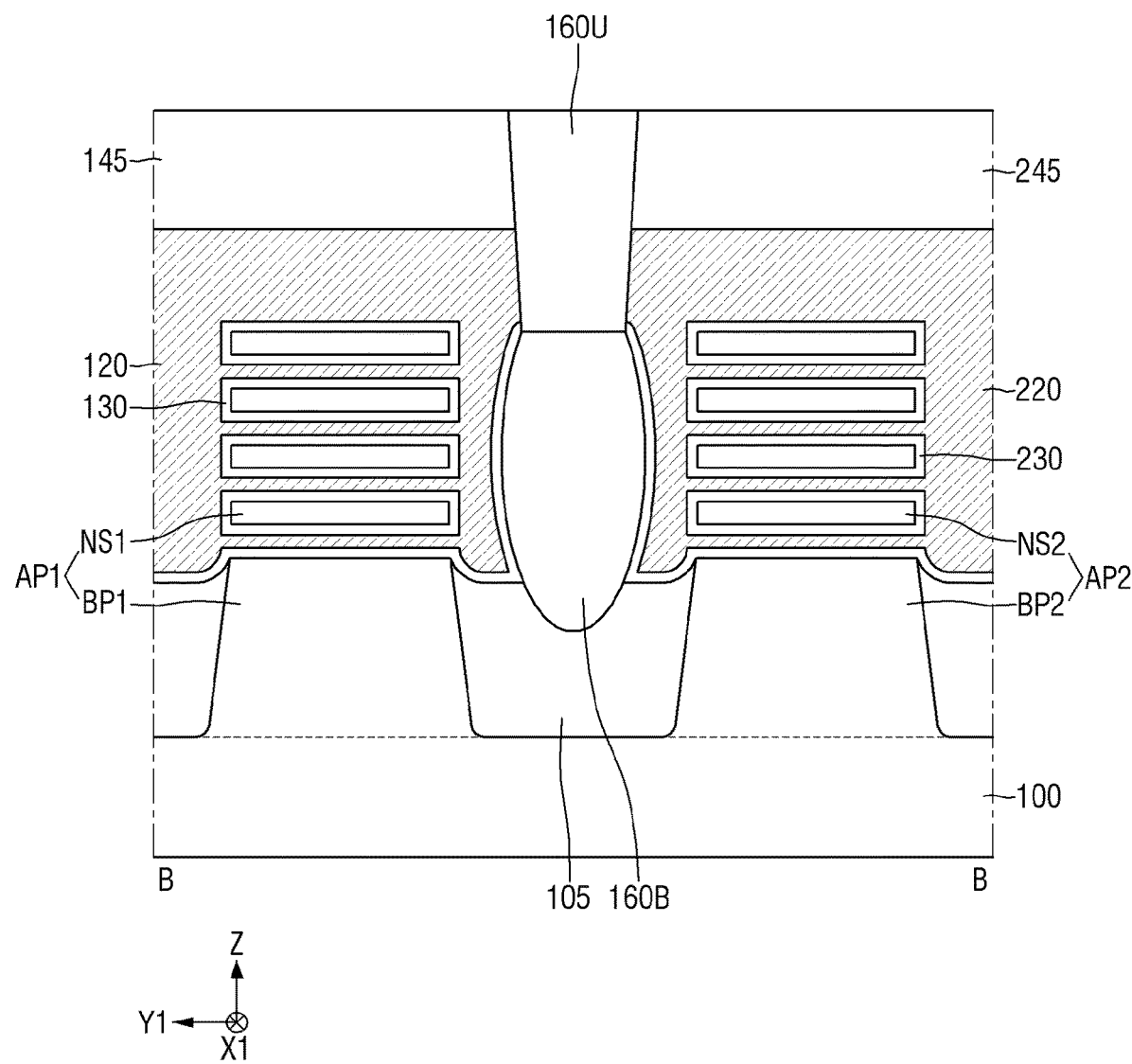
Figure 47:
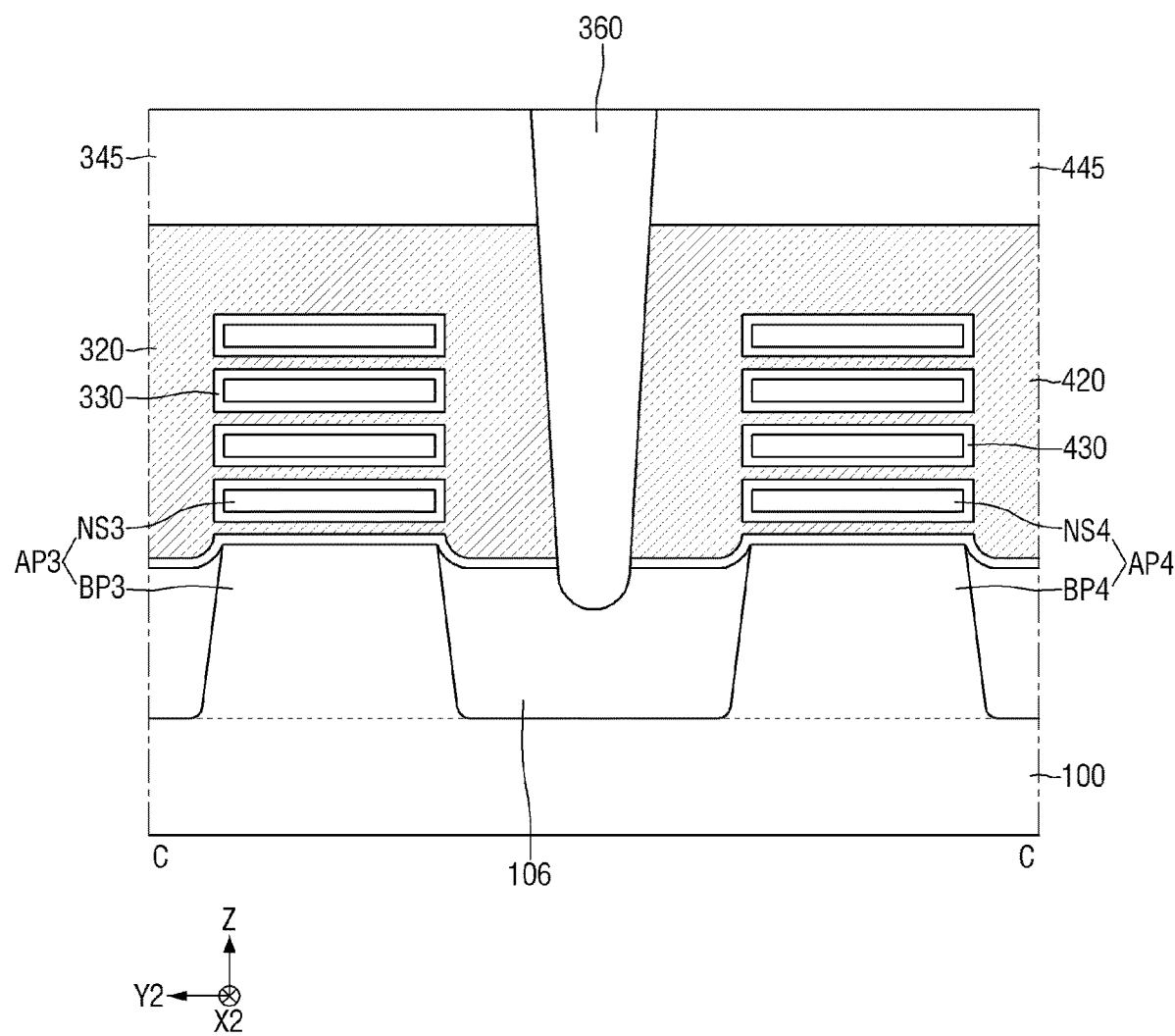

Referring to FIGS. 46 and 47, an upper isolation pattern 160U is formed on the lower isolation pattern 160B. A second gate isolation structure 360 is formed on the second field insulating layer 106.

The upper isolation pattern 160U separates the first connection gate capping pattern 145A, the first connection gate electrode 120A and the first connection gate insulating layer 130A from one another. As a result, a first gate electrode 120, a second gate electrode 220, a first gate insulating layer 130, a second gate insulating layer 230, a first gate capping pattern 145 and a second gate capping pattern 245 are formed.

The second gate isolation structure 360 separates the second connection gate capping pattern 345A, the second connection gate electrode 320A and the second connection gate insulating layer 330A from one another. As a result, a third gate electrode 320, a fourth gate electrode 420, a third gate insulating layer 330, a fourth gate insulating layer 430, a third gate capping pattern 345 and a fourth gate capping pattern 445 are formed.

The upper isolation pattern 160U and the second gate isolation structure 360 are formed at the same time. For example, a first isolation trench for separating the first connection gate capping pattern 145A, the first connection gate electrode 120A and the first connection gate insulating layer 130A from one another may be formed. Also, a second isolation trench for separating the second connection gate capping pattern 345A, the second connection gate electrode 320A and the second connection gate insulating layer 330A from one another may be formed. An insulating material is filled in the first isolation trench and the second isolation trench to form the upper isolation pattern 160U and the second gate isolation structure 360.

Figure 48:
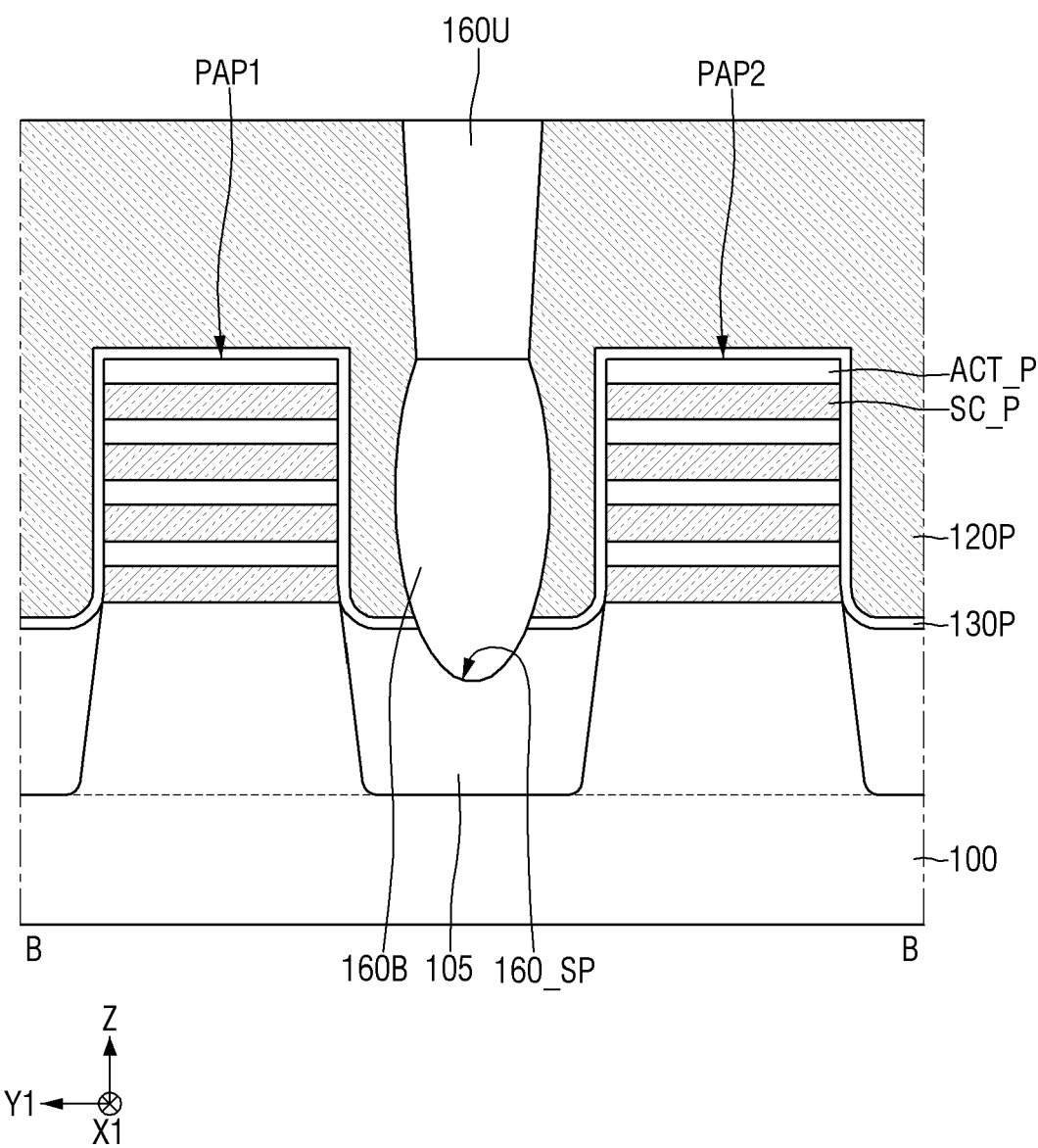
FIGS. 48 and 49 are views illustrating intermediate steps to describe a method of manufacturing a semiconductor device according to embodiments.
Figure 49:
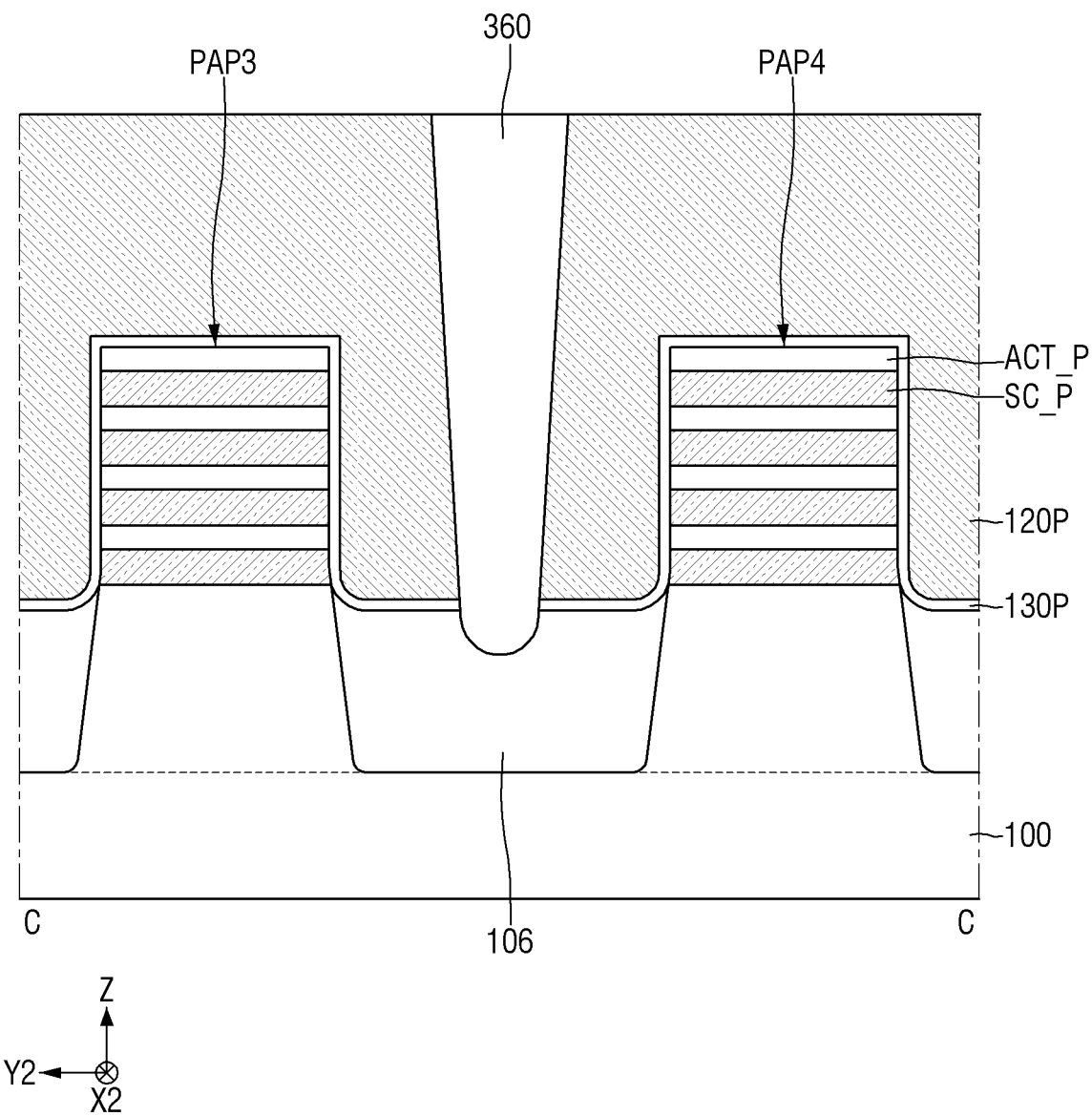

FIGS. 48 and 49 are views illustrating intermediate steps to describe a method of manufacturing a semiconductor device according to embodiments. The semiconductor device described with reference to FIGS. 21 to 23 may be formed by the intermediate steps of FIGS. 48 and 49.

For reference, FIGS. 48 and 49 may be the process performed after FIGS. 40 and 41.

Referring to FIGS. 48 and 49, an upper isolation pattern 160U passing through a mold gate electrode 120P may be formed on the lower isolation pattern 160B.

A second gate isolation structure 360 passing through the mold gate electrode 120P may be formed on the second field insulating layer 106.

Subsequently, the first to fourth gate electrodes 120, 220, 320 and 420, the first to fourth gate insulating layers 130, 230, 330 and 430, and the first to fourth gate capping patterns 145, 245, 345 and 445 may be formed through the process described with reference to FIGS. 42 to 45.

In concluding the detailed description, those skilled in the art will appreciate that many variations and modifications may be made to the above-describe embodiments without substantially departing from the principles of the present inventive concept. Therefore, the disclosed embodiments are used in a generic and descriptive sense only and not for purposes of limitation.

What is claimed is:

1. A semiconductor device comprising:
a first active pattern, which is extended in a first direction, on a substrate;
a second active pattern, which is extended in the first direction and spaced apart from the first active pattern in a second direction, on the substrate;
a field insulating layer between the first active pattern and the second active pattern on the substrate;
a first gate electrode on the first active pattern;
a second gate electrode on the second active pattern;
a gate isolation structure separating the first gate electrode and the second gate electrode from each other on the field insulating layer; and
a gate insulating layer between the first gate electrode and the first active pattern,
wherein the gate isolation structure comprises a lower isolation pattern which is in contact with the field insulating layer, and an upper isolation pattern on the lower isolation pattern,
wherein the lower isolation pattern comprises a first portion, and a second portion below the first portion,
wherein in the first portion of the lower isolation pattern, a width of the lower isolation pattern in the second direction increases in a downward direction from the upper isolation pattern,
wherein in the second portion of the lower isolation pattern, a width of the lower isolation pattern in the second direction decreases in the downward direction from the upper isolation pattern, and
wherein the gate insulating layer extends along a sidewall of the lower isolation pattern to a level of an upper surface of the lower isolation pattern.

2. The semiconductor device of claim 1, wherein the lower isolation pattern further comprises a third portion between the first portion of the lower isolation pattern and the second portion of the lower isolation pattern, and wherein in the third portion of the lower isolation pattern, a width of the lower isolation pattern in the second direction is constant in the downward direction from the upper isolation pattern.

3. The semiconductor device of claim 2, wherein the lower isolation pattern further comprises a fourth portion between the third portion of the lower isolation pattern and the second portion of the lower isolation pattern, and wherein in the fourth portion of the lower isolation pattern, a width of the lower isolation pattern in the second direction increases in the downward direction from the upper isolation pattern.

4. The semiconductor device of claim 1, wherein the lower isolation pattern further comprises a third portion and a fourth portion, which are between the first portion of the lower isolation pattern and the second portion of the lower isolation pattern, wherein the third portion of the lower isolation pattern is between the first portion of the lower isolation pattern and the fourth portion of the lower isolation pattern, wherein in the third portion of the lower isolation pattern, a width of the lower isolation pattern in the second direction decreases in the downward direction from the upper isolation pattern, and wherein in the fourth portion of the lower isolation pattern, a width of the lower isolation pattern in the second direction increases in the downward direction from the upper isolation pattern.

5. The semiconductor device of claim 1, wherein the gate insulating layer extends along a portion of a sidewall of the upper isolation pattern.

6. The semiconductor device of claim 1, wherein the gate insulating layer is not on a sidewall of the upper isolation pattern.

7. The semiconductor device of claim 1, wherein the upper isolation pattern comprises a first portion protruded above a level of an upper surface of the first gate electrode and a level of an upper surface of the second gate electrode, and wherein in the first portion of the upper isolation pattern, a width of the upper isolation pattern in the second direction increases in an upward direction from the lower isolation pattern.

8. The semiconductor device of claim 7, wherein the upper isolation pattern further comprises a second portion below the first portion of the upper isolation pattern, and wherein in the second portion of the upper isolation pattern, a width of the upper isolation pattern in the second direction increases and then decreases in the upward direction from the lower isolation pattern.

9. The semiconductor device of claim 1, wherein each of the first active pattern and the second active pattern comprises a lower pattern protruded from the substrate, and a plurality of sheet patterns spaced apart from the lower pattern.

10. A semiconductor device comprising:
a first active pattern and a second active pattern, which are in a first region of a substrate and spaced apart from each other in a first direction by a first interval;
a third active pattern and a fourth active pattern, which are in a second region of the substrate and spaced apart from each other in a second direction by a second interval different from the first interval;
a first field insulating layer between the first active pattern and the second active pattern on the substrate;
a second field insulating layer between the third active pattern and the fourth active pattern on the substrate;
a first gate electrode on the first active pattern;
a second gate electrode on the second active pattern;
a third gate electrode on the third active pattern;
a fourth gate electrode on the fourth active pattern;
a first gate isolation structure separating the first gate electrode and the second gate electrode from each other on the first field insulating layer; and
a second gate isolation structure separating the third gate electrode and the fourth gate electrode on the second field insulating layer,
wherein the first gate isolation structure comprises a lower isolation pattern, which is in contact with the first field insulating layer, and an upper isolation pattern on the lower isolation pattern, and
wherein the second gate isolation structure is formed of a single structure extended from above an upper surface of the third gate electrode to below an upper surface of the second field insulating layer.

11. The semiconductor device of claim 10, wherein the second interval is greater than the first interval.

12. The semiconductor device of claim 10, wherein the upper isolation pattern of the first gate isolation structure comprises the same material as that of the second gate isolation structure.

13. The semiconductor device of claim 10, wherein the lower isolation pattern of the first gate isolation structure comprises an upper region above a level of an upper surface of the first field insulating layer and a lower region below the level of the upper surface of the first field insulating layer, and wherein in at least a portion of the upper region of the lower isolation pattern, a width of the lower isolation pattern in the first direction increases in a downward direction from the upper isolation pattern.

14. The semiconductor device of claim 13, wherein the first active pattern and the second active pattern are adjacent to each other with the first gate isolation structure therebetween, and the third active pattern and the fourth active pattern are adjacent to each other with the second gate isolation structure therebetween.

15. The semiconductor device of claim 13, wherein, in the upper region of the lower isolation pattern, a width of the lower isolation pattern in the first direction increases and then remains constant in the downward direction from the upper isolation pattern.

16. A semiconductor device comprising:
a first active pattern, which comprises a first lower pattern extended in a first direction and a plurality of first sheet patterns spaced apart from the first lower pattern, on a substrate;
a second active pattern, which comprises a second lower pattern extended in the first direction and a plurality of second sheet patterns spaced apart from the second lower pattern, on the substrate, the second lower pattern being spaced apart from the first lower pattern in a second direction different from the first direction;
a field insulating layer between the first lower pattern and the second lower pattern on the substrate;
a first gate electrode on the first active pattern;
a second gate electrode on the second active pattern; and
a gate isolation structure separating the first gate electrode and the second gate electrode from each other on the field insulating layer,
wherein the gate isolation structure comprises a lower isolation pattern that is in contact with the field insulating layer, and an upper isolation pattern on the lower isolation pattern, wherein the lower isolation pattern comprises a material different from that of the upper isolation pattern,
wherein the lower isolation pattern comprises a first portion above a level of an upper surface of the field insulating layer,
wherein in the first portion of the lower isolation pattern, a width of the lower isolation pattern in the second direction increases in a downward direction from the upper isolation pattern,
wherein the upper isolation pattern comprises a first portion protruded above a level of an upper surface of the first gate electrode and a level of an upper surface of the second gate electrode, and
wherein in the first portion of the upper isolation pattern, a width of the upper isolation pattern in the second direction increases in an upward direction from the lower isolation pattern.

17. The semiconductor device of claim 16, wherein the upper isolation pattern further comprises a second portion below the first portion of the upper isolation pattern, and
wherein in the second portion of the upper isolation pattern, a width of the upper isolation pattern in the second direction increases and then decreases in the upward direction from the lower isolation pattern.

18. The semiconductor device of claim 16, further comprising a gate insulating layer between the first gate electrode and the first active pattern,
wherein the gate insulating layer extends along a sidewall of the lower isolation pattern and a portion of a sidewall of the upper isolation pattern.

19. The semiconductor device of claim 16, further comprising a gate insulating layer between the first gate electrode and the first active pattern,
wherein the gate insulating layer extends along a sidewall of the lower isolation pattern, and is not on a sidewall of the upper isolation pattern.

20. The semiconductor device of claim 16, wherein the lower isolation pattern comprises a lower region below a level an upper surface of the field insulating layer, and
wherein in the lower region of the lower isolation pattern, a width of the lower isolation pattern in the second direction increases and then decreases as it moves away from the upper isolation pattern.

* * * * *